US012740400B2

(12) United States Patent
Lee et al.

(10) Patent No.: US 12,740,400 B2
(45) Date of Patent: Sep. 15, 2026

(54) SEMICONDUCTOR DEVICE

(71) Applicant: Samsung Electronics Co., Ltd., Suwon-si (KR)

(72) Inventors: Kyunghwan Lee, Suwon-si (KR); Daewon Ha, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 548 days.

(21) Appl. No.: 18/457,907

(22) Filed: Aug. 29, 2023

(65) Prior Publication Data

US 2024/0266287 A1 Aug. 8, 2024

(30) Foreign Application Priority Data

Feb. 6, 2023 (KR) ........................ 10-2023-0015787

(51) Int. Cl.

| | |
|---|---|
| ***H10B 51/20*** | (2023.01) |
| ***H10B 51/10*** | (2023.01) |
| ***H10D 30/69*** | (2025.01) |
| ***H10D 64/01*** | (2025.01) |

(Continued)

(52) U.S. Cl.
CPC .......... *H10W 20/435* (2026.01); *H10B 51/10* (2023.02); *H10B 51/20* (2023.02); *H10D 30/701* (2025.01); *H10D 64/033* (2025.01); *H10D 64/689* (2025.01)

(58) Field of Classification Search
CPC ..... H10W 20/435; H10B 51/20; H10B 51/10; H10D 64/033; H10D 30/701; H10D 64/689
See application file for complete search history.

(56) References Cited

U.S. PATENT DOCUMENTS

| | | | | |
|---|---|---|---|---|
| 10,833,103 | B2 | 11/2020 | Sakuma et al. | |
| 2019/0006011 | A1* | 1/2019 | Oh ........................ | H10B 43/35 |
| 2021/0210551 | A1 | 7/2021 | Han | |

(Continued)

FOREIGN PATENT DOCUMENTS

| | | |
|---|---|---|
| KR | 2023/0010132 A | 1/2023 |

OTHER PUBLICATIONS

K. Ni et al., 'SoC Logic Compatible Multi-Bit FeMFET Weight Cell for Neuromorphic Applications' IEEE, 2018, IEDM18-296-IEDM18-299.

*Primary Examiner* — Suberr L Chi
(74) *Attorney, Agent, or Firm* — Harness, Dickey & Pierce, P.L.C.

(57) ABSTRACT

A semiconductor device may include first conductive lines spaced apart from each other in a first direction on a substrate, second conductive lines spaced apart from the first conductive lines in a second direction, a gate electrode between the first and second conductive lines and extending in the first direction, a first selection gate electrode between the first conductive lines and the gate electrode and extending in the first direction, a plurality of channel patterns surrounding a side surface of the gate electrode and spaced apart from each other in the first direction, a plurality of first selection channel patterns surrounding a side surface of the first selection gate electrode and a ferroelectric pattern between the gate electrode and each of the channel patterns. The first selection channel patterns may be spaced apart from each other in the first direction and connected to the channel patterns, respectively.

20 Claims, 51 Drawing Sheets

(51) Int. Cl.
*H10D 64/68* (2025.01)
*H10W 20/41* (2026.01)

(56) References Cited

U.S. PATENT DOCUMENTS

2023/0011675 A1 1/2023 Lee et al.
2023/0337438 A1 * 10/2023 Park ...................... H10B 51/30

* cited by examiner

CH
GI
OP1
MP
CL1
FP
GE
SGE
200
SGE
FP
GE
SGI SCH
CL2 OP2
OP2 CL2
SCH
SGI SCH
GI
OP1
MP
CL1
CH
D1
D3
D2

170
106
OP1
CL1
CH
GI
FP
GE
130
104
102
100
A'
A
MP
SS
SGE
SGI
SCH
OP2
CL2
200
D1
D2
D3

108
106
R1
110
108
106
104
102
100
A'
A
GIL CHL
H1
H2
MS
CHL GIL
R1
110
D1
D2
D3

T1
A'
OP1
R2
CL1
120
MS
106
GIL CHL
OP2
CL2
A
D2
D3
D1

106
OP1
CL1
R2
106
T1
106
104
102
100
A'
CHL
GIL
120
CHL
GIL
120
OP2
CL2
T1
R2
R2
MS
MS
CL2
OP2
120
GIL
CHL
120
GIL
CHL
OP1
CL1
R2
T1
A
D1
D2
D3

106
OP1
CL1
CHL
GIL
FP
106
130
106
104
102
100
A'
MP
H1
FP
CHL
GIL
120
OP2
CL2
200
MS
A
130
D1
D2
D3

130
A'
OP1
SS
CL1
FP
MP
CH
GI
GE
SFP
SGE
CL2
106
GE_S
SGE_S
SGI
SCH
SMP
OP2
200
A
D1
D2
D3

FIG. 29B

130
A'
A
OP1
CL1
FP
MP
CH
GI
MS
SFP
H2
CL2
200
106
H1
SMP
SGI
SCH
OP2
D1
D2
D3

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2023-0015787, filed on Feb. 6, 2023, in the Korean Intellectual Property Office, the entire contents of which are hereby incorporated by reference.

BACKGROUND

The present disclosure relates to a semiconductor device and/or a method of manufacturing the same, and more particularly, to a semiconductor memory device including a ferroelectric field effect transistor and/or a method of manufacturing the same.

Semiconductor memory devices may be classified into volatile memory devices and non-volatile memory devices. The volatile memory devices may lose their stored data when their power supplies are interrupted, and for example, the volatile memory devices may include dynamic random access memory (DRAM) devices and static random access memory (SRAM) devices. On the contrary, the non-volatile memory devices may retain their stored data even when their power supplies are interrupted, and for example, the non-volatile memory devices may include programmable ROM (PROM), erasable PROM (EPROM), electrically EPROM (EEPROM), and a flash memory device. In addition, next-generation non-volatile semiconductor memory devices (e.g., magnetic random access memory (MRAM) devices, phase-change random access memory (PRAM) devices, and ferroelectric random access memory (FeRAM) devices) have been developed to provide high-performance and low power consumption semiconductor memory devices, and various studies are being conducted for high integration and high performance of these next-generation semiconductor memory devices.

SUMMARY

An aspect of the present disclosure is to provide a semiconductor device capable of high integration and a method of manufacturing the same.

An aspect of the present disclosure is to provide a semiconductor device with improved operating characteristics and reliability and a method of manufacturing the same.

According to an embodiment, a semiconductor device may include first conductive lines on a substrate and spaced apart from each other in a first direction, the first direction being perpendicular to an upper surface of the substrate; second conductive lines spaced apart from the first conductive lines in a second direction, the second direction being parallel to the upper surface of the substrate; a gate electrode between the first conductive lines and the second conductive lines, the gate electrode extending in the first direction; a first selection gate electrode between the first conductive lines and the gate electrode, the first selection gate electrode extending in the first direction; a plurality of channel patterns surrounding a side surface of the gate electrode, the plurality of channel patterns being spaced apart from each other in the first direction; a plurality of first selection channel patterns surrounding a side surface of the first selection gate electrode, and spaced apart from each other in the first direction, the plurality of first selection channel patterns connected to the plurality of channel patterns, respectively; and a ferroelectric pattern between the gate electrode and each of the plurality of channel patterns. The first conductive lines may be electrically connected to the plurality of first selection channel patterns, respectively, and each of the plurality of channel patterns may be electrically connected to a corresponding second conductive line among the second conductive lines.

According to an embodiment, a semiconductor device may include first conductive lines on a substrate and spaced apart from each other in a first direction, the first direction being perpendicular to an upper surface of the substrate; a gate electrode spaced apart from the first conductive lines in a second direction, the second direction being parallel to the upper surface of the substrate, and the gate electrode extending in the first direction; a first selection gate electrode between the first conductive lines and the gate electrode, the first selection gate electrode extending in the first direction; a plurality of channel patterns surrounding a side surface of the gate electrode, the plurality of channel patterns being spaced apart from each other in the first direction; a plurality of first selection channel patterns surrounding a side surface of the first selection gate electrode, the plurality of first selection channel patterns being spaced apart from each other in the first direction, and the plurality of first selection channel patterns respectively connected to the plurality of channel patterns; and a ferroelectric pattern between the gate electrode and each of the plurality of channel patterns. The first conductive lines may be electrically connected to the plurality of first selection channel patterns, respectively.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 3A to 9A are plan views illustrating a method of manufacturing a semiconductor device according to some embodiments of the present disclosure, and FIGS. 3B to 9B are cross-sectional views taken along line A-A' of FIGS. 3A to 9A, respectively.

FIGS. 24A to 26A are plan views illustrating a method of manufacturing a semiconductor device according to some embodiments of the present disclosure, and FIGS. 24B to 26B are cross-sectional views taken along line A-A' of FIGS. 24A to 26A, respectively.

FIG. 29B is a cross-sectional view taken along line A-A' of FIG. 29A.

DETAILED DESCRIPTION

Hereinafter, the present disclosure will be described in detail by describing example embodiments of inventive concepts with reference to the accompanying drawings.

Figure 1:
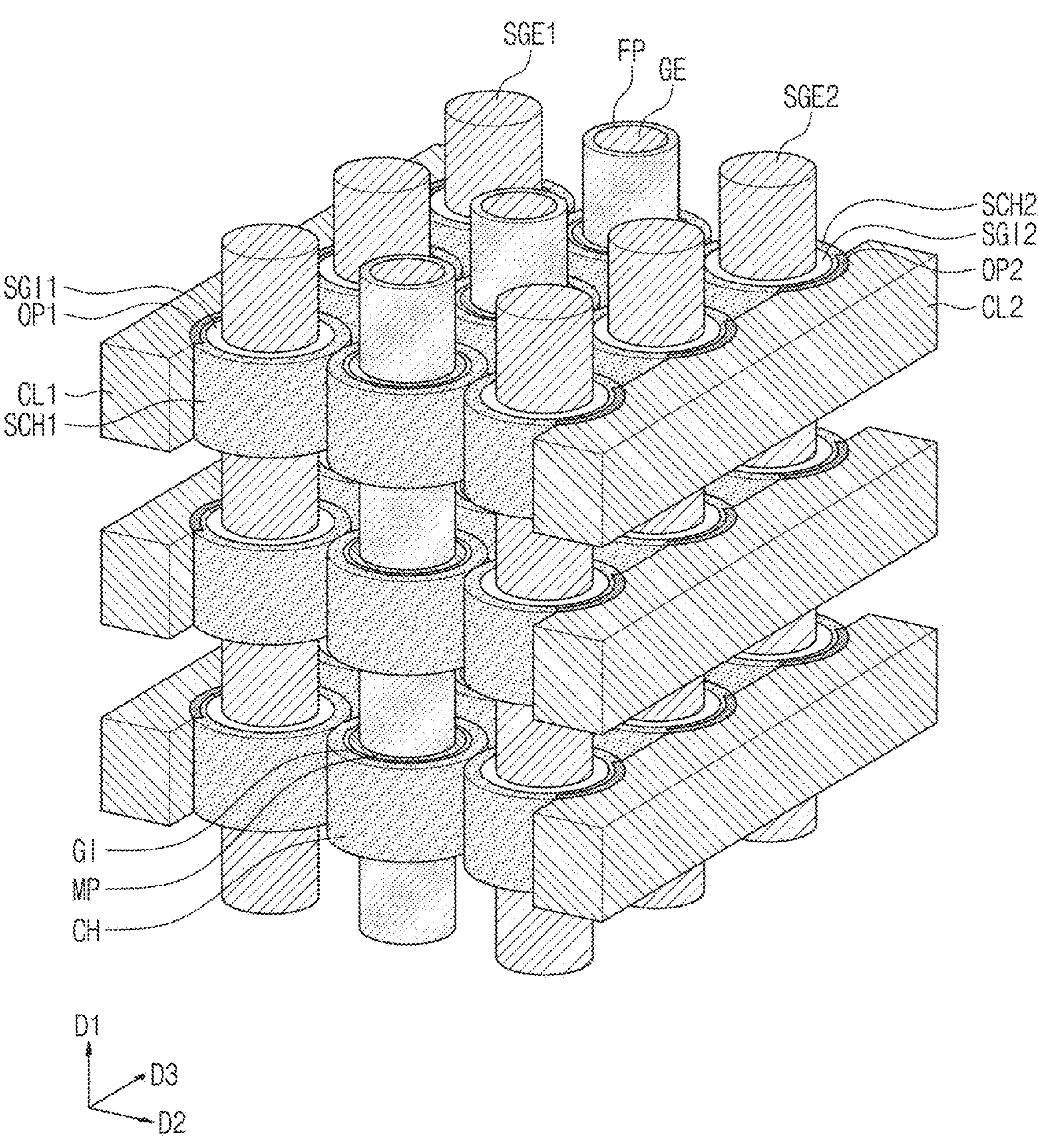
FIG. 1 is a schematic perspective view of a semiconductor device according to some embodiments of the present disclosure.
Figure 2A:
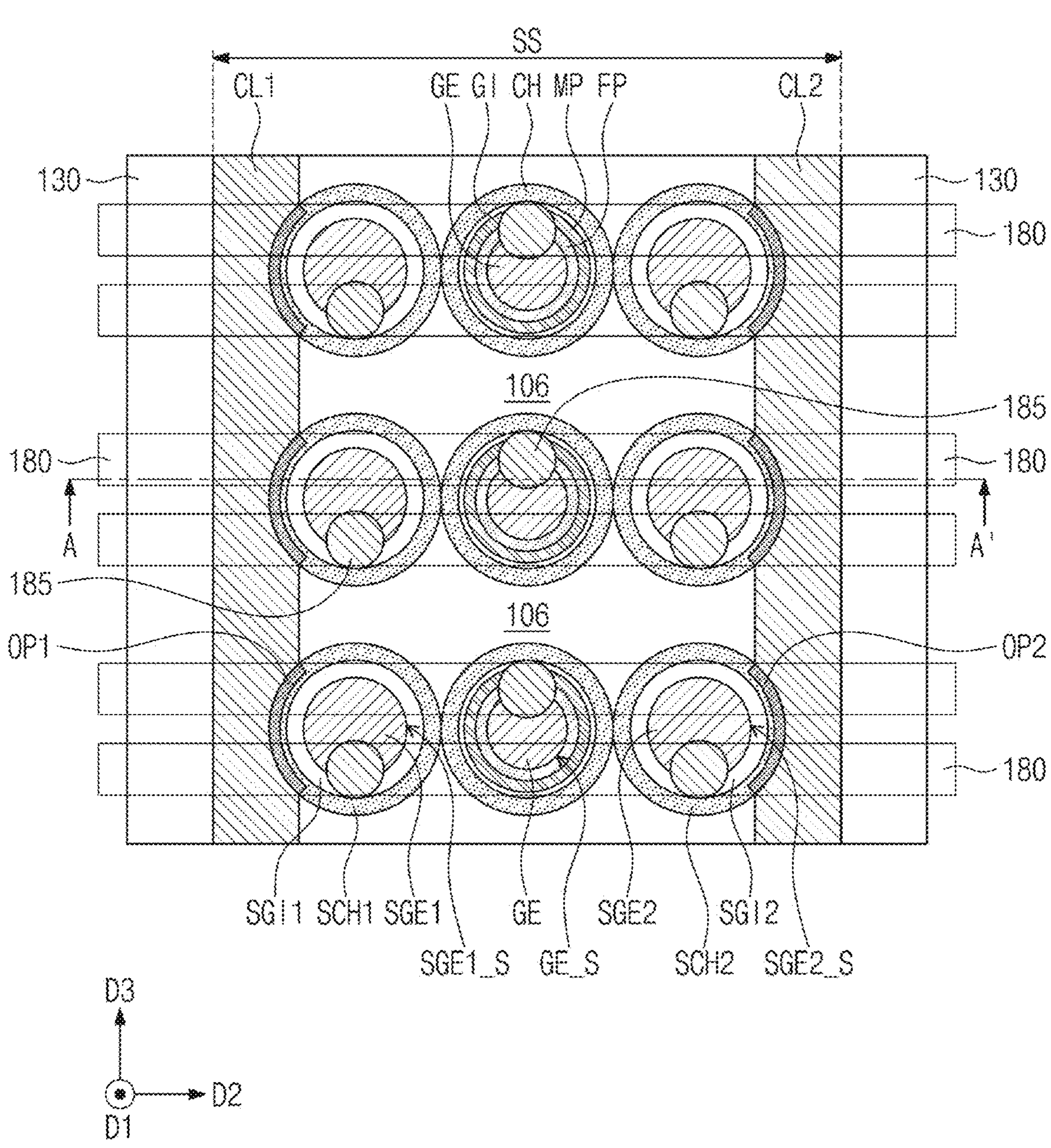
FIG. 2A is a plan view of a semiconductor device according to some embodiments of the present disclosure.

FIG. 1 is a schematic perspective view of a semiconductor device according to some embodiments of the present disclosure. FIG. 2A is a plan view of a semiconductor device according to some embodiments of the present disclosure, and FIG. 2B is a cross-sectional view taken along line A-A' of FIG. 2A.

Figure 2B:
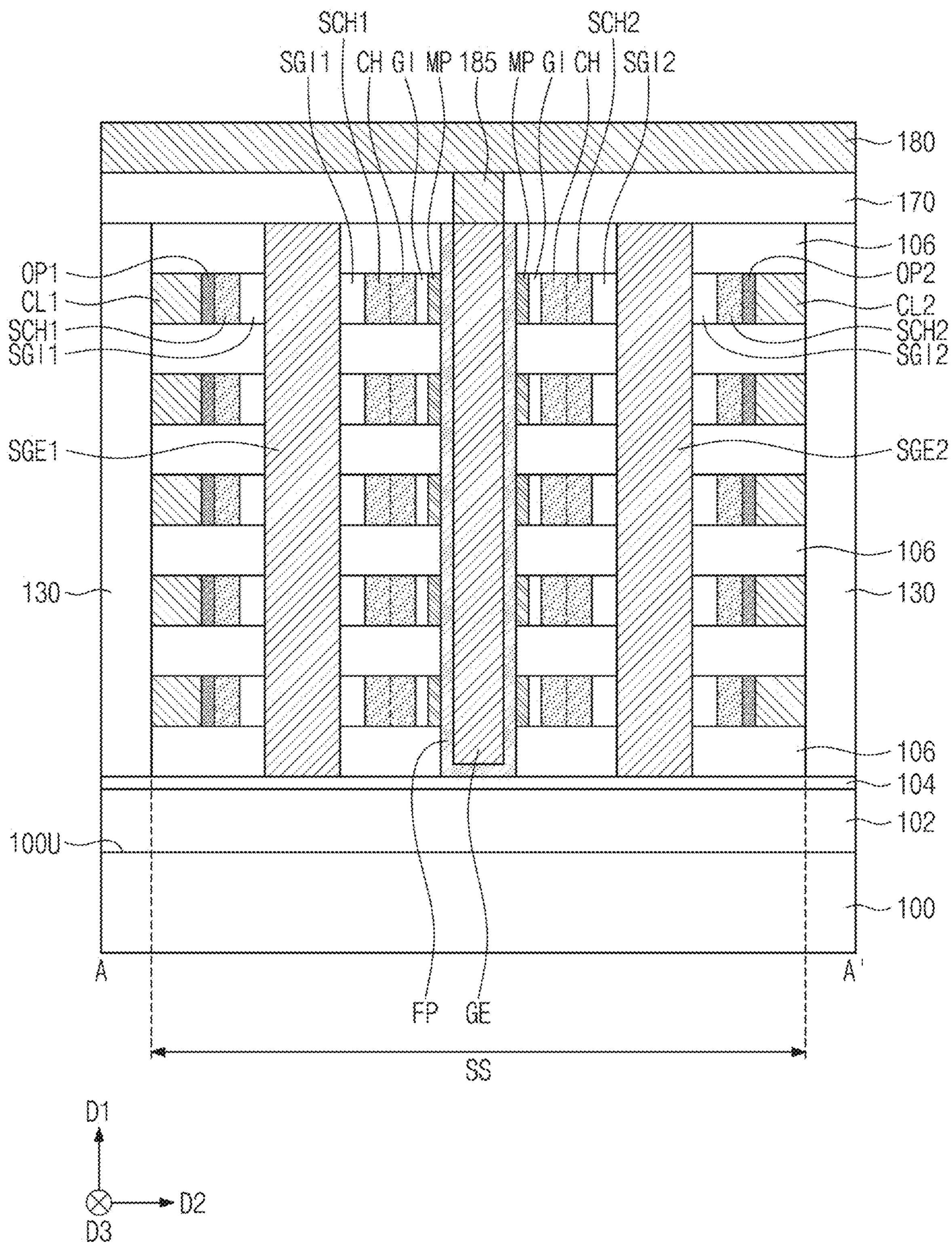
FIG. 2B is a cross-sectional view taken along line A-A' of FIG. 2A.

Referring to FIGS. 1, 2A and 2B, an interlayer insulating layer 102 and an etch stop layer 104 may be sequentially disposed on a substrate 100. The interlayer insulating layer 102 may be disposed between the substrate 100 and the etch stop layer 104. The substrate 100 may include a semiconductor substrate (e.g., a silicon (Si) substrate, a germanium (Ge) substrate, or a silicon-germanium (Si—Ge) substrate). The interlayer insulating layer 102 may include, for example, silicon oxide, silicon nitride, and/or silicon oxynitride, and the etch stop layer 104 may include a metal oxide (e.g., aluminum oxide).

A stacked structure SS may be disposed on the etch stop layer 104. The stacked structure SS may include first conductive lines CL1 spaced apart from each other in a first direction D1 perpendicular to an upper surface 100U of the substrate 100, second conductive lines CL2 spaced apart from the first conductive lines CL1 in a second direction D2 parallel to the upper surface 100U of the substrate 100, gate electrodes GE disposed between the first conductive lines CL1 and the second conductive lines CL2, first selection gate electrodes SGE1 between the first conductive lines CL1 and the gate electrodes GE, and second selection gate electrodes SGE2 between the second conductive lines CL2 and the gate electrodes GE.

The first conductive lines CL1 may extend in a third direction D3 parallel to the upper surface 100U of the substrate 100, and the third direction D3 may cross in the second direction D2. The second conductive lines CL2 may be spaced apart from each other in the first direction D1 and may extend in the third direction D3. The second conductive lines CL2 may extend parallel to the first conductive lines CL1 in the third direction D3. The gate electrodes GE may cross the first conductive lines CL1 and the second conductive lines CL2. The gate electrodes GE may extend in the first direction D1 between the first conductive lines CL1 and the second conductive lines CL2 and may be spaced from each other in the third direction D3.

The first selection gate electrodes SGE1 may cross the first conductive lines CL1. The first selection gate electrodes SGE1 may extend in the first direction D1 between the first conductive lines CL1 and the gate electrodes GE, and may be spaced apart from each other in the third direction D3. The first selection gate electrodes SGE1 may be electrically connected to the gate electrodes GE, respectively. The second selection gate electrodes SGE2 may cross the second conductive lines CL2. The second selection gate electrodes SGE2 may extend in the first direction D1 between the second conductive lines CL2 and the gate electrodes GE, and may be spaced apart from each other in the third direction D3. The second selection gate electrodes SGE2 may be electrically connected to the gate electrodes GE, respectively.

The first conductive lines CL1 and the second conductive lines CL2 may include a conductive material, for example, doped polysilicon, metal, conductive metal nitride, conductive metal silicide, conductive metal oxide, or a combination thereof. The first conductive lines CL1 and the second conductive lines CL2 may be, for example, doped polysilicon, Al, Cu, Ti, Ta, Ru, W, Mo, Pt, Ni, Co, TiN, It may be made of TaN, WN, NbN, TiAl, TiAlN, TiSi, TiSiN, TaSi, TaSiN, RuTiN, NiSi, CoSi, IrOx, RuOx, or a combination thereof, but is not limited thereto. The first conductive lines CL1 and the second conductive lines CL2 may include a two-dimensional semiconductor material. For example, the two-dimensional semiconductor material may include graphene or carbon nanotubes, or a combination thereof. The gate electrodes GE and the first and second selection gate electrodes SGE1 and SGE2 may include doped polysilicon, metal, conductive metal nitride, conductive metal silicide, conductive metal oxide, or a combination thereof. The gate electrodes GE and the first and second selection gate electrodes SGE1 and SGE2 may be, for example, doped polysilicon, Al, Cu, Ti, Ta, Ru, W, Mo, Pt, Ni, It may be made of Co, TiN, TaN, WN, NbN, TiAl, TiAlN, TiSi, TiSiN, TaSi, TaSiN, RuTiN, NiSi, CoSi, IrOx, RuOx, or a combination thereof, but is not limited thereto.

The stacked structure SS may include a plurality of channel patterns CH surrounding a side surface GE_S of each of the gate electrodes GE, a plurality of first selection channel patterns SCH1 surrounding a side surface SGE1_S of each of the first selection gate electrodes SGE1, and plurality of second selection channel patterns SCH2 surrounding a side surface SGE2_S of each of the second selection gate electrodes SGE2. The plurality of channel patterns CH may surround a side surface GE_S of a corresponding one of the gate electrodes GE and may be spaced apart from each other in the first direction D1. The plurality of first selection channel patterns SCH1 may surround a side surface SGE1_S of a corresponding first selection gate electrode SGE1 of the first selection gate electrodes SGE1, and may be spaced apart from each other in the first direction D1. The plurality of second selection channel patterns SCH2 may surround a side surface SGE2_S of a corresponding second selection gate electrode SGE2 of the second selection gate electrodes SGE2, and may be spaced apart from each other in the first direction D1.

The plurality of first selection channel patterns SCH1 may be disposed between the first conductive lines CL1 and the plurality of channel patterns CH. The first conductive lines CL1 may be electrically connected to the plurality of first selection channel patterns SCH1, respectively. The plurality of first selection channel patterns SCH1 may be respectively connected to the plurality of channel patterns CH and may be in contact with the plurality of channel patterns CH, respectively. The first conductive lines CL1 may be electrically connected to the plurality of channel patterns CH through the plurality of first selection channel patterns SCH1.

The plurality of second selection channel patterns SCH2 may be disposed between the second conductive lines CL2 and the plurality of channel patterns CH. The second conductive lines CL2 may be electrically connected to the plurality of second selection channel patterns SCH2, respectively. The plurality of second selection channel patterns SCH2 may be connected to the plurality of channel patterns CH, respectively, and may be in contact with the plurality of channel patterns CH, respectively. The second conductive lines CL2 may be electrically connected to the plurality of channel patterns CH through the plurality of second selection channel patterns SCH2, respectively.

Each of the first conductive lines CL1 may extend in the third direction D3 and may be connected to neighboring first selection channel patterns SCH1, which are neighbored to each other in the third direction D3 and respectively surround the side surfaces SGE1_S of the first selection gate electrodes SGE1. Each of the second conductive lines CL2 may extend in the third direction D3 and may be connected to neighboring second selection channel patterns SCH2, which are neighbored to each other in the third direction D3 and respectively surround the side surfaces SGE2_S of the second selection gate electrodes SGE2.

The channel patterns CH and the first and second selection channel patterns SCH1 and SCH2 may include silicon (e.g., polycrystalline silicon, doped silicon, or single crystalline silicon), germanium, silicon-germanium, or an oxide semiconductor. The oxide semiconductor may include InGaZnO (IGZO), Sn—InGaZnO, InWO (IWO), $CuS_2$, $CuSe_2$, $WSe_2$, InGaSiO, InSnZnO, InZnO (IZO), ZnO, ZnTiO (ZTO), YZnO (YZO), ZnSnO, ZnON, ZrZnSnO, SnO, HfInZnO, GaZnSnO, AlZnSnO, YbGaZnO, InGaO, or combinations thereof. The channel patterns CH and the first and second selection channel patterns SCH1 and SCH2 may include a two-dimensional semiconductor material, and for example, the two-dimensional semiconductor material may include $MoS_2$, $MoSe_2$, $WS_2$, graphene, carbon nanotubes, or a combination thereof. The first and second selection channel patterns SCH1 and SCH2 may include the same material as the channel patterns CH.

The stacked structure SS may further include a ferroelectric pattern FP between each of the plurality of channel patterns CH and the corresponding gate electrode GE, a metal pattern MP between each of the plurality of channel patterns CH and the ferroelectric pattern FP, and a gate insulating pattern GI between each of the plurality of channel patterns CH and the metal pattern MP. The ferroelectric pattern FP may surround the side surface GE_S of the corresponding gate electrode GE. The metal pattern MP may surround the side surface GE_S of the corresponding gate electrode GE and may be spaced apart from the side surface GE_S of the corresponding gate electrode GE with the ferroelectric pattern FP interposed therebetween. The gate insulating pattern GI may surround the side surface GE_S of the corresponding gate electrode GE and may be spaced apart from the side surface GE_S of the corresponding gate electrode GE with the ferroelectric pattern FP and the metal pattern MP interposed therebetween.

The ferroelectric pattern FP may further include hafnium (Hf) oxide having ferroelectric characteristics. The ferroelectric pattern FP may further include a dopant, and the dopant may be at least one of Zr, Si, Al, Y, Gd, La, Sc, and Sr. For example, the ferroelectric pattern FP may include $HfO_2$, HfZnO, HfSiO, HfSiON, HfTaO, HfTiO, HfZrO, or a combination thereof. The ferroelectric pattern FP may have an orthorhombic phase. The ferroelectric pattern FP may include a laminate structure in which two or more types of ferroelectric layers are stacked or a laminate structure in which a ferroelectric layer and an insulating layer are stacked. The metal pattern MP may include a metal (e.g., Pt, etc.) and/or a metal oxide (e.g., $RuO_2$, $IrO_2$, $LaSrCoO_3$, etc.). The metal pattern MP may be used to easily maintain polarization of the ferroelectric pattern FP. According to some embodiments, the metal pattern MP may be omitted. The gate insulating pattern GI may include a silicon oxide layer, a silicon oxynitride layer, a high dielectric layer having a higher dielectric constant than the silicon oxide layer, or a combination thereof. The high dielectric layer may include a metal oxide or a metal oxynitride.

The stacked structure SS may further include a first selection gate insulating pattern SGI1 between each of the plurality of first selection channel patterns SCH1 and the corresponding first selection gate electrode SGE1 and a second selection gate insulating pattern SGI2 between each of the plurality of second selection channel patterns SCH2 and the corresponding second selection gate electrode SGE2. The first selection gate insulating pattern SGI1 may surround the side surface SGE1_S of the corresponding first selection gate electrode SGE1, and each of the plurality of first selection channel patterns SCH1 may be spaced apart from the side surface SGE1_S of the corresponding first selection gate electrode SGE1 with the first selection gate insulating pattern SGI1 interposed therebetween. The second selection gate insulating pattern SGI2 may surround the side surface SGE2_S of the corresponding second selection gate electrode SGE2, and each of the plurality of second selection channel patterns SCH2 may be spaced apart from the side surface SGE2_S of the corresponding second selection gate electrode SGE2 with the second selection gate insulating pattern SGI2 interposed therebetween. The first and second selection gate insulating patterns SGI1 and SGI2 may include a silicon oxide layer, a silicon oxynitride layer, a high-k dielectric layer having a higher dielectric constant than the silicon oxide layer, or a combination thereof. The high dielectric layer may include a metal oxide or a metal oxynitride. The first and second selection gate insulating patterns SGI1 and SGI2 may include the same material as the gate insulating pattern GI.

The stacked structure SS may further include first impurity patterns OP1 between the first conductive lines CL1 and the plurality of first selection channel patterns SCH1 and second impurity patterns OP2 between the second conductive lines CL2 and the plurality of second selection channel patterns SCH2. The first impurity patterns OP1 may be spaced apart from each other in the first direction D1, and may be interposed between the first conductive lines CL1 and the plurality of first selection channel patterns SCH1, respectively. The second impurity patterns OP2 may be spaced apart from each other in the first direction D1, and may be interposed between the second conductive lines CL2 and the plurality of second selection channel patterns SCH2, respectively. The first conductive lines CL1 may be electrically connected to the plurality of first selection channel patterns SCH1 through the first impurity patterns OP1, respectively, and the second conductive lines CL2 may be electrically connected to the plurality of second selection channel patterns SCH2 through the second impurity patterns OP2, respectively.

The first impurity patterns OP1 and the second impurity patterns OP2 may include impurities having the same conductivity type. The first impurity patterns OP1 and the second impurity patterns OP2 may include, for example, N-type impurities or P-type impurities.

The corresponding gate electrode GE, each of the plurality of channel patterns CH, the ferroelectric pattern FP interposed between each of the plurality of channel patterns CH and the corresponding gate electrode GE, the metal pattern MP, and the gate insulating pattern GI may constitute a ferroelectric field effect transistor. The corresponding first selection gate electrode SGE1, each of the plurality of first selection channel patterns SCH1, and the first selection gate insulating pattern SGI1 interposed between each of the plurality of first selection channel patterns SCH1 and the corresponding first selection gate electrode SGE1 may constitute a first selection transistor. The corresponding second selection gate electrode SGE2, each of the plurality of second selection channel patterns SCH2, and the second selection gate insulating pattern SGI2 interposed between each of the plurality of second selection channel patterns SCH2 and the corresponding second selection gate electrode SGE2 may constitute a second selection transistor. The first selection transistor may control a flow of current between a corresponding first conductive line CL1 among the first conductive lines CL1 and the ferroelectric field effect transistor, and the second selection transistor may control a flow of current between a corresponding second conductive line CL2 among the second conductive lines CL2 and the ferroelectric field effect transistor. For example, the first conductive lines CL1 may function as bit lines and the second conductive lines CL2 may function as source lines. As another example, the first conductive lines CL1 may function as source lines and the second conductive lines CL2 may function as bit lines.

The stacked structure SS may further include first insulating patterns 106 spaced apart from each other in the first direction D1. The first conductive lines CL1 may be respectively disposed between the first insulating patterns 106. The first insulating patterns 106 and the first conductive lines CL1 may be alternately stacked in the first direction D1. The first insulating patterns 106 may extend, in the second direction D2, between the first impurity patterns OP1, between the first selection channel patterns SCH1, and between first selection gate insulating patterns SGI1 spaced apart from each other in the first direction D1. The first insulating patterns 106 may surround the side surface SGE1_S of each of the first selection gate electrodes SGE1.

The first insulating patterns 106 may extend, in the second direction D2, between the plurality of channel patterns CH, between gate insulating patterns GI spaced apart from each other in the first direction D1, and between the metal patterns MP spaced apart from each other in the first direction D1. The first insulating patterns 106 may surround the side surface GE_S of each of the gate electrodes GE. The ferroelectric pattern FP may extend between each of the gate electrodes GE and each of the first insulating patterns 106. The first insulating patterns 106 may be in contact with side surfaces of the ferroelectric pattern FP.

The first insulating patterns 106 may extend, in the second direction D2, between the second selection channel patterns SCH2, and between the second selection gate insulating patterns SGI2 spaced apart from each other in the first direction D1. The first insulating patterns 106 may surround the side surfaces SGE2_S of each of the second selection gate electrodes SGE2. The first insulating patterns 106 may further extend between the second impurity patterns OP2 and between the second conductive lines CL2 in the second direction D2. The first insulating patterns 106 may include, for example, silicon oxide.

Sidewall insulating patterns 130 may be disposed on the etch stop layer 104 and on both sides of the stacked structure SS. The sidewall insulating patterns 130 may be spaced apart from each other in the second direction D2 with the stacked structure SS interposed therebetween. The sidewall insulating patterns 130 may extend in the first direction D1 and the third direction D3. One of the sidewall insulating patterns 130 may extend in the first direction D1 to cover side surfaces of the first conductive lines CL1 and the first insulating patterns 106 and may extend along the side surfaces of the conductive lines CL1 in the third direction D3. Another one of the sidewall insulating patterns 130 may extend in the first direction D1 to cover other side surfaces of the second conductive lines CL2 and the first insulating patterns 106 and may extend along the side surfaces of the second conductive lines CL2 in the third direction D3. The sidewall insulating patterns 130 may include, for example, silicon oxide, silicon nitride, and/or silicon oxynitride.

An upper interlayer insulating layer 170 may be disposed on the stacked structure SS and the sidewall insulating patterns 130. The upper interlayer insulating layer 170 may include, for example, silicon oxide, silicon nitride, and/or silicon oxynitride. Upper conductive contacts 185 may be disposed in the upper interlayer insulating layer 170. Each of the upper conductive contacts 185 may pass through the upper interlayer insulating layer 170 and may be electrically connected to a corresponding one of the gate electrodes GE and the first and second selection gate electrodes SGE1 and SGE2. Each of the gate electrodes GE and the first and second selection gate electrodes SGE1 and SGE2 may be electrically connected to a corresponding upper conductive contact 185 among the upper conductive contacts 185.

Upper conductive lines 180 may be disposed on the upper interlayer insulating layer 170. Each of the upper conductive contacts 185 may be electrically connected to a corresponding upper conductive line 180 among the upper conductive lines 180. Each of the gate electrodes GE and the first and second selection gate electrodes SGE1 and SGE2 may be electrically connected to a corresponding upper conductive line 180 among the upper conductive lines 180, through a corresponding upper conductive contact 185 among the upper conductive contacts 185. For example, one of the upper conductive lines 180 may be electrically connected to a corresponding gate electrode GE among the gate electrodes GE, through a corresponding upper conductive contact 185 among the upper conductive contacts 185. Another one of the upper conductive lines 180 may be electrically connected to a corresponding first selection gate electrode SGE1 among the first selection gate electrodes SGE1 and a corresponding second selection gate electrode SGE2 among the second selection gate electrodes SGE2 through corresponding upper conductive contacts 185 among the upper conductive contacts 185. The upper conductive contacts 185 and the upper conductive lines 180 may include a conductive material (e.g., metal).

According to inventive concepts of the present disclosure, the gate electrodes GE and the plurality of channel patterns CH may constitute ferroelectric field effect transistors, and the ferroelectric field effect transistors may function as memory cells of a semiconductor device. The ferroelectric field effect transistors may be stacked in the first direction D1 and the third direction D3, and thus, high integration of the semiconductor device may be facilitated.

In addition, the first selection gate electrodes SGE1 and the plurality of first selection channel patterns SCH1 may constitute first selection transistors, and may control a flow of current between the first conductive lines CL1 and the ferroelectric field effect transistors. The second selection gate electrodes SGE2 and the plurality of second selection channel patterns SCH2 may constitute second selection transistors, and may control a flow of current between the second conductive lines CL2 and the ferroelectric field effect transistors. Accordingly, during operation of the semiconductor device using the ferroelectric field effect transistors as the memory cells, disturb between the ferroelectric field effect transistors adjacent to each other in the third direction D3 may be reduced. Thus, operating characteristics and reliability of the semiconductor device may be improved.

FIGS. 3A to 9A are plan views illustrating a method of manufacturing a semiconductor device according to some embodiments of the present disclosure, and FIGS. 3B to 9B are cross-sectional views taken along line A-A' of FIGS. 3A to 9A, respectively. For simplicity of description, a description overlapping with the semiconductor device described with reference to FIGS. 1, 2A, and 2B will be omitted.

Figure 3A:
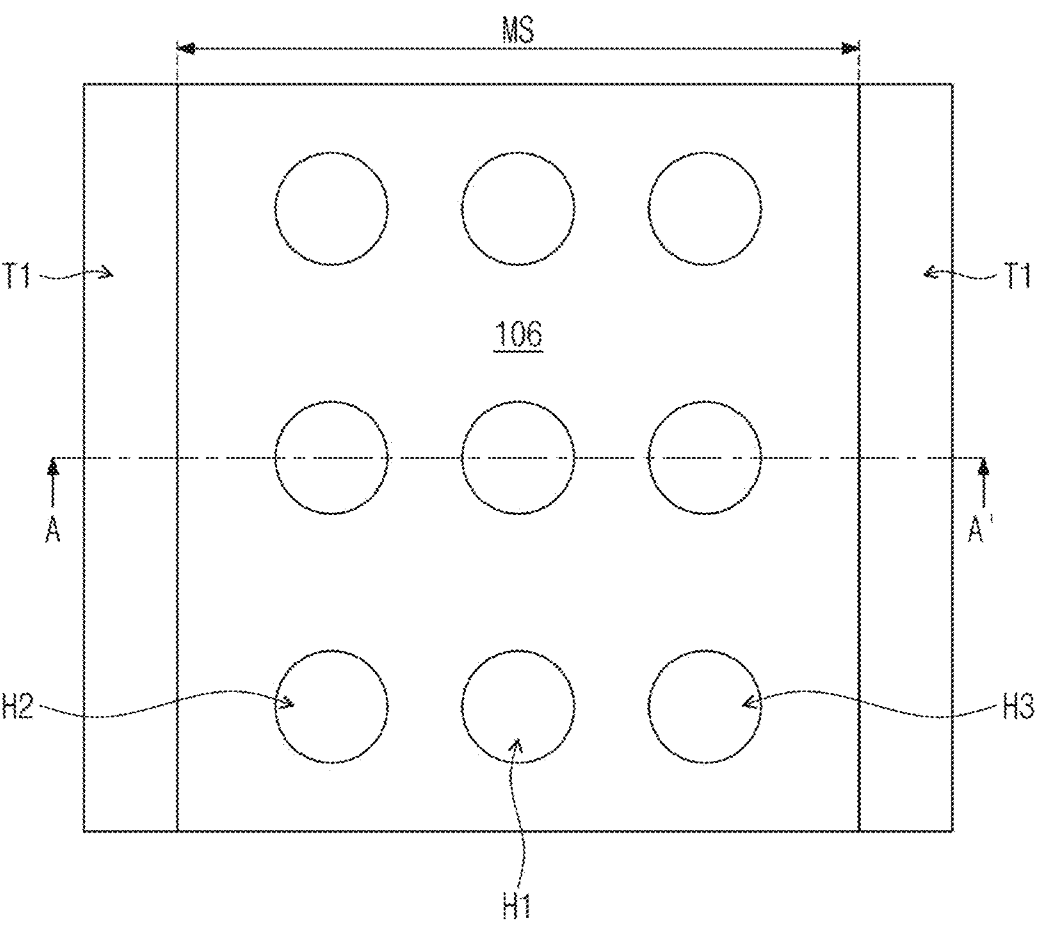
Figure 3A:
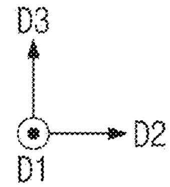
Figure 3B:
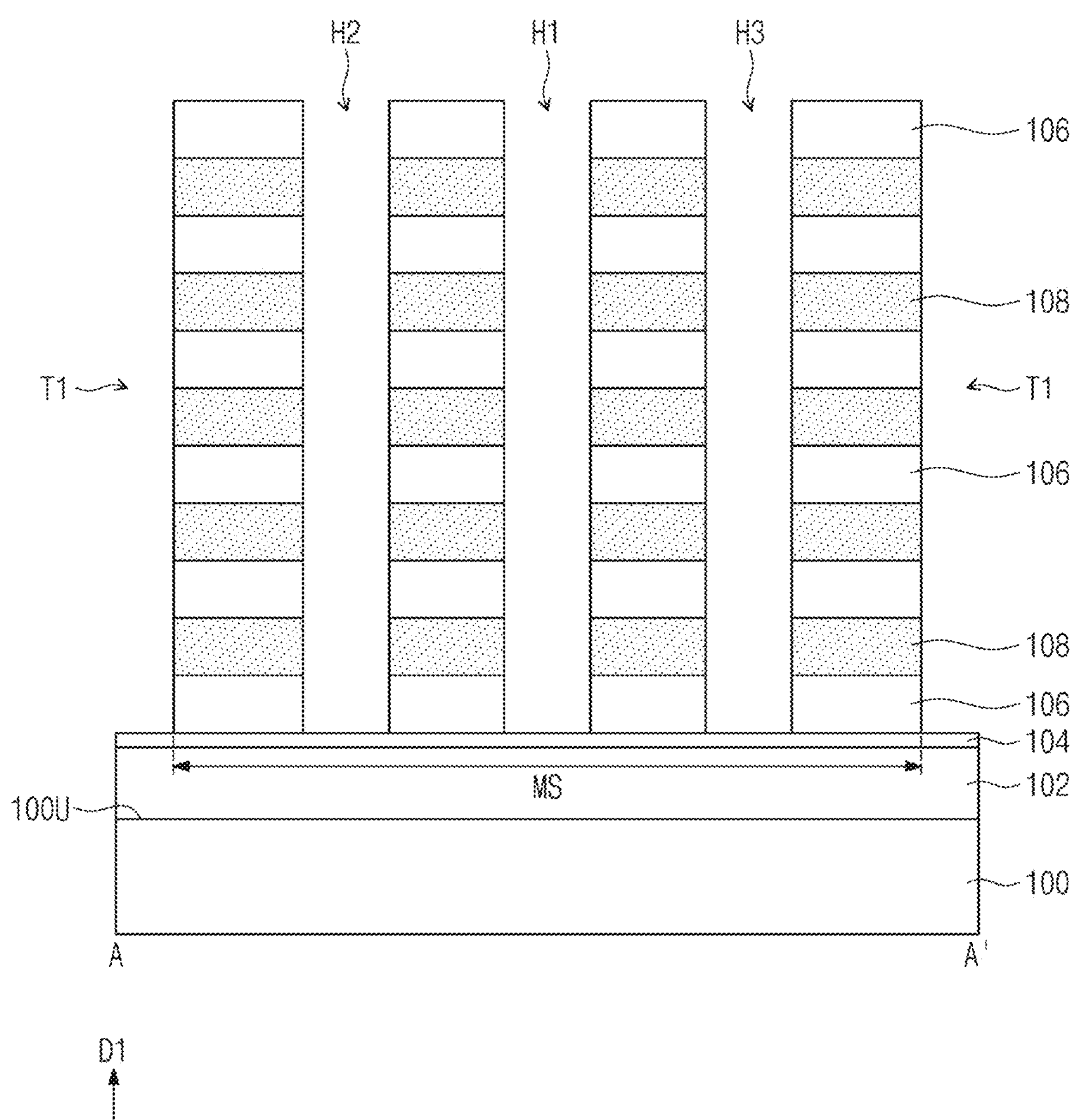

Referring to FIGS. 3A and 3B, an interlayer insulating layer 102 and an etch stop layer 104 may be sequentially formed on a substrate 100. First insulating layers 106 and second insulating layers 108 may be stacked on the etch stop layer 104. The first insulating layers 106 and the second insulating layers 108 may be alternately stacked in a first direction D1 perpendicular to an upper surface 100U of the substrate 100. A lowermost first insulating layer 106 of the first insulating layers 106 may be interposed between a lowermost second insulating layer 108 of the second insulating layers 108 and the etch stop layer 104, and an uppermost first insulating layer 106 of the first insulating layers 106 may be disposed on an uppermost second insulating layer 108 of the second insulating layers 108. The first insulating layers 106 may include, for example, silicon oxide. The second insulating layers 108 may include a material having etch selectivity with respect to the first insulating layers 106, and may include, for example, silicon nitride.

First trenches T1 may be formed in the first insulating layers 106 and the second insulating layers 108. Each of the first trenches T1 may pass through the first insulating layers 106 and the second insulating layers 108 in the first direction D1 and may expose an upper surface of the etch stop layer 104. The first trenches T1 may be spaced apart from each other in a second direction D2 parallel to the upper surface 100U of the substrate 100 and may extend in a third direction D3 parallel to the upper surface 100U of the substrate 100. The third direction D3 may cross the second direction D2. Forming the first trenches T1 may include, for example, anisotropically etching the first insulating layers 106 and the second insulating layers 108.

A mold structure MS may be defined by the first trenches T1. The mold structure MS may include the first insulating layers 106 and the second insulating layers 108 interposed between the first trenches T1. The first trenches T1 may be spaced apart from each other in the second direction D2 with the mold structure MS interposed therebetween and may extend in the third direction D3. The mold structure MS may extend in the third direction D3 between the first trenches T1.

First holes H1, second holes H2, and third holes H3 may be formed in the mold structure MS. Each of the first, second, and third holes H1, H2, and H3 may extend in the first direction D1 to pass through the mold structure MS, and may expose the upper surface of the etch stop layer 104. The first holes H1 may be spaced apart from each other in the third direction D3 between the first trenches T1. The second holes H2 may be disposed between one of the first trenches T1 and the first holes H1, and may be spaced apart from each other in the third direction D3. The third holes H3 may be disposed between another one of the first trenches T1 and the first holes H1, and may be spaced apart from each other in the third direction D3. Forming the first to third holes H1, H2, and H3 may include, for example, anisotropically etching the first insulating layers 106 and the second insulating layers 108.

Figure 4A:
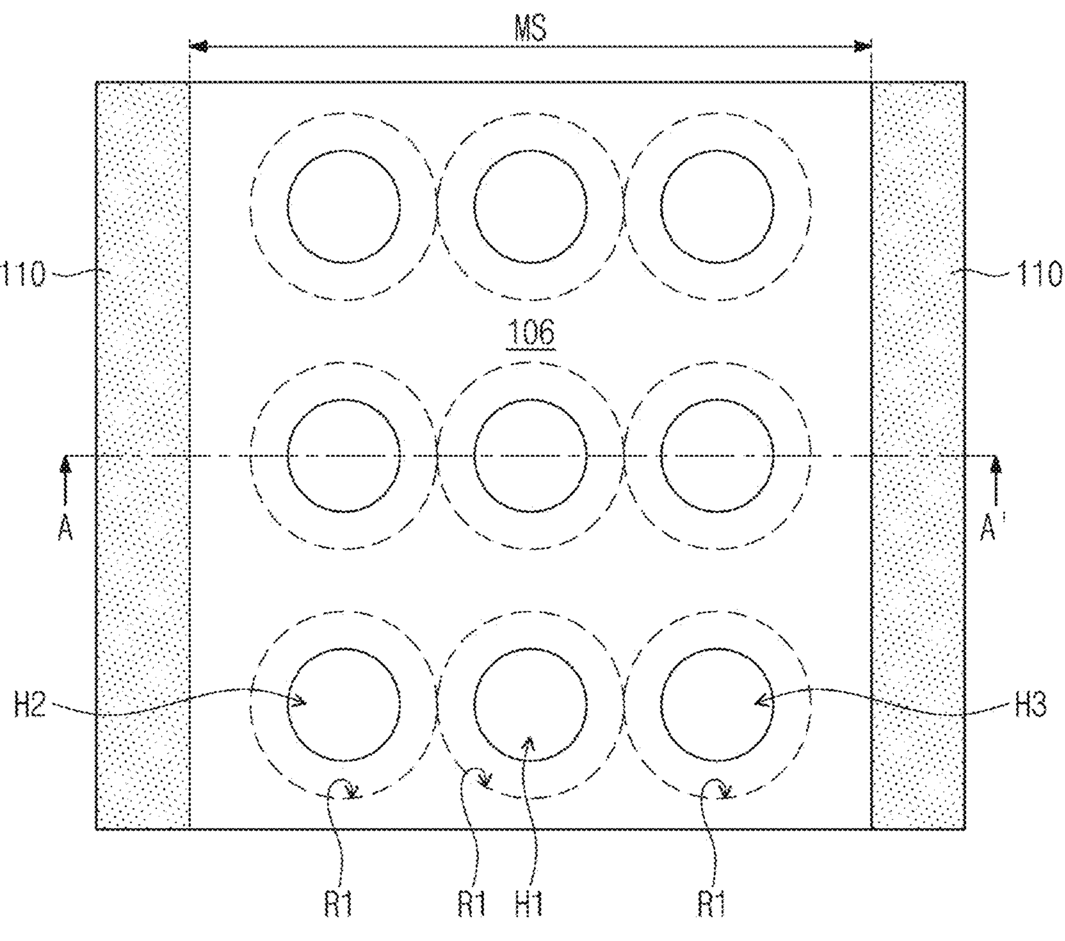
Figure 4A:
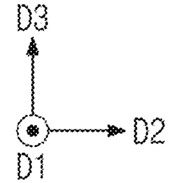
Figure 4B:
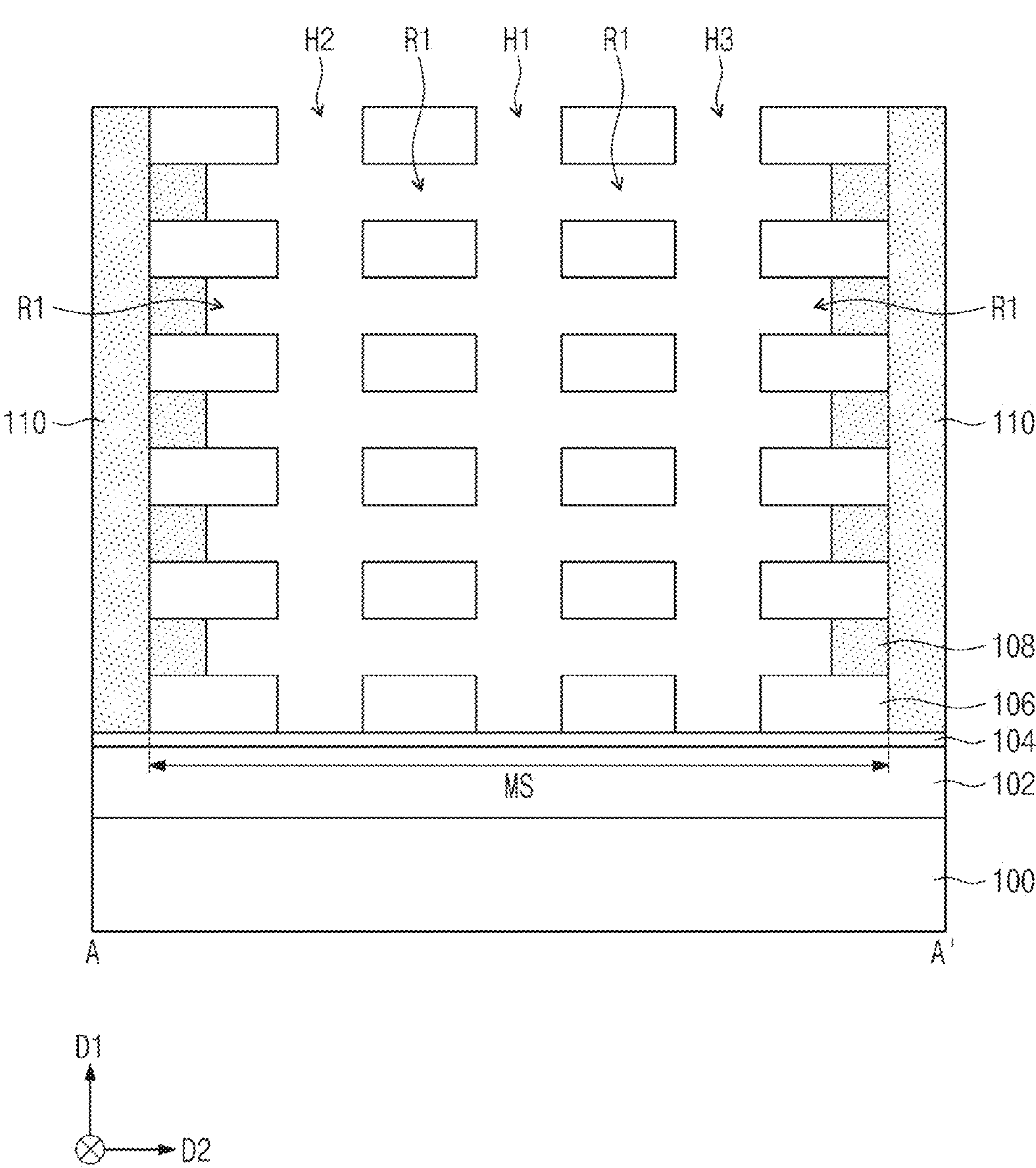

Referring to FIGS. 4A and 4B, first sacrificial patterns 110 may be formed in the first trenches T1, respectively. The first sacrificial patterns 110 may be formed to fill each of the first trenches T1. The first sacrificial patterns 110 may be spaced apart from each other in the second direction D2 with the mold structure MS interposed therebetween and may extend in the third direction D3. The first sacrificial patterns 110 may cover both side surfaces of the mold structure MS. The first sacrificial patterns 110 may include a material having etch selectivity with respect to the second insulating layers 108. For example, each of the first sacrificial patterns 110 may include silicon oxide conformally covering inner surfaces of each of the first trenches T1 and filling an upper region of each of the first trenches T1 and silicon nitride filling the remainder of each of the first trenches T1.

Each of the first to third holes H1, H2, and H3 may expose side surfaces of the first insulating layers 106 and the second insulating layers 108 of the mold structure MS. The exposed side surfaces of the second insulating layers 108 may be selectively recessed, and thus, first recessed regions R1 may be formed in the mold structure MS. Forming the first recess regions R1 may, for example, include laterally etching the exposed side surfaces of the second insulating layers 108 by performing an etching process having an etch selectivity on the second insulating layers 108. The first recess regions R1 may be spaced apart from each other in the first direction D1 and may be interposed between the first insulating layers 106, respectively. Each of the first recess regions R1 may be formed to surround each of the first to third holes H1, H2, and H3 when viewed in a plan view.

Figure 5A:
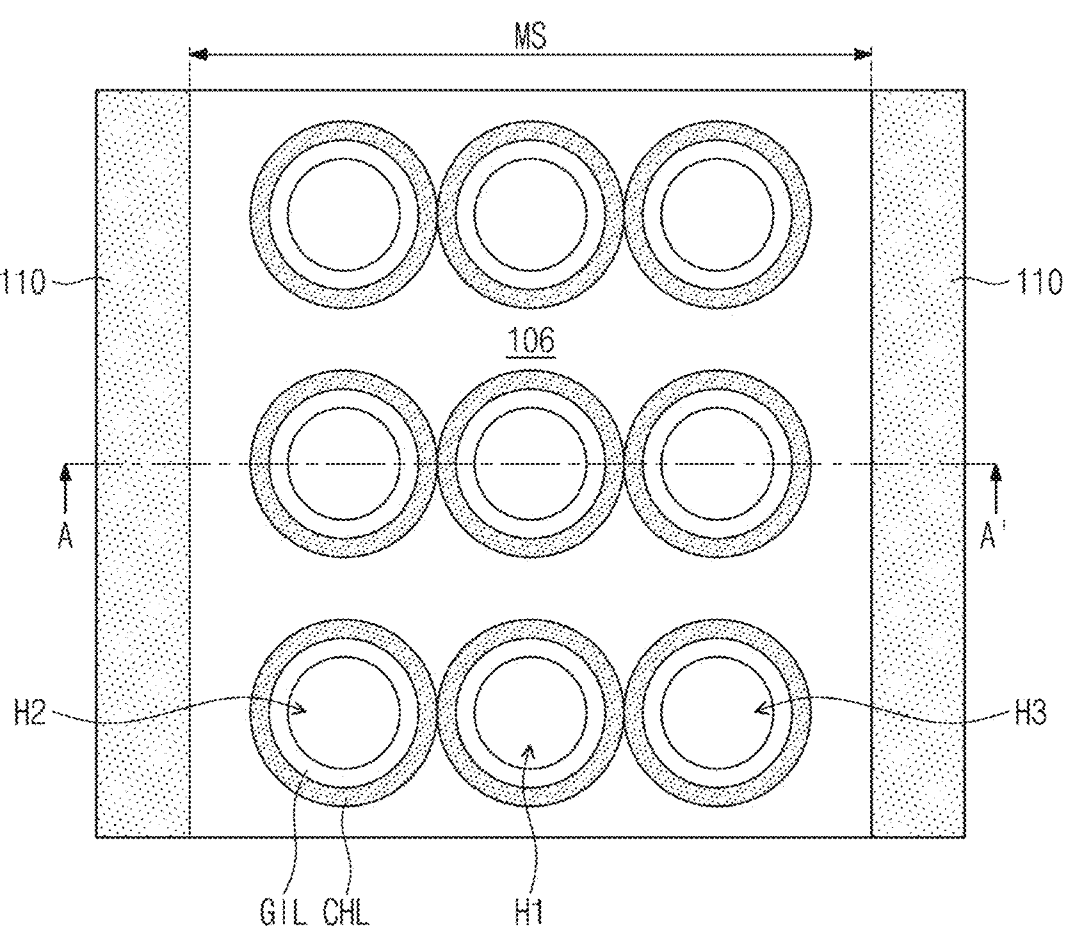
Figure 5A:
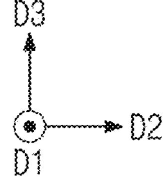
Figure 5B:
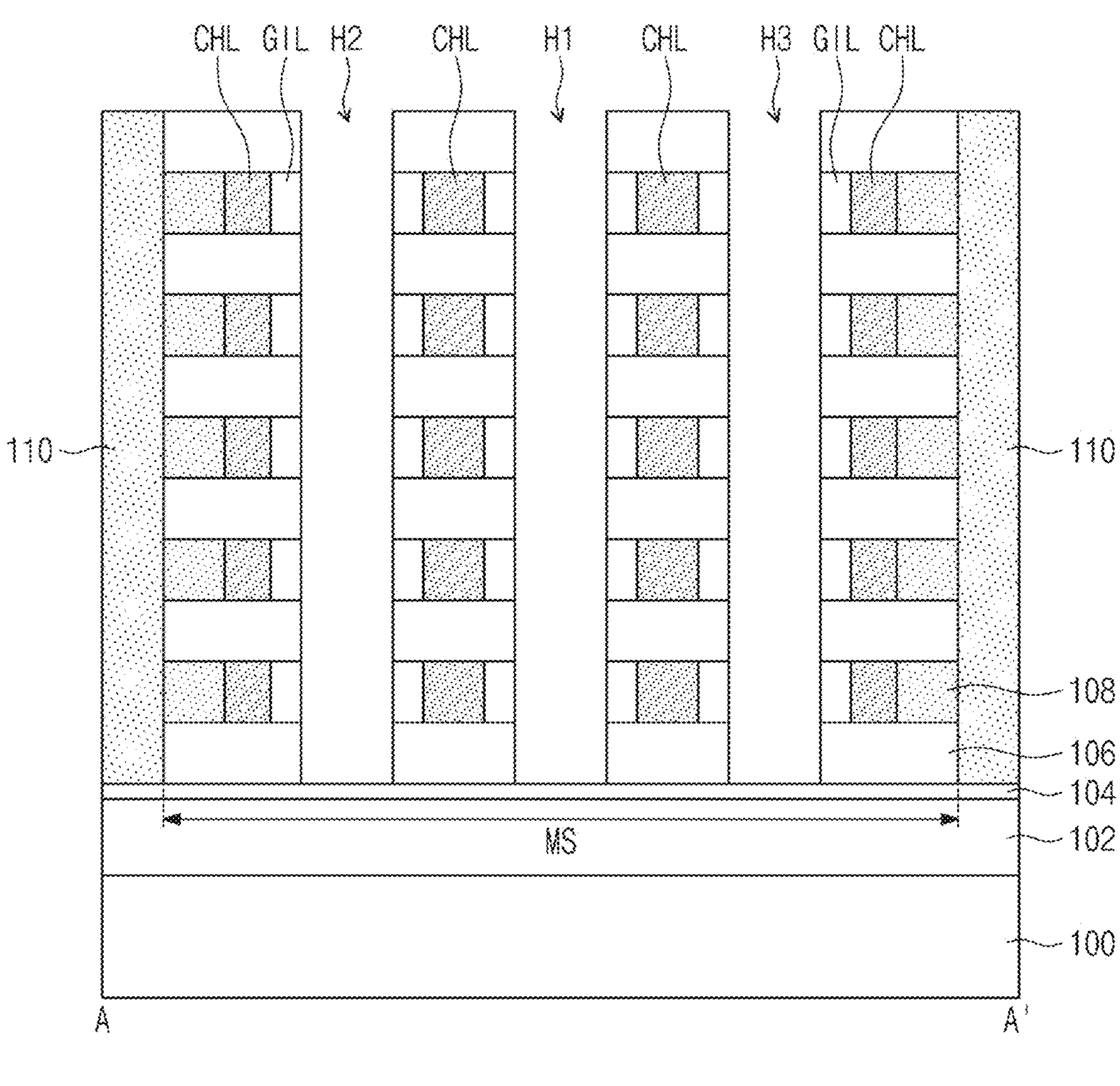

Referring to FIGS. 5A and 5B, a channel layer CHL and a gate insulating layer GIL may be formed in the first recess regions R1. The channel layer CHL may fill a portion of each of the first recess regions R1, and the gate insulating layer GIL may fill a remainder of each of the first recess regions R1. Forming the channel layer CHL may, for example, include forming the channel layer CHL filling the first recess regions R1 and partially filling each of the first to third holes H1, H2, and H3, removing the channel layer CHL in the first to third holes H1, H2, and H3, and laterally etching the channel layer CHL in each of the first recess regions R1 until the channel layer CHL remains to a desired thickness. Forming the gate insulating layer GIL may, for example, include forming the gate insulating layer GIL to fill remaining portions of the first recess regions R1 and to partially fill each of the first to third holes H1, H2, and H3, and removing the gate insulating layer GIL in the first to third holes H1, H2, and H3.

Figure 6A:
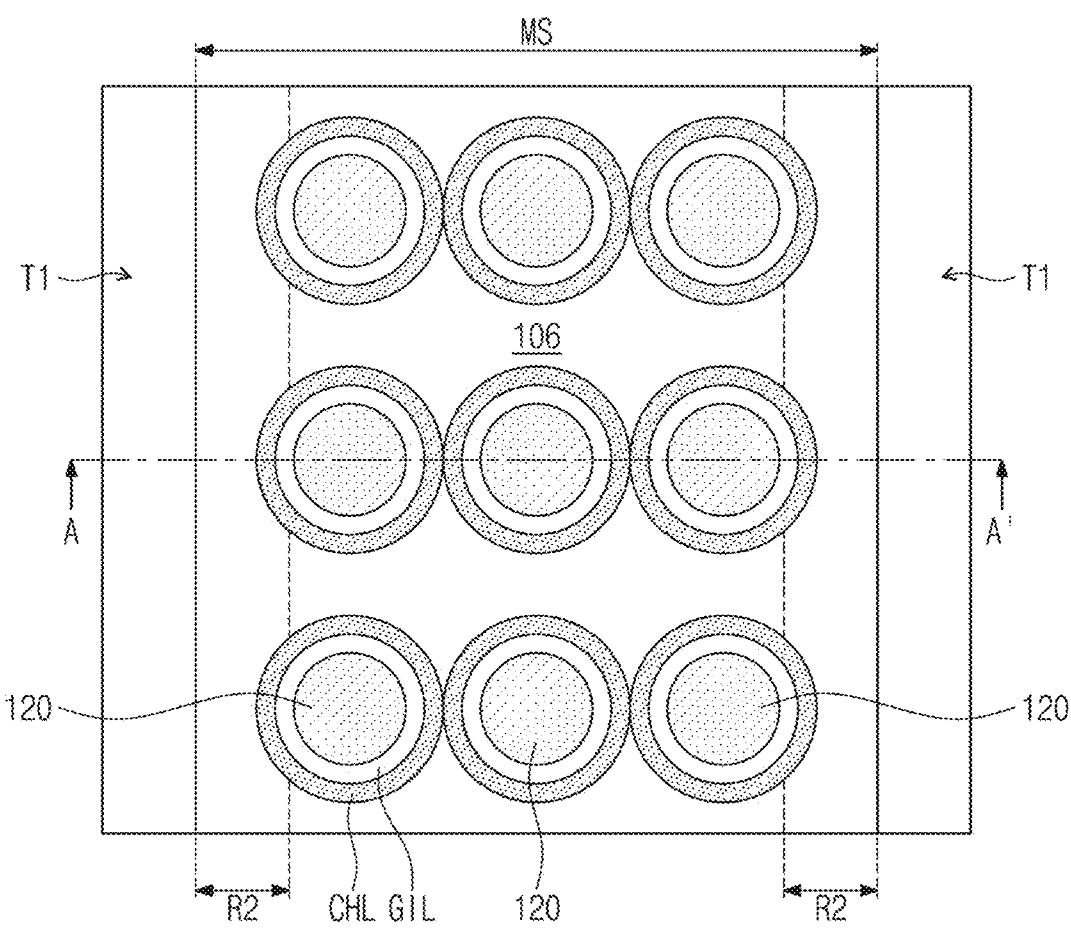
Figure 6A:
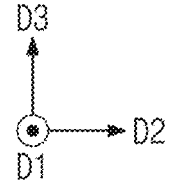
Figure 6B:
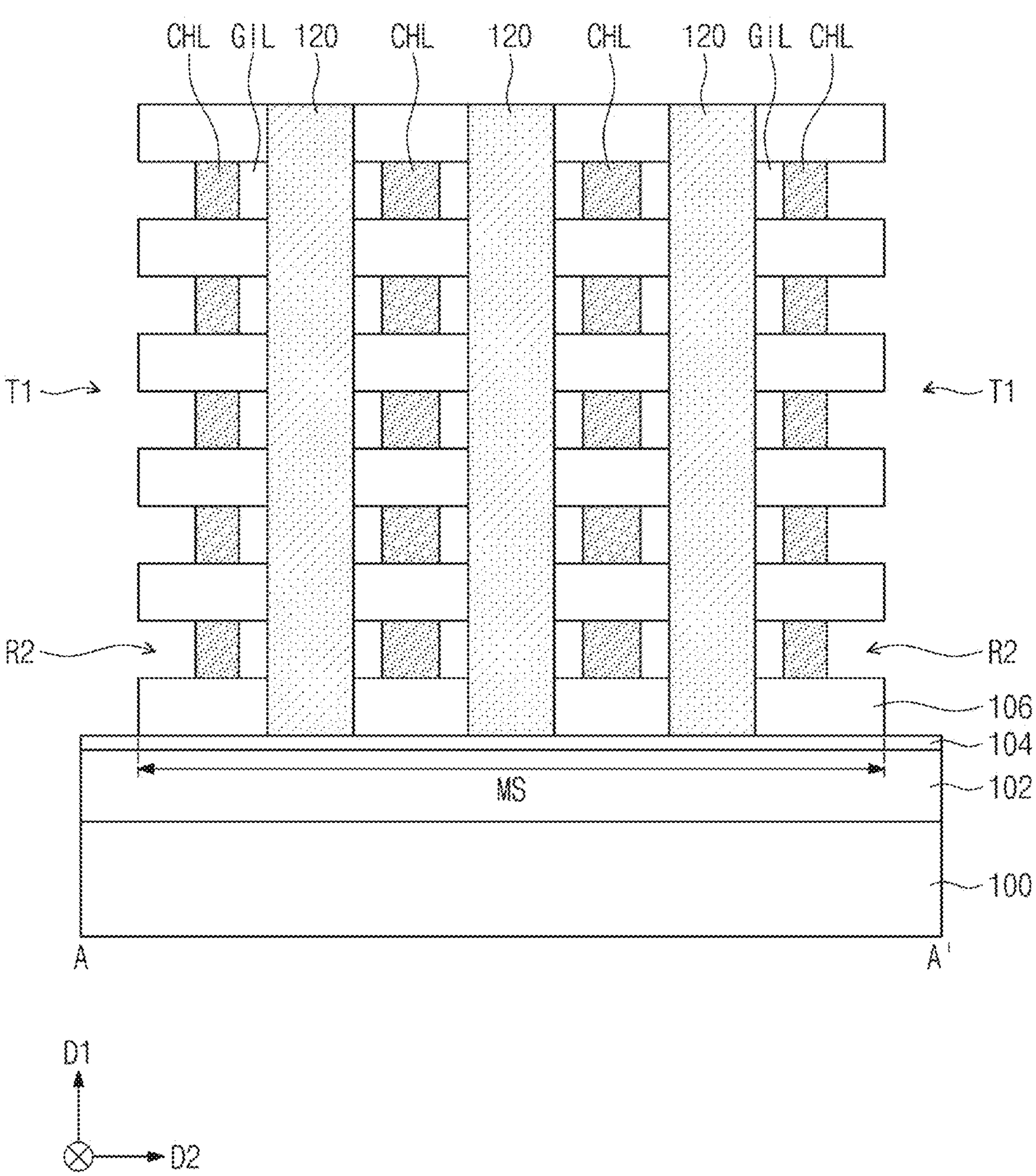

Referring to FIGS. 6A and 6B, second sacrificial patterns 120 may be formed in the first to third holes H1, H2, and H3, respectively. The second sacrificial patterns 120 may be formed to fill the first to third holes H1, H2, and H3, respectively. The second sacrificial patterns 120 may include a material having etch selectivity with respect to the second insulating layers 108. For example, each of the second sacrificial patterns 120 may include silicon oxide conformally covering inner surfaces of each of the first to third holes H1, H2, and H3 and filling upper regions of each of the first to third holes H1, H2, and H3, and silicon nitride filling the remainder of each of the first to third holes H1, H2, and H3.

The first sacrificial patterns 110 may be removed from the first trenches T1. Each of the first trenches T1 may expose side surfaces of the first insulating layers 106 and the second insulating layers 108 of the mold structure MS. The exposed side surfaces of the second insulating layers 108 may be selectively recessed, and thus second recessed regions R2 may be formed in the mold structure MS. Forming the second recess regions R2 may, for example, include laterally etching the exposed side surfaces of the second insulating layers 108 by performing an etching process having an etch selectivity on the second insulating layers 108. The second recess regions R2 may expose side surfaces of the channel layer CHL. The second recess regions R2 may be spaced apart from each other in the first direction D1 and may be respectively interposed between the first insulating layers 106. Each of the second recess regions R2 may have a line shape extending in the third direction D3.

Figure 7A:
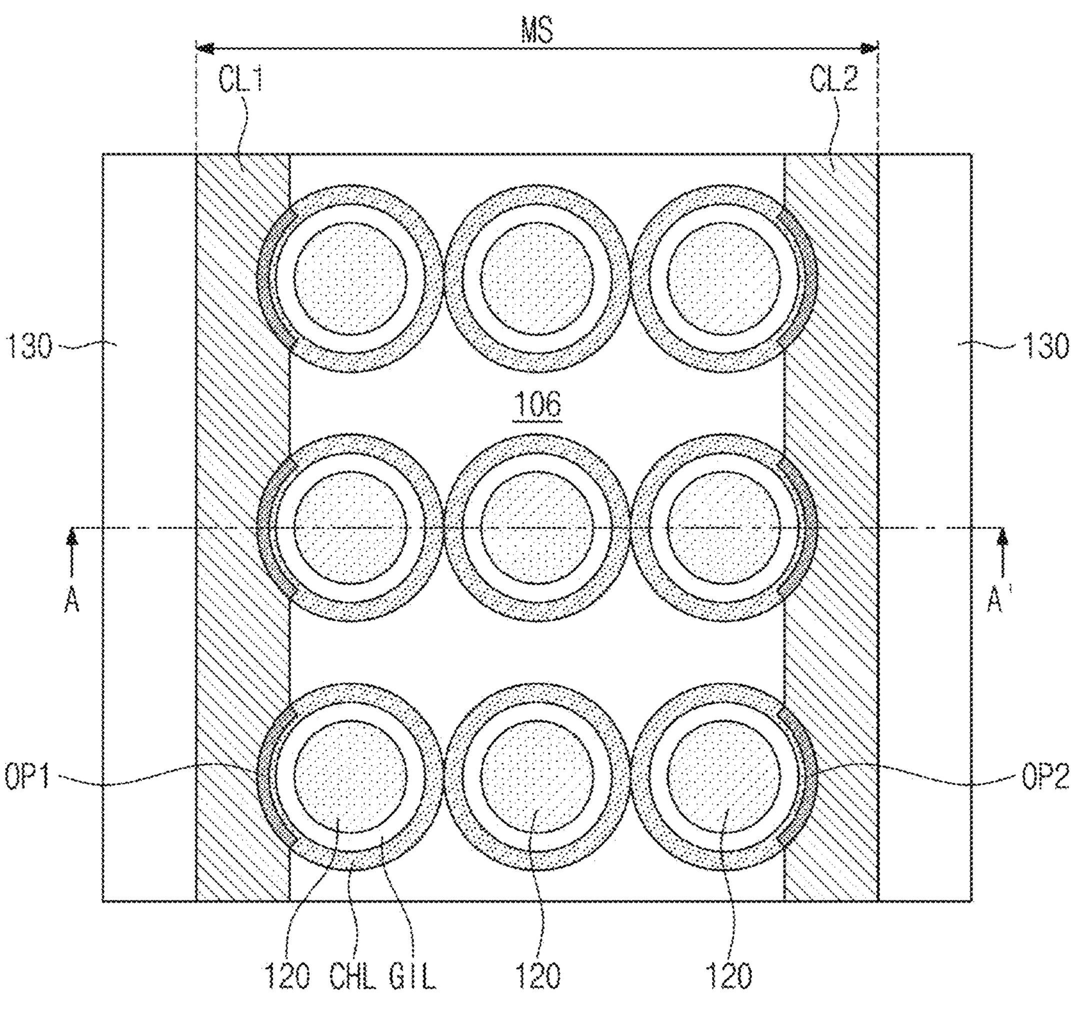
Figure 7A:
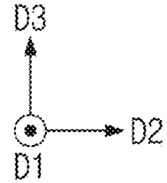
Figure 7B:
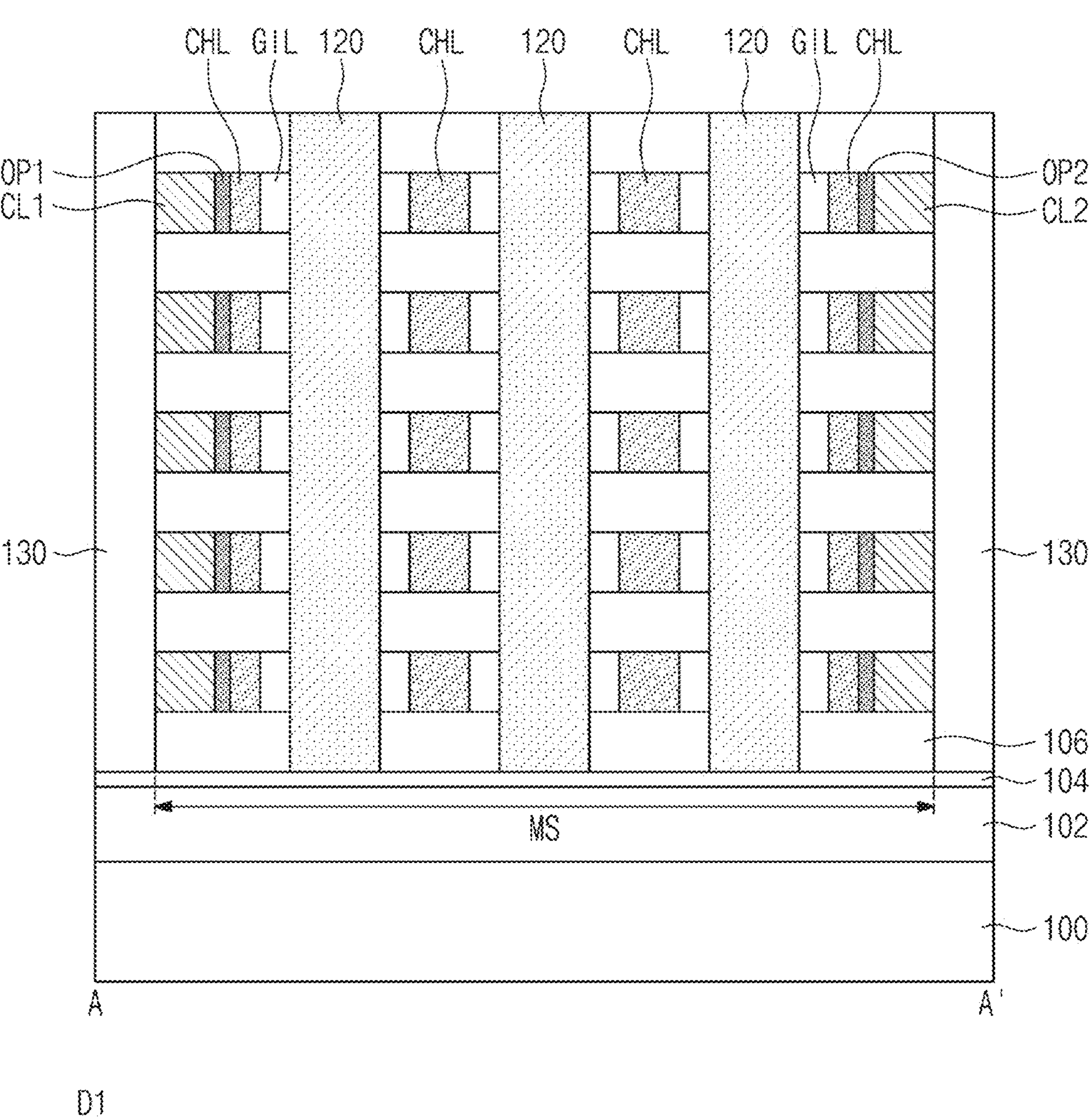

Referring to FIGS. 7A and 7B, first conductive lines CL1 and first impurity patterns OP1 may be formed in corresponding second recess regions R2 among the second recess regions R2. Each of the first impurity patterns OP1 may fill a portion of each of the corresponding second recess regions R2 and may contact the channel layer CHL. Each of the first conductive lines CL1 may fill the remainder of each of the corresponding second recess regions R2.

Second conductive lines CL2 and second impurity patterns OP2 may be formed in corresponding second recess regions R2 among the second recess regions R2. Each of the second impurity patterns OP2 may fill a portion of each of the corresponding second recess regions R2 and may be in contact with the channel layer CHL. Each of the second conductive lines CL2 may fill the remainder of each of the corresponding second recess regions R2.

Forming the first impurity patterns OP1 and the second impurity patterns OP2 may include, for example, doping impurities on side surfaces of the channel layer CHL exposed by the second recess regions R2. The first impurity patterns OP1 and the second impurity patterns OP2 may have the same conductivity type, and the impurities may be N-type impurities or P-type impurities. Forming the first conductive lines CL1 and the second conductive lines CL2 may, for example, forming a conductive layer filling the remaining portions of the second recess regions R2 and partially filling each of the first trenches T1 and removing the conductive layer in the first trenches T1.

Sidewall insulating patterns 130 may be formed in each of the first trenches T1. The sidewall insulating patterns 130 may be formed to fill each of the first trenches T1. The sidewall insulating patterns 130 may be spaced apart from each other in the second direction D2 with the mold structure MS interposed therebetween. One of the sidewall insulating patterns 130 may extend in the first direction D1 to cover the side surfaces of the first conductive lines CL1, and another one of the sidewall insulating patterns 130 may extend in the first direction D1 to cover the side surfaces of the second conductive lines CL2. Each of the sidewall insulating patterns 130 may have a line shape extending in the third direction D3.

Figure 8A:
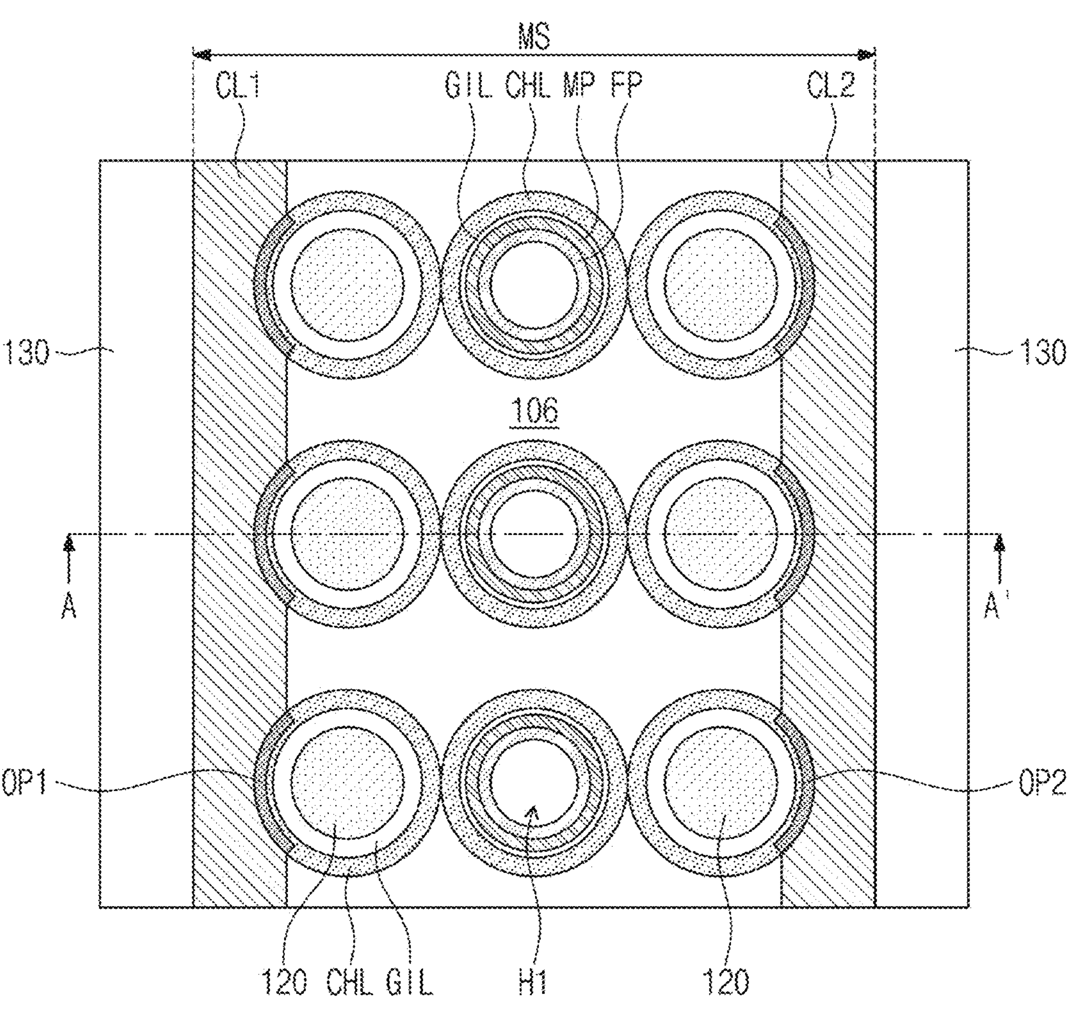
Figure 8A:
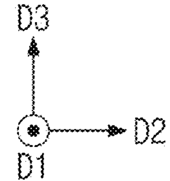
Figure 8B:
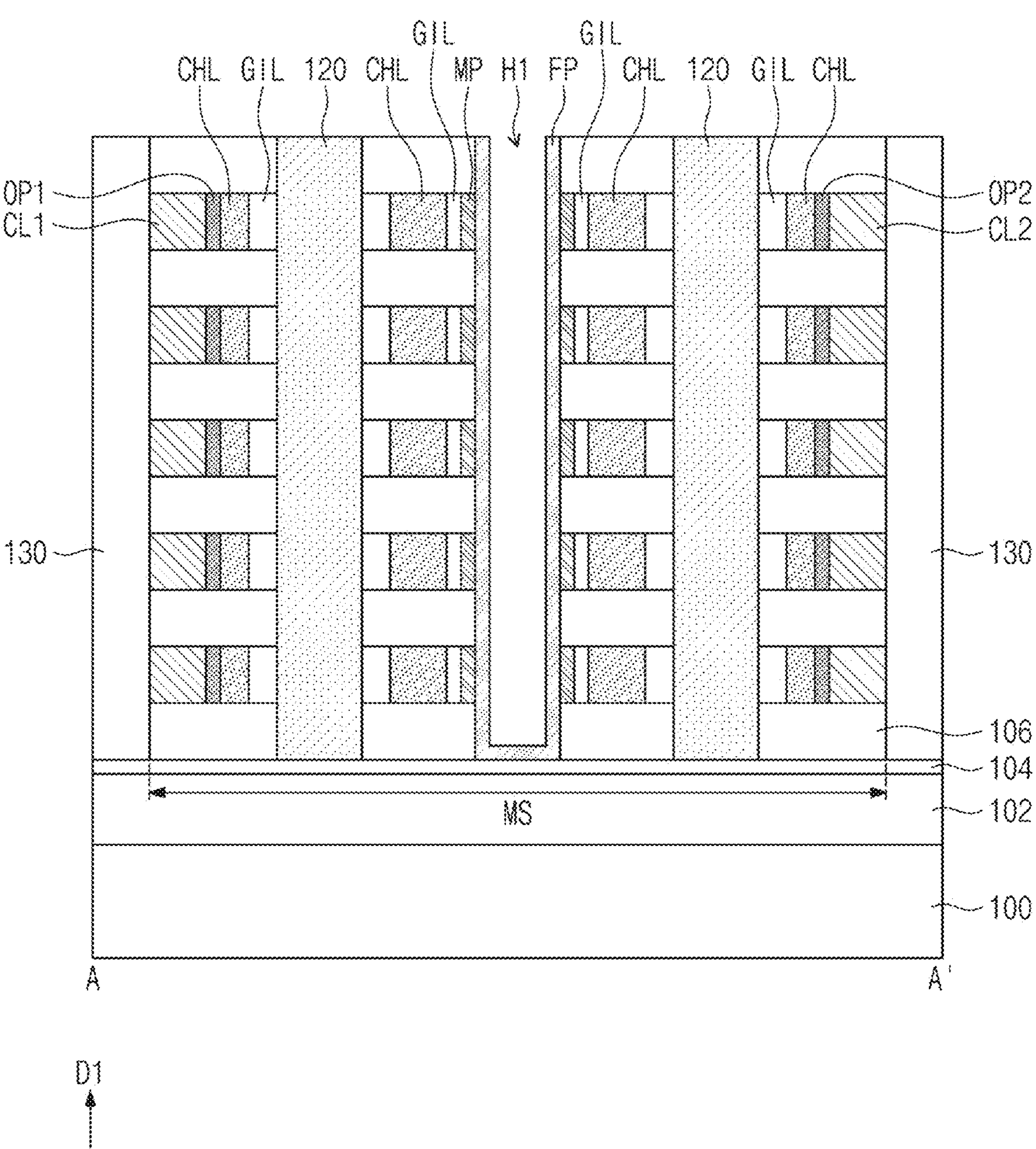

Referring to FIGS. 8A and 8B, the second sacrificial patterns 120 may be removed from the first holes H1. The first holes H1 may expose side surfaces of the gate insulating layer GIL. The exposed side surfaces of the gate insulating layer GIL may be laterally recessed, and thus, an empty region may be formed in each of the first recess regions R1 surrounding each of the first holes H1. A metal pattern MP may be formed to fill the empty region in each of the first recess regions R1. Forming the metal pattern MP may include, for example, forming a metal layer filling the empty region in each of the first recess regions R1 and partially filling each of the first holes H1, and removing the metal layer in the first holes H1.

A ferroelectric pattern FP may be formed in each of the first holes H1. The ferroelectric pattern FP may partially fill each of the first holes H1 and conformally cover inner surfaces of each of the first holes H1. The ferroelectric pattern FP may cover side surfaces of the metal pattern MP and side surfaces of the first insulating layers 106, and may cover an upper surface of the etch stop layer 104. Forming the ferroelectric pattern FP may include, for example, forming a ferroelectric layer conformally covering inner surfaces of each of the first holes H1 on the mold structure MS, and removing the ferroelectric layer from an upper surface of the mold structure MS.

Figure 9A:
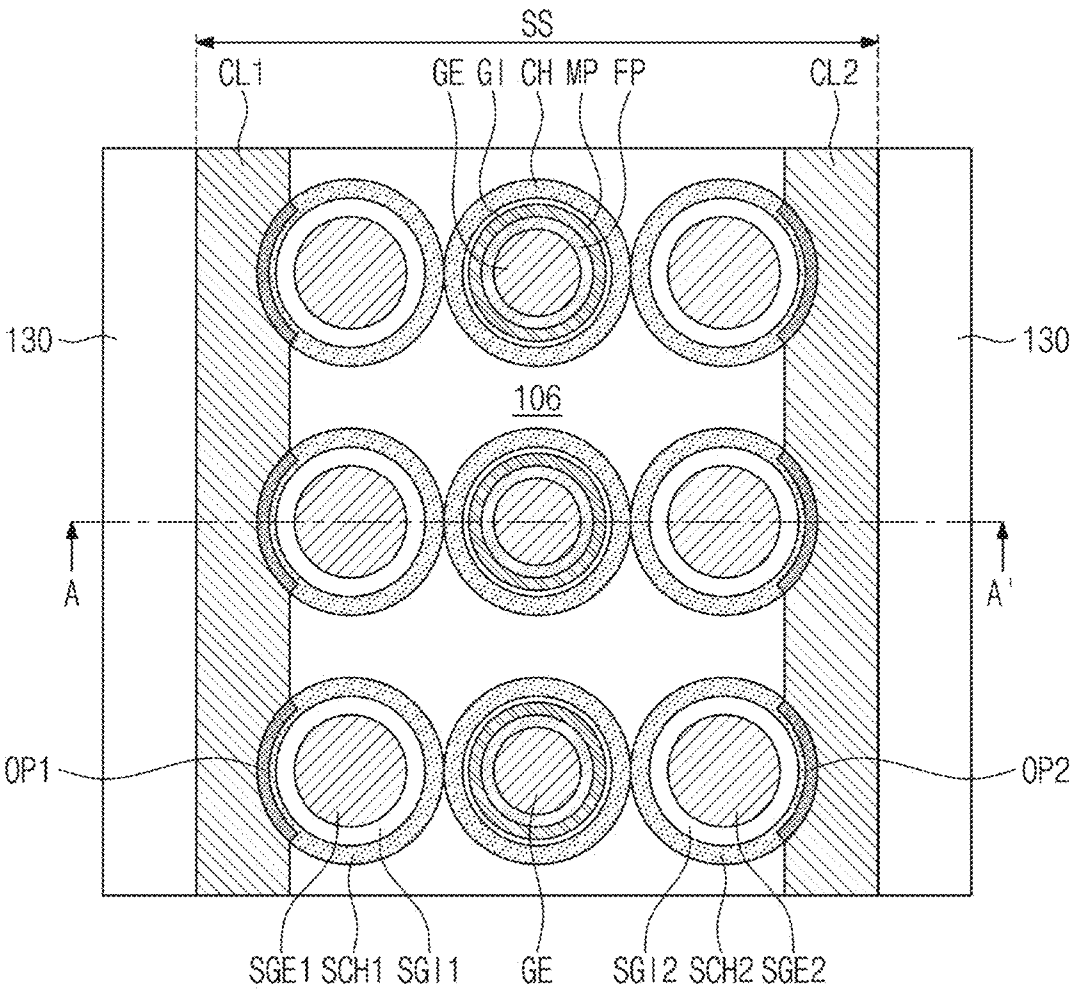
Figure 9A:
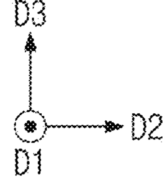
Figure 9B:
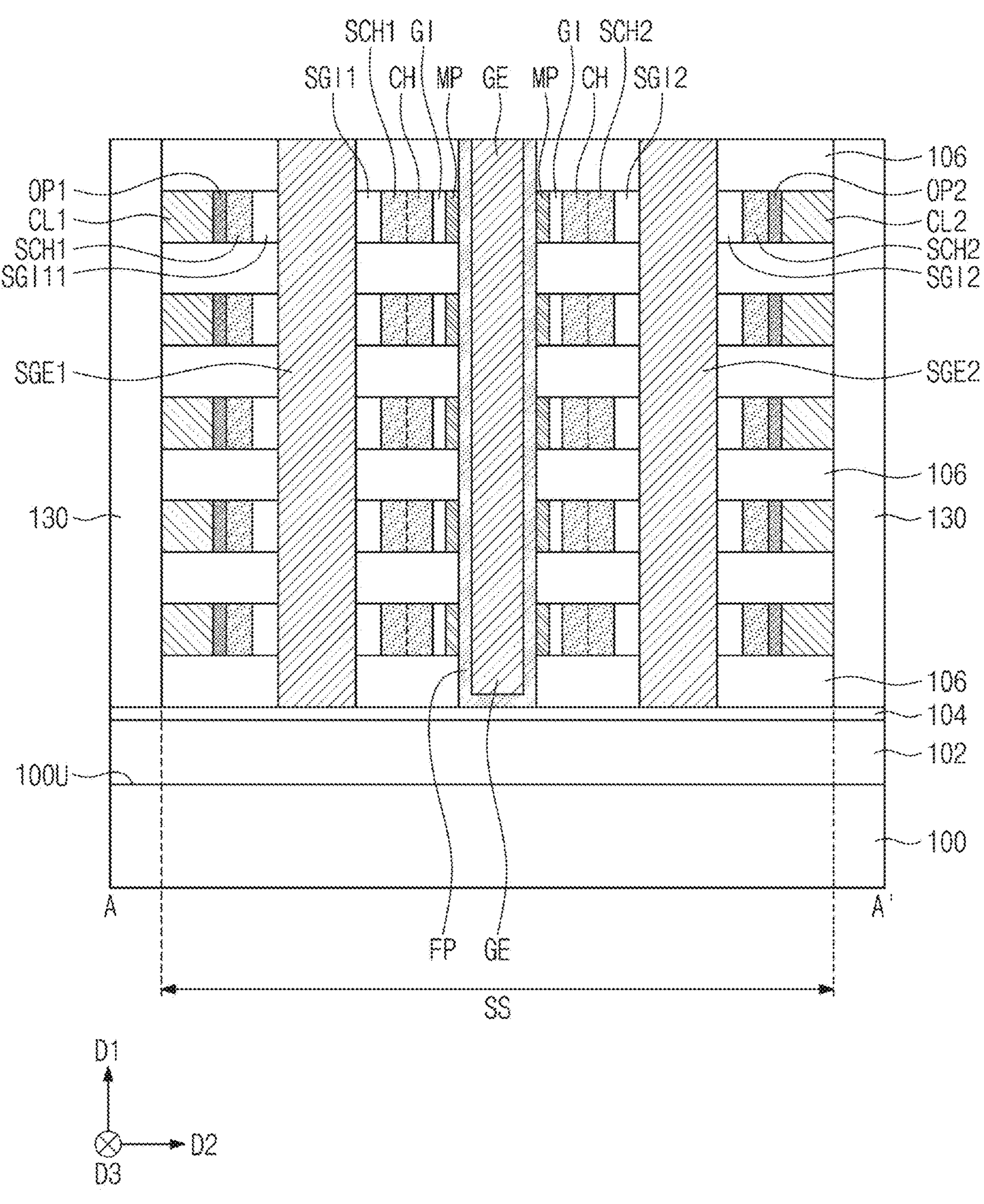

Referring to FIGS. 9A and 9B, the remainder of the second sacrificial patterns 120 may be removed from the second and third holes H2 and H3. Gate electrodes GE may be formed in the first holes H1, respectively. Each of the gate electrodes GE may be formed to fill the remainder of each of the first holes H1. First selection gate electrodes SGE1 may be respectively formed in the second holes H2, and second selection gate electrodes SGE2 may be formed in the third holes H3, respectively. Forming the gate electrodes GE and the first and second selection gate electrodes SGE1 and SGE2 may include, for example, forming a gate electrode layer on the mold structure MS to fill the remainder of each of the first holes H1 and to fill the second and third holes H2 and H3, and removing the gate electrode layer from the upper surface of the mold structure MS.

Portions of the channel layer CHL surrounding each of the gate electrodes GE may be referred to as channel patterns CH, and portions of the gate insulating layer GIL surrounding each of the gate electrodes GE may be referred to as gate insulating patterns GI. Portions of the channel layer CHL surrounding each of the first selection gate electrodes SGE1 may be referred to as first selection channel patterns SCH1, and portions of the gate insulating layer GIL surrounding each may be referred to as first selection gate insulating patterns SGI1. Portions of the channel layer CHL surrounding each of the second selection gate electrodes SGE2 may be referred to as second selection channel patterns SCH2, and portions of the gate insulating layer GIL surrounding each may be referred to as second selection gate insulating patterns SGI2. The first insulating layers 106 may be referred to as first insulating patterns 106.

The first and second conductive lines CL1 and CL2, the first and second impurity patterns OP1 and OP2, the first selection gate electrodes SGE1, the first selection channel patterns SCH1, the first selection gate insulating patterns SGI1, the gate electrodes GE, the channel patterns CH, the gate insulating patterns GI, the metal pattern MP, the ferroelectric pattern FP, the second selection gate electrodes SGE2, the second selection channel patterns SCH2, the second selection gate insulating patterns SGI2, and the first insulating patterns 106 may constitute a stacked structure SS.

Referring back to FIGS. 2A and 2B, an upper interlayer insulating layer 170 may be formed on the stacked structure SS and the sidewall insulating patterns 130. Upper conductive contacts 185 may be formed in the upper interlayer insulating layer 170. Each of the upper conductive contacts 185 may pass through the upper interlayer insulating layer 170, and may be electrically connected to a corresponding one of the gate electrodes GE and the first and second selection gate electrodes SGE1 and SGE2. Upper conductive lines 180 may be formed on the upper interlayer insulating layer 170, and each of the upper conductive contacts 185 may be electrically connected to a corresponding upper conductive line 180 among the upper conductive lines 180.

Figure 10:
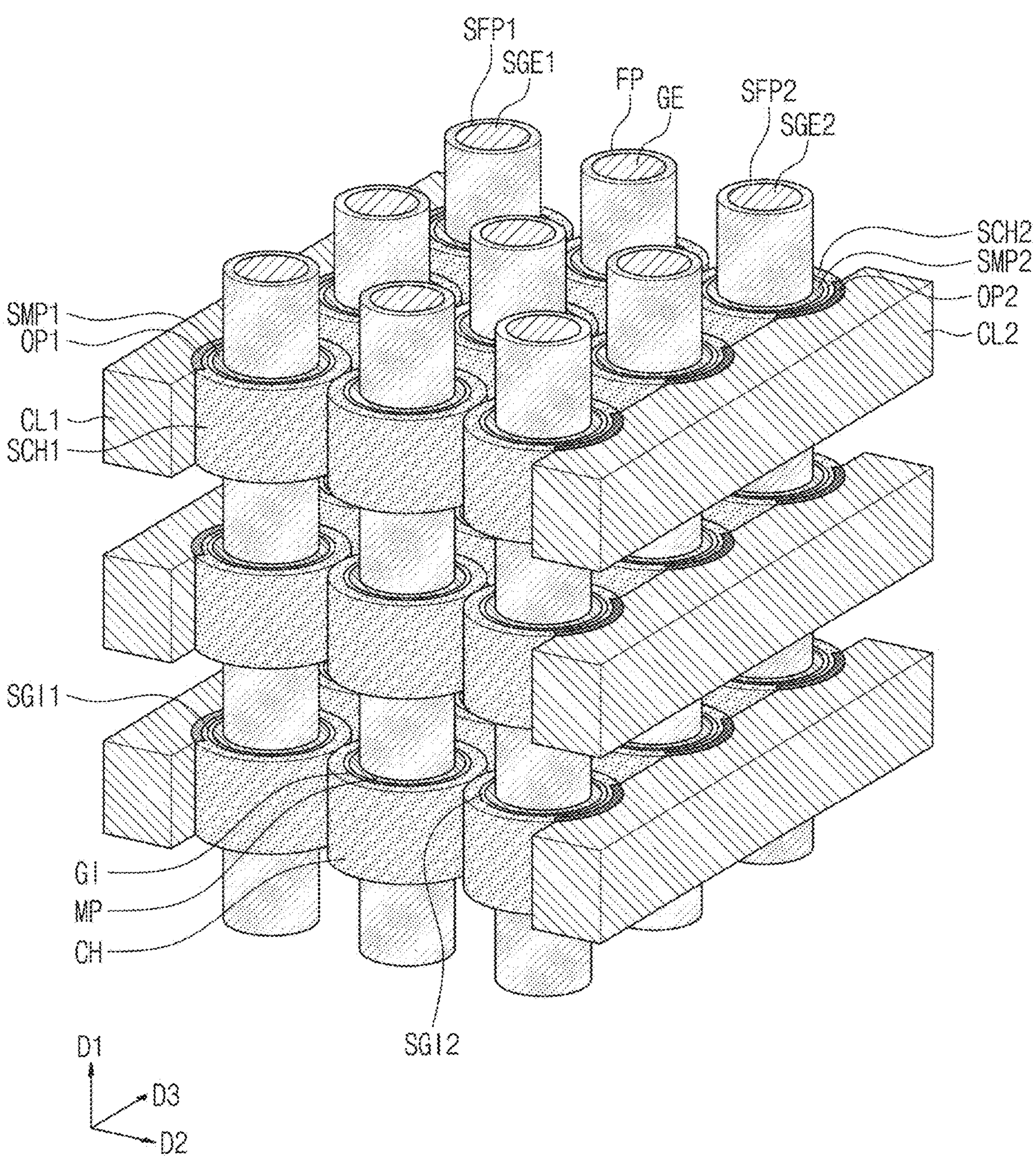
FIG. 10 is a schematic perspective view of a semiconductor device according to some embodiments of the present disclosure.
Figure 11A:
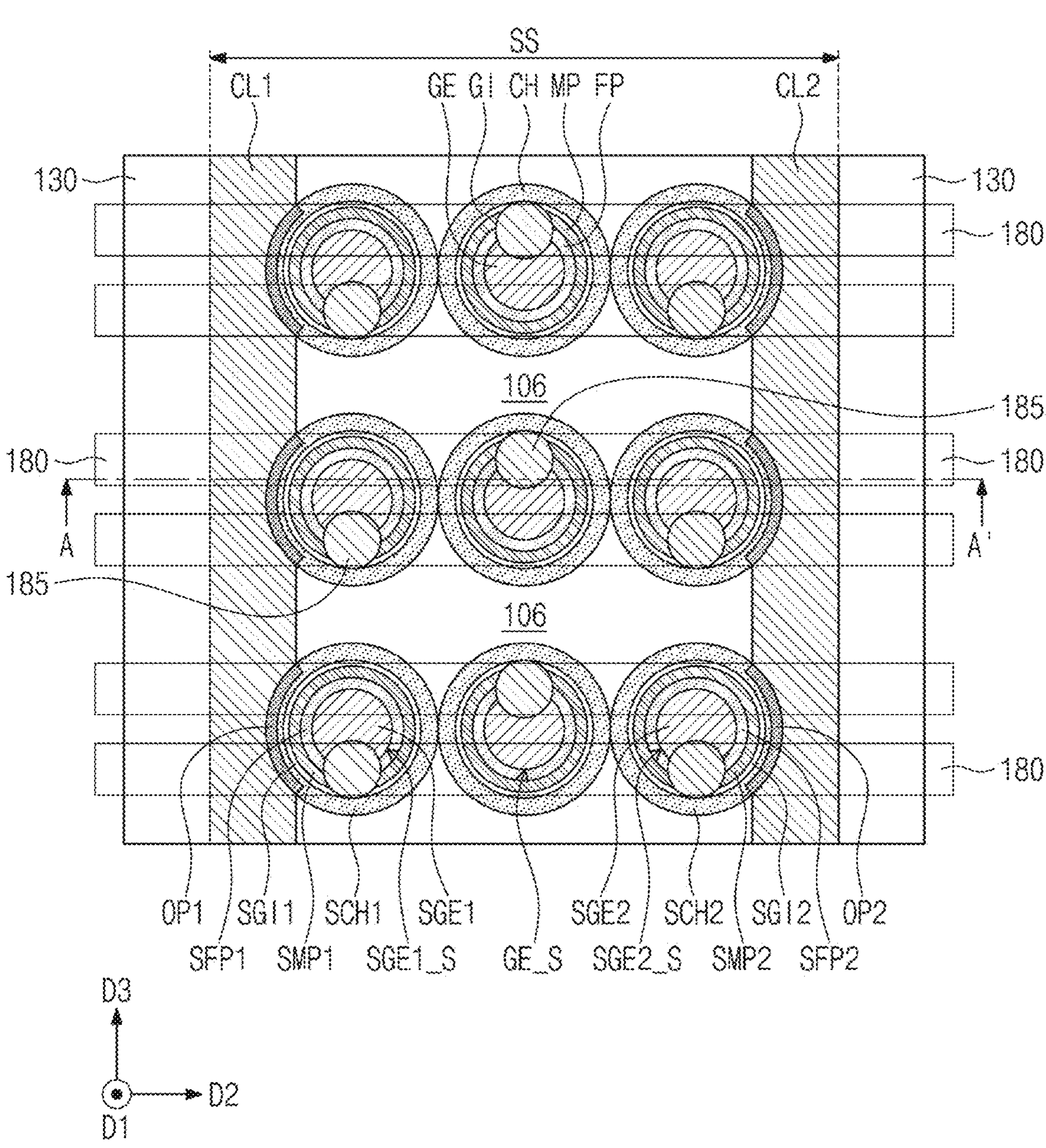
FIG. 11A is a plan view of a semiconductor device according to some embodiments of the present disclosure.
Figure 11B:
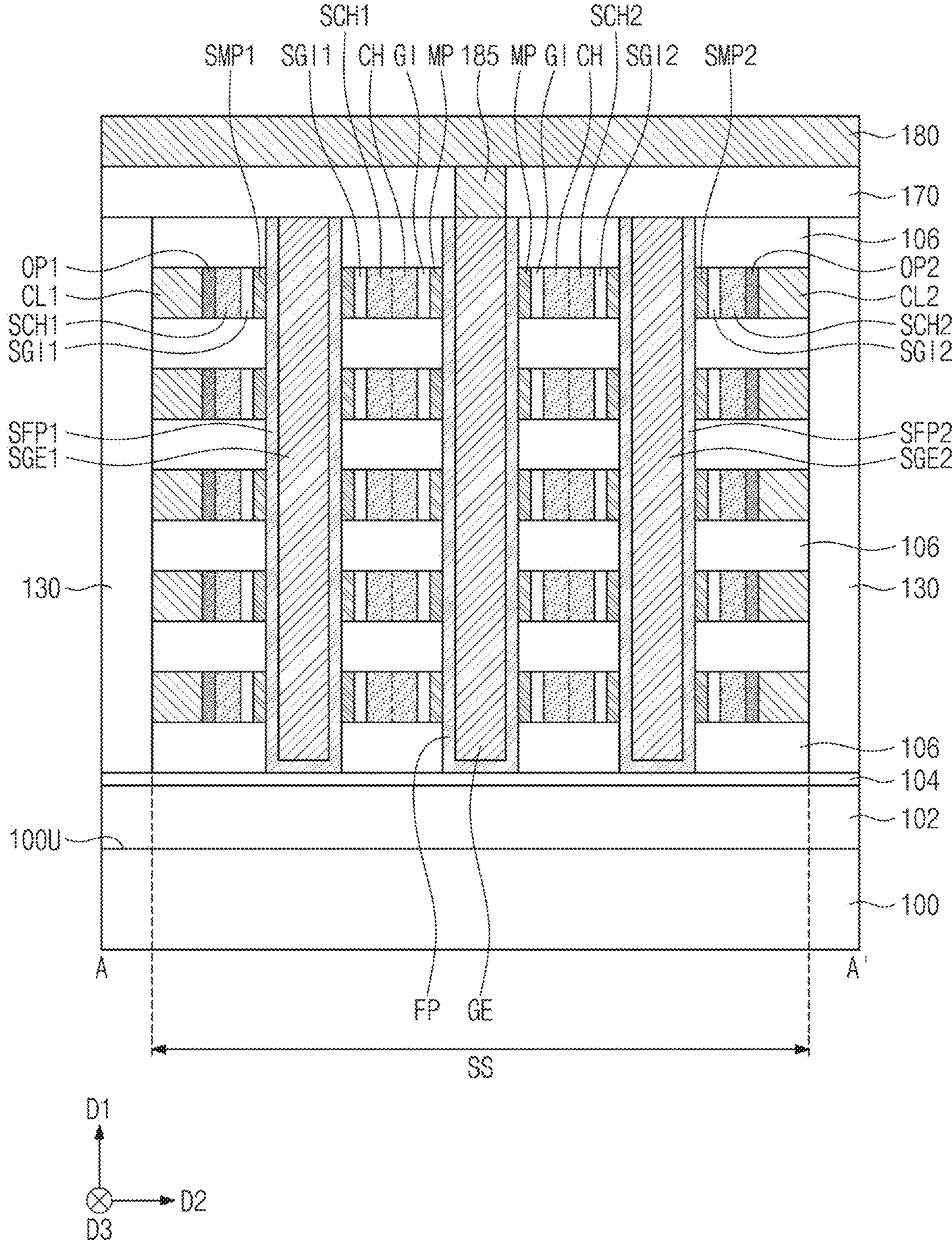
FIG. 11B is a cross-sectional view taken along line A-A' of FIG. 11A.

FIG. 10 is a schematic perspective view of a semiconductor device according to some embodiments of the present disclosure. FIG. 11A is a plan view of a semiconductor device according to some embodiments of the present disclosure, and FIG. 11B is a cross-sectional view taken along line A-A' of FIG. 11A. For simplicity of description, differences from the semiconductor device described with reference to FIGS. 1, 2A, and 2B will be mainly described.

Referring to FIGS. 10, 11A and 11B, the stacked structure SS may further include a first selection ferroelectric pattern SFP1 between each of the plurality of first selection channel patterns SCH1 and the corresponding first selection gate electrode SGE1, and a first selection metal pattern SMP1 between each of the plurality of first selection channel patterns SCH1 and the first selection ferroelectric pattern SFP1. The first selection gate insulating pattern SGI1 may be interposed between each of the plurality of first selection channel patterns SCH1 and the first selection metal pattern SMP1. The first selection ferroelectric pattern SFP1 may surround the side surface SGE1_S of the corresponding first selection gate electrode SGE1, and may extend between each of the first insulating patterns 106 and the corresponding first selection gate electrode SGE1. The first selection metal pattern SMP1 may be spaced apart from the corresponding side surface SGE1_S of the first selection gate electrode SGE1 with the first selection ferroelectric pattern SFP1 interposed therebetween. The first selection gate insulating pattern SGI1 may be spaced apart from the side surface SGE1_S of the corresponding first selection gate electrode SGE1 with the first selection ferroelectric pattern SFP1 and the first selection metal pattern SMP1 therebetween.

The stacked structure SS may further include a second selection ferroelectric pattern SFP2 between each of the plurality of second selection channel patterns SCH2 and the corresponding second selection gate electrode SGE2, and a second selection metal pattern SMP2 between each of the plurality of second selection channel patterns SCH2 and the second selection ferroelectric pattern SFP2. The second selection gate insulating pattern SGI2 may be interposed between each of the plurality of second selection channel patterns SCH2 and the second selection metal pattern SMP2. The second selection ferroelectric pattern SFP2 may surround a side surface SGE2_S of the corresponding second selection gate electrode SGE2, and may extend between each of the first insulating patterns 106 and the corresponding second selection gate electrode SGE2. The second selection metal pattern SMP2 may be spaced apart from the side surface SGE2_S of the corresponding second selection gate electrode SGE2 with the second selection ferroelectric pattern SFP2 interposed therebetween. The second selection gate insulating pattern SGI2 may be spaced apart from the side surface SGE2_S of the corresponding second selection gate electrode SGE2 with the second selection ferroelectric pattern SFP2 and the second selection metal pattern SMP2 interposed therebetween.

The first and second selection ferroelectric patterns SFP1 and SFP2 may include the same material as the ferroelectric pattern FP, and the first and second selection metal patterns SMP1 and SMP2 may include the same material as the metal pattern MP. According to some embodiments, the first and second selection metal patterns SMP1 and SMP2 may be omitted.

According to some embodiments, the corresponding first selection gate electrode SGE1, each of the plurality of first selection channel patterns SCH1, the first selection ferroelectric pattern SFP1 interposed between each of the plurality of first selection channel patterns SCH1 and the corresponding first selection gate electrode SGE1, the first selection metal pattern SMP1, and the first selection gate insulating pattern SGI1 may constitute a first selection transistor. The corresponding second selection gate electrode SGE2, each of the plurality of second selection channel patterns SCH2, the second selection ferroelectric pattern SFP2 interposed between each of the plurality of second selection channel patterns SCH2 and the corresponding second selection gate electrode SGE2, the second selection metal pattern SMP2, and the second selection gate insulating pattern SGI2 may constitute a second selection transistor.

According to some embodiments, each of the first conductive lines CL1 may be disposed between the first insulating patterns 106. The first insulating patterns 106 may extend, in the second direction D2, between the first impurity patterns OP1, between the first selection channel patterns SCH1, between first selection gate insulating patterns SGI1 spaced apart from each other in the first direction D1, and between first selection metal patterns SMP1 spaced apart from each other in the first direction D1. The first insulating patterns 106 may surround each side surface SGE1_S of the first selection gate electrodes SGE1. The first selection ferroelectric pattern SFP1 may extend between each of the first selection gate electrodes SGE1 and each of the first insulating patterns 106. The first insulating patterns 106 may be in contact with side surfaces of the first selection ferroelectric pattern SFP1.

The first insulating patterns 106 may extend, in the second direction D2, between the plurality of channel patterns CH, between the gate insulating patterns GI spaced apart from each other in the first direction D1, and between metal patterns MP spaced apart from each other in the first direction D1. The first insulating patterns 106 may surround each of the side surfaces GE_S of the gate electrodes GE. The ferroelectric pattern FP may extend between each of the gate electrodes GE and each of the first insulating patterns 106. The first insulating patterns 106 may contact side surfaces of the ferroelectric pattern FP.

The first insulating patterns 106 may extend, in the second direction D2, between the second selection channel patterns SCH2, between the first selection gate insulating patterns SGI1 spaced apart from each other in the first direction D1, and between the second selection metal patterns SMP2 spaced apart from each other in the first direction DL. The first insulating patterns 106 may surround each of the side surfaces SGE2 of the second selection gate electrodes SGE2. The second selection ferroelectric pattern SFP2 may extend between each of the second selection gate electrodes SGE2 and each of the first insulating patterns 106. The first insulating patterns 106 may be in contact with side surfaces of the second selection ferroelectric pattern SFP2. The first insulating patterns 106 may further extend between the second impurity patterns OP2 and between the second conductive lines CL2 in the second direction D2.

Except for the above-described difference, the semiconductor device according to the present embodiments is substantially the same as the semiconductor device described with reference to FIGS. 1, 2A, and 2B.

Figure 12A:
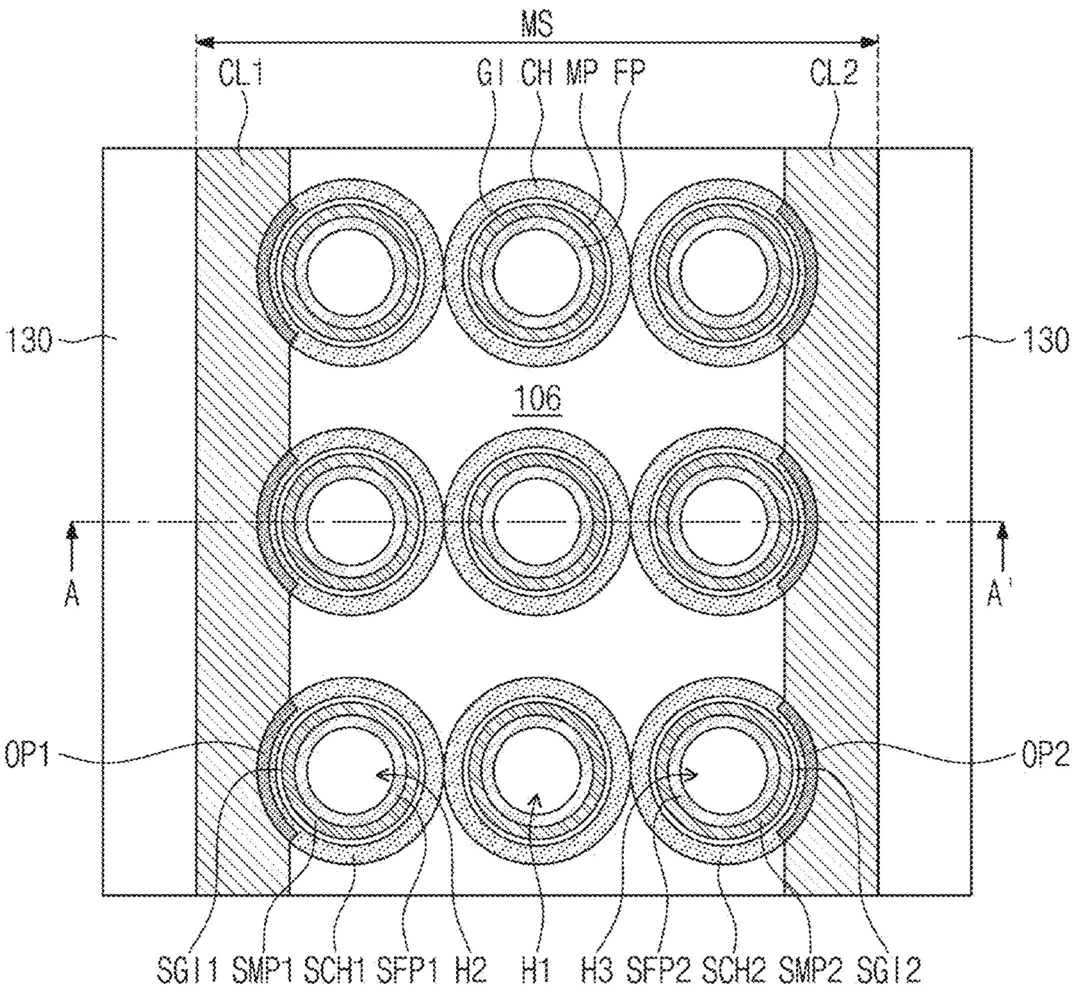
FIG. 12A is a plan view illustrating a method of manufacturing a semiconductor device according to some embodiments of the present disclosure.
Figure 12A:
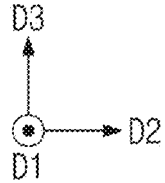
Figure 12B:
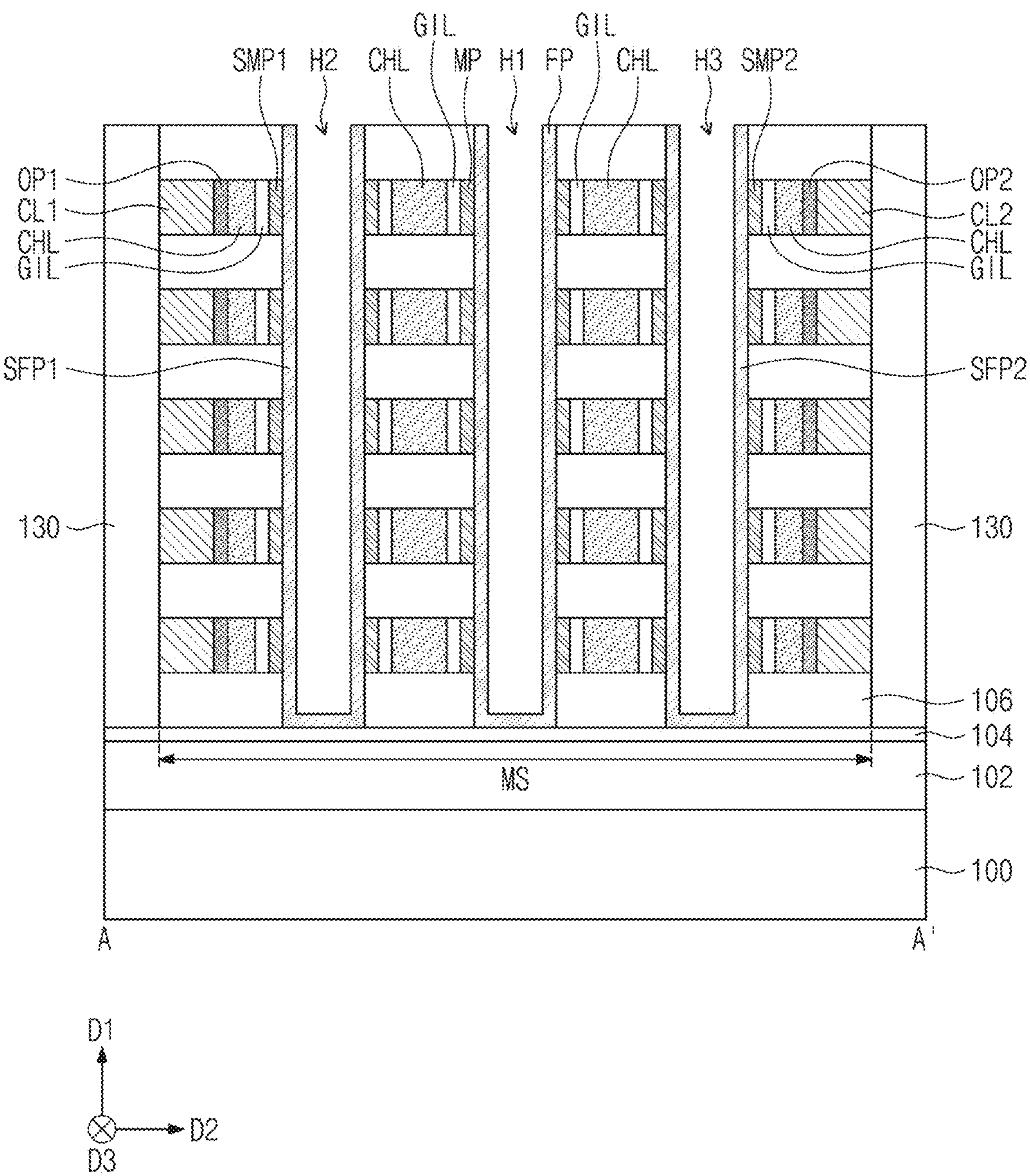
FIG. 12B is a cross-sectional view taken along line A-A' of FIG. 12A.

FIG. 12A is a plan view illustrating a method of manufacturing a semiconductor device according to some embodiments of the present disclosure, and FIG. 12B is a cross-sectional view taken along line A-A' of FIG. 12A. For simplicity of explanation, differences from the manufacturing method of the semiconductor device described with reference to FIGS. 3A to 9A and 3B to 9B will be mainly described.

First, as described with reference to FIGS. 3A to 7A and 3B and 7B, the first conductive lines CL1, the first impurity patterns OP1, and the second conductive lines CL2, and the second impurity patterns OP2 may be formed in the second recess regions R2, and the sidewall insulating patterns 130 may be formed in the first trenches T1, respectively.

Referring to FIGS. 12A and 12B, the second sacrificial patterns 120 may be removed from the first to third holes H1, H2, and H3. The first to third holes H1, H2, and H3 may expose side surfaces of the gate insulating layer GIL. The exposed side surfaces of the gate insulating layer GIL may be laterally recessed. Accordingly, a first empty region may be formed in each of the first recess regions R1 surrounding the first holes H1, a second region may be formed in each of the first recess regions R1 surrounding the second holes H2, and a third empty region may be formed in each of the first recess areas R1 surrounding the third holes H3. The metal pattern MP, the first selection metal pattern SMP1, and the second selection metal pattern SMP2 may be formed to fill the first empty region, the second empty region, and the third empty region, respectively.

A ferroelectric pattern FP may be formed in each of the first holes H1. The ferroelectric pattern FP may partially fill each first hole H1 and conformally cover an inner surface of each first hole H1. The ferroelectric pattern FP may cover side surfaces of the metal pattern MP and side surfaces of the first insulating layers 106, and may cover an upper surface of the etch stop layer 104. A first selection ferroelectric pattern SFP1 may be formed in each of the second holes H2. The first selection ferroelectric pattern SFP1 may partially fill each second hole H2 and conformally cover an inner surface of each second hole H2. The first selection ferroelectric pattern SFP1 may cover side surfaces of the first selection metal pattern SMP1 and side surfaces of the first insulating layers 106 and may cover an upper surface of the etch stop layer 104. A second selection ferroelectric pattern SFP2 may be formed in each of the third holes H3. The second selection ferroelectric pattern SFP2 may partially fill each third hole H3 and conformally cover an inner surface of each third hole H3. The second selection ferroelectric pattern SFP2 may cover the side surfaces of the second selection metal pattern SMP2 and the side surfaces of the first insulating layers 106, and may cover the upper surface of the etch stop layer 104.

Forming the ferroelectric pattern FP and the first and second selection ferroelectric patterns SFP1 and SFP2 may include, for example, forming a ferroelectric layer conformally covering inner surfaces of each of the first to third holes H1, H2, and H3 on the mold structure MS, and removing the ferroelectric layer from the upper surface of the mold structure MS.

Then, as described with reference to FIGS. 9A and 9B, the gate electrode GE, the first selection gate electrode SGE1, and the second selection gate electrode SGE2 may be formed in the first to third holes H1, H2, and H3, respectively.

Except for the above-mentioned differences, the method of manufacturing a semiconductor device according to the present embodiments is substantially the same as the method of manufacturing a semiconductor device described with reference to FIGS. 3A to 9A and 3B to 9B.

Figure 13:
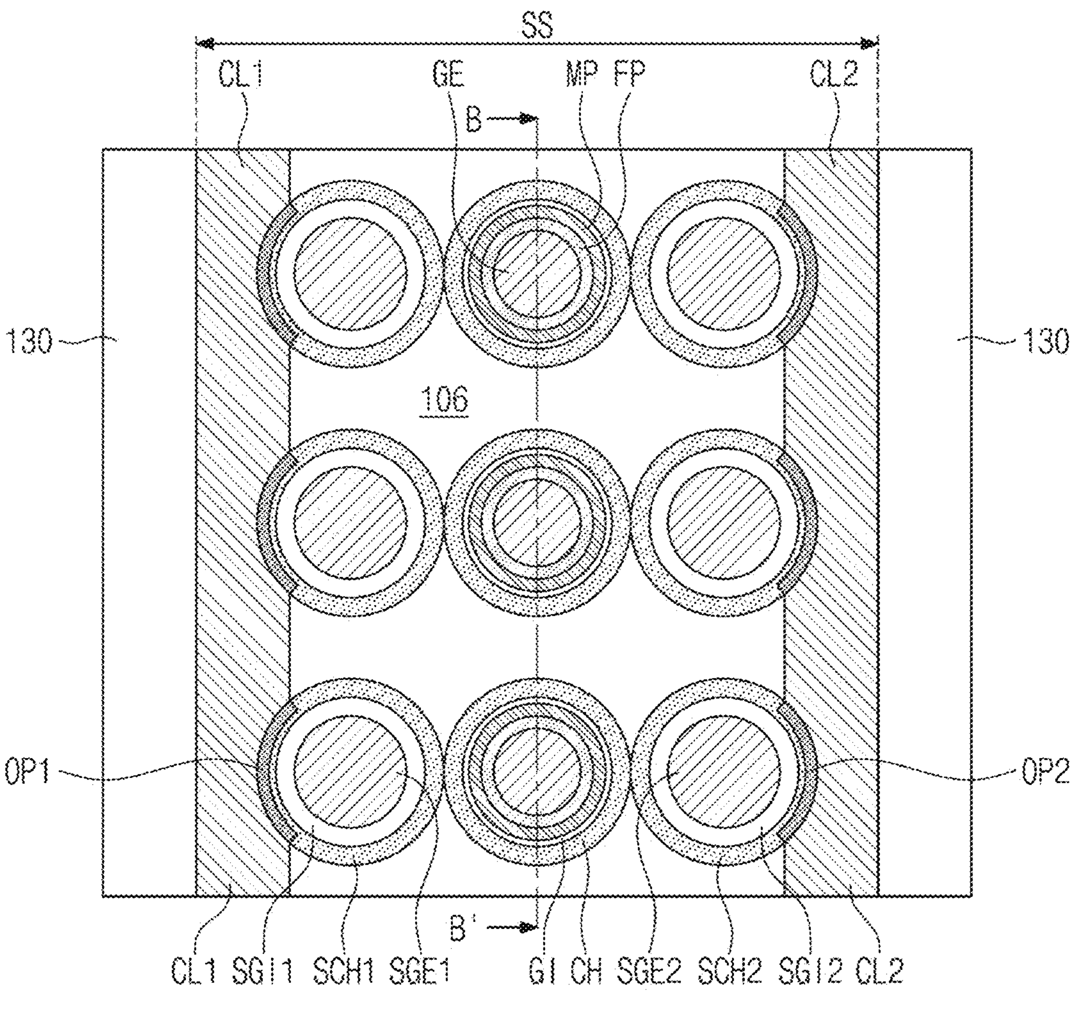
FIG. 13 is a plan view of a semiconductor device according to some embodiments of the present disclosure.
Figure 13:
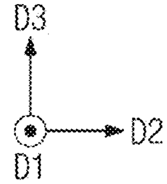
Figure 14A:
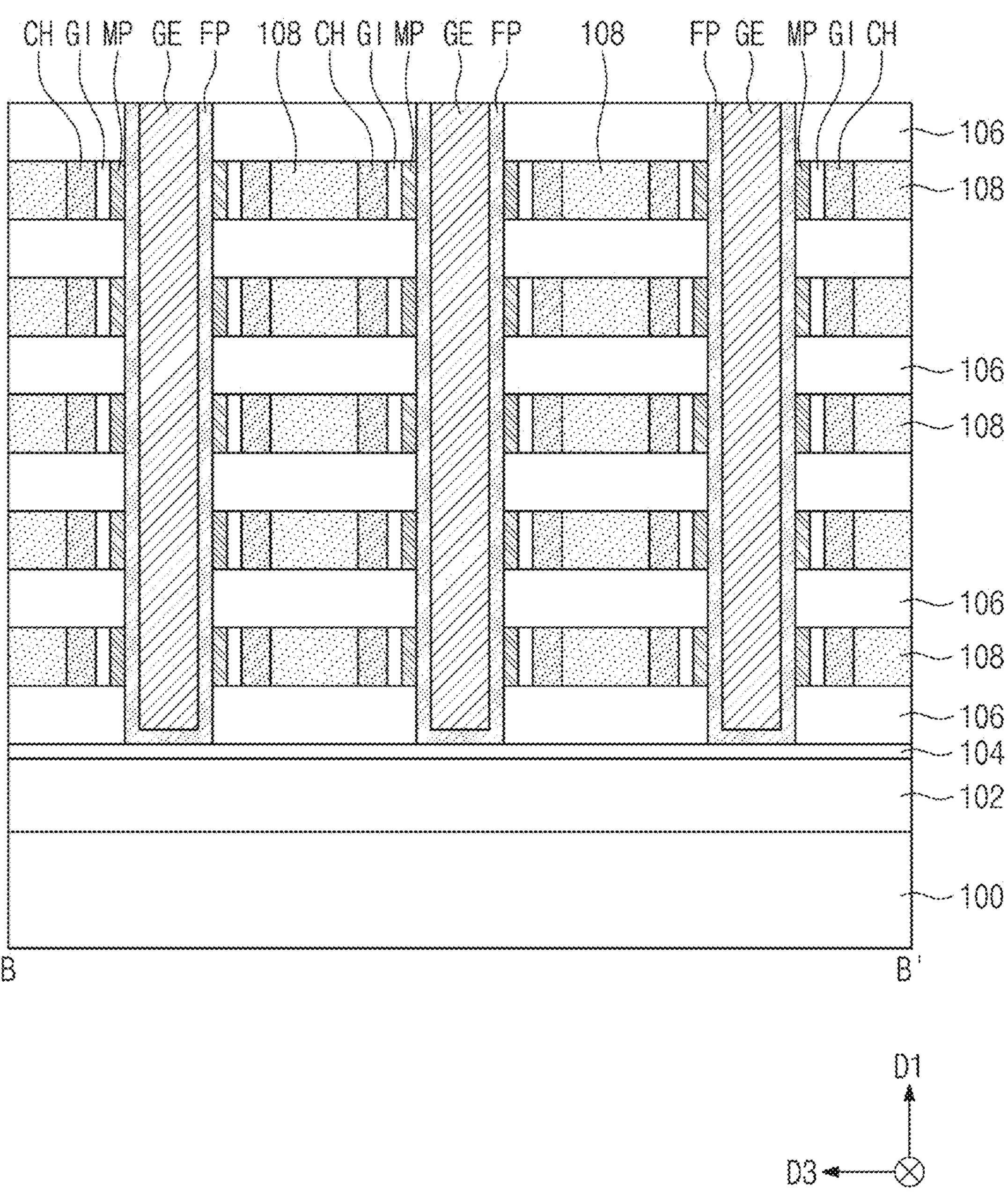
FIGS. 14A and 14B are cross-sectional views taken along B-B' of FIG. 13, respectively.

FIG. 13 is a plan view of a semiconductor device according to some embodiments of the present disclosure, and FIGS. 14A and 4B are cross-sectional views taken along B-B' of FIG. 13, respectively. For simplicity of description, differences from the semiconductor device described with reference to FIGS. 1, 2A, and 2B will be mainly described.

Referring to FIGS. 13 and 14A, according to some embodiments, the stacked structure SS may further include second insulating patterns 108 interposed between channel patterns CH neighboring each other in the third direction D3, between first selection channel patterns SCH1 neighboring each other in the third direction D3, and between second selection channel patterns SCH2 neighboring each other in the third direction D3. The neighboring channel patterns CH may be electrically separated (or insulated) from each other by the second insulating patterns 108, and the neighboring first selection channel patterns SCH1 may be electrically separated (or insulated) from each other by the second insulating patterns 108. The neighboring second selection channel patterns SCH2 may be electrically separated (or insulated) from each other by the second insulating patterns 108. The second insulating patterns 108 may be interposed between the first conductive lines CL1 and the second conductive lines CL2 and may be interposed between the first insulating patterns 106. The second insulating patterns 108 may include a material different from that of the first insulating patterns 106. For example, the first insulating patterns 106 may include silicon oxide, and the second insulating patterns 108 may include silicon nitride.

Figure 14B:
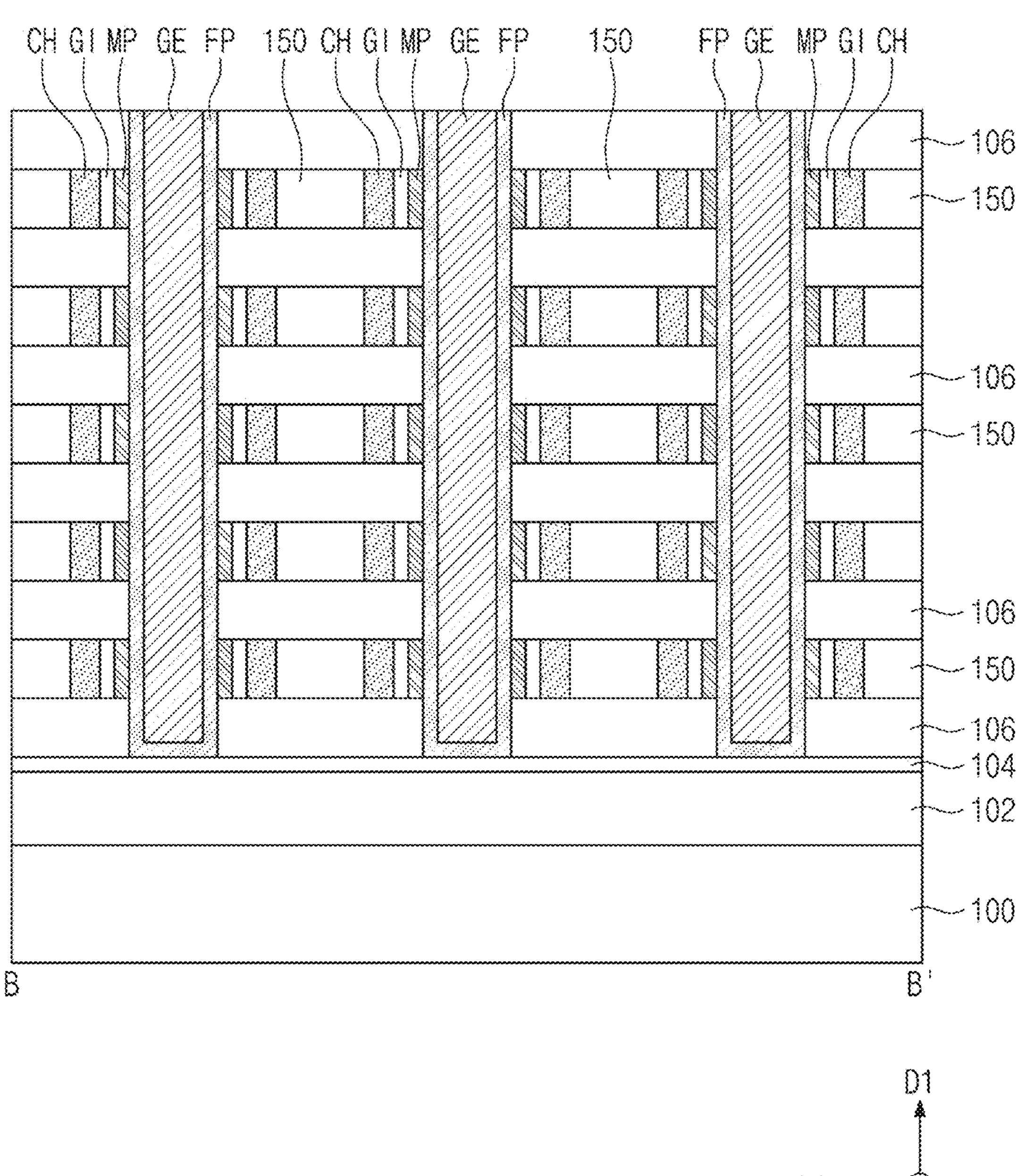

Referring to FIGS. 13 and 14B, according to other embodiments, the stacked structure SS may further include third insulating patterns 150 interposed between channel patterns CH neighboring each other in the third direction D3, between first selection channel patterns SCH1 neighboring each other in the third direction D3, and between second selection channel patterns SCH2 neighboring each other in the third direction D3. The neighboring channel patterns CH may be electrically separated (or insulated) from each other by the third insulating patterns 150, the neighboring first selection channel patterns SCH1 may be electrically separated (or insulated) from each other by the third insulating patterns 150. The neighboring second selection channel patterns SCH2 may be electrically separated (or insulated) from each other by the third insulating patterns 150. The third insulating patterns 150 may be interposed between the first conductive lines CL1 and the second conductive lines CL2 and may be interposed between the first insulating patterns 106. For example, the third insulating patterns 150 may include the same material as the first insulating patterns 106. The first insulating patterns 106 and the third insulating patterns 150 may include, for example, silicon oxide. As another example, the third insulating patterns 150 may be air gaps.

Figure 15:
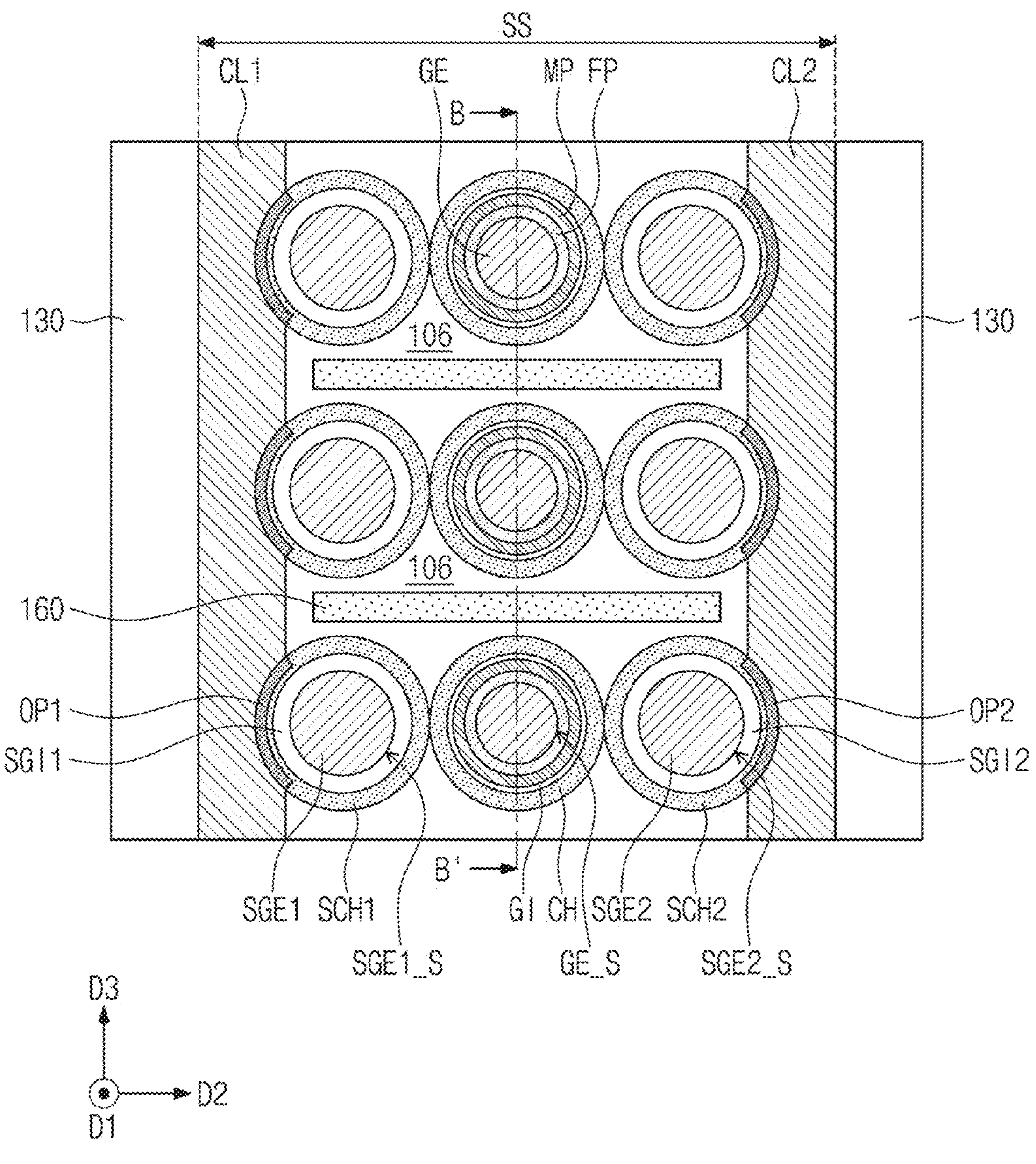
FIG. 15 is a plan view of a semiconductor device according to some embodiments of the present disclosure.
Figure 16:
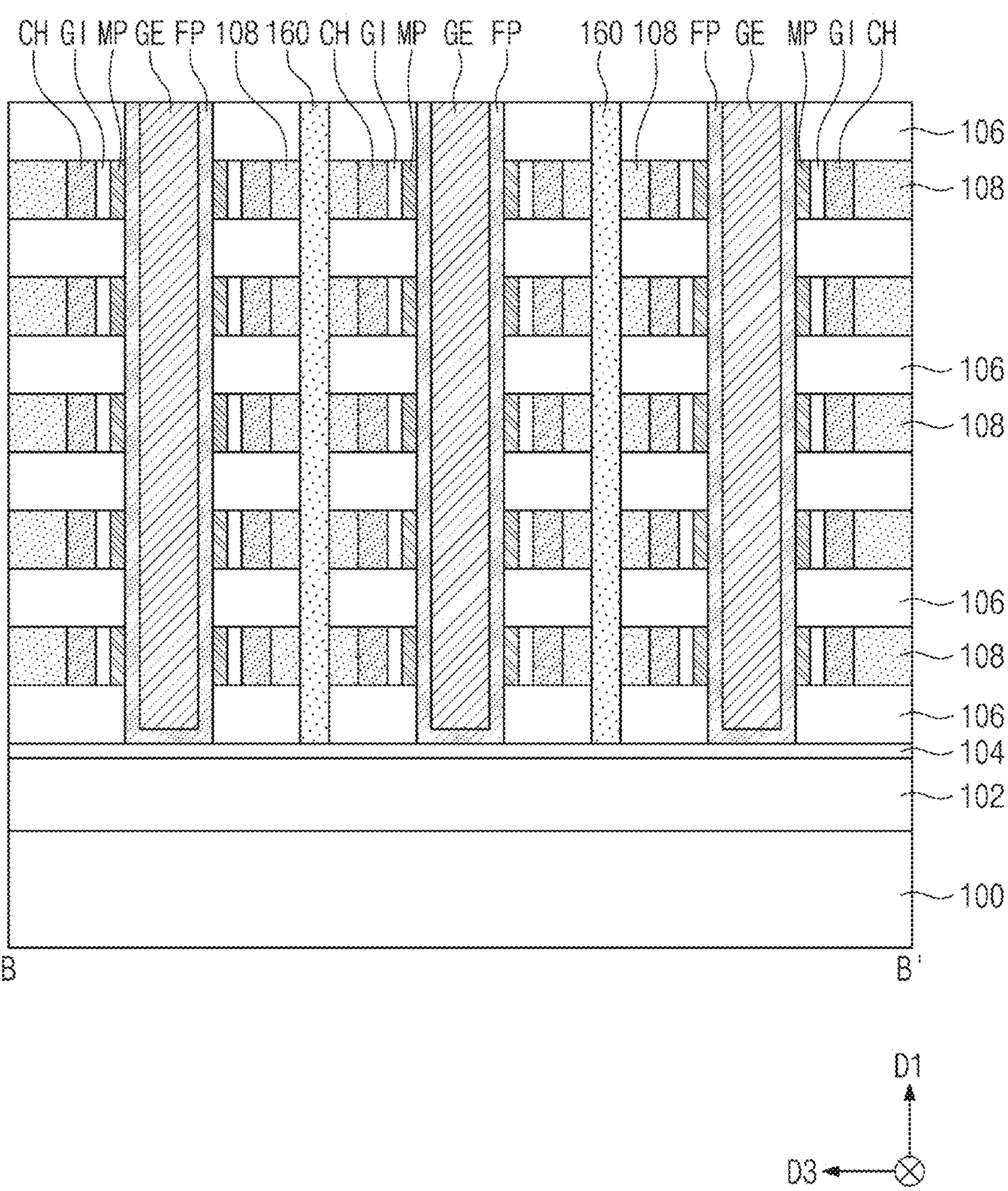
FIG. 16 is a cross-sectional view taken along line B-B' of FIG. 15.

FIG. 15 is a plan view of a semiconductor device according to some embodiments of the present disclosure, and FIG. 16 is a cross-sectional view taken along line B-B' of FIG. 15. For simplicity of description, differences from the semiconductor device described with reference to FIGS. 1, 2A, and 2B will be mainly described.

Referring to FIGS. 15 and 16, the stacked structure SS may further include shielding lines 160 disposed between the first conductive lines CL1 and the second conductive lines CL2. The shielding lines 160 may be interposed between the gate electrodes GE, and the shielding lines 160 and the gate electrodes GE may be alternately disposed in the third direction D3. The shielding lines 160 may extend parallel to the gate electrodes GE in the first direction D1. The shielding lines 160 may extend between the first selection gate electrodes SGE1 and between the second selection gate electrodes SGE2 in the second direction D2.

The shielding lines 160 may be interposed between channel patterns CH neighboring each other in the third direction D3, and may extend in the second direction D2, between first selection channel patterns SCH1 neighboring each other in the third direction D3 and between second selection channel patterns SCH2 neighboring each other in the third direction D3.

The stacked structure SS may further include second insulating patterns 108 interposed between channel patterns CH neighboring each other in the third direction D3, between first selection channel patterns SCH1 neighboring each other in the third direction D3, and between second selection channel patterns SCH2 neighboring each other in the third direction D3. The second insulating patterns 108 are substantially the same as the second insulating patterns 108 described with reference to FIGS. 13 and 14A. According to some embodiments, each of the shielding lines 160 may extend in the first direction D1 and may pass through the first insulating patterns 106 and the second insulating patterns 108.

The shielding lines 160 may include metal, and a ground voltage may be applied to the shielding lines 160. The shielding lines 160 may be used to block electrical interference between the gate electrodes GE, between channel patterns CH neighboring each other in the third direction D3, between the first selection gate electrodes SGE1, between first selection channel patterns SCH1 neighboring each other in the third direction D3, between the second selection gate electrodes SGE2, and between the second selection channel patterns SCH2 neighboring each other in the third direction D3.

Figure 17:
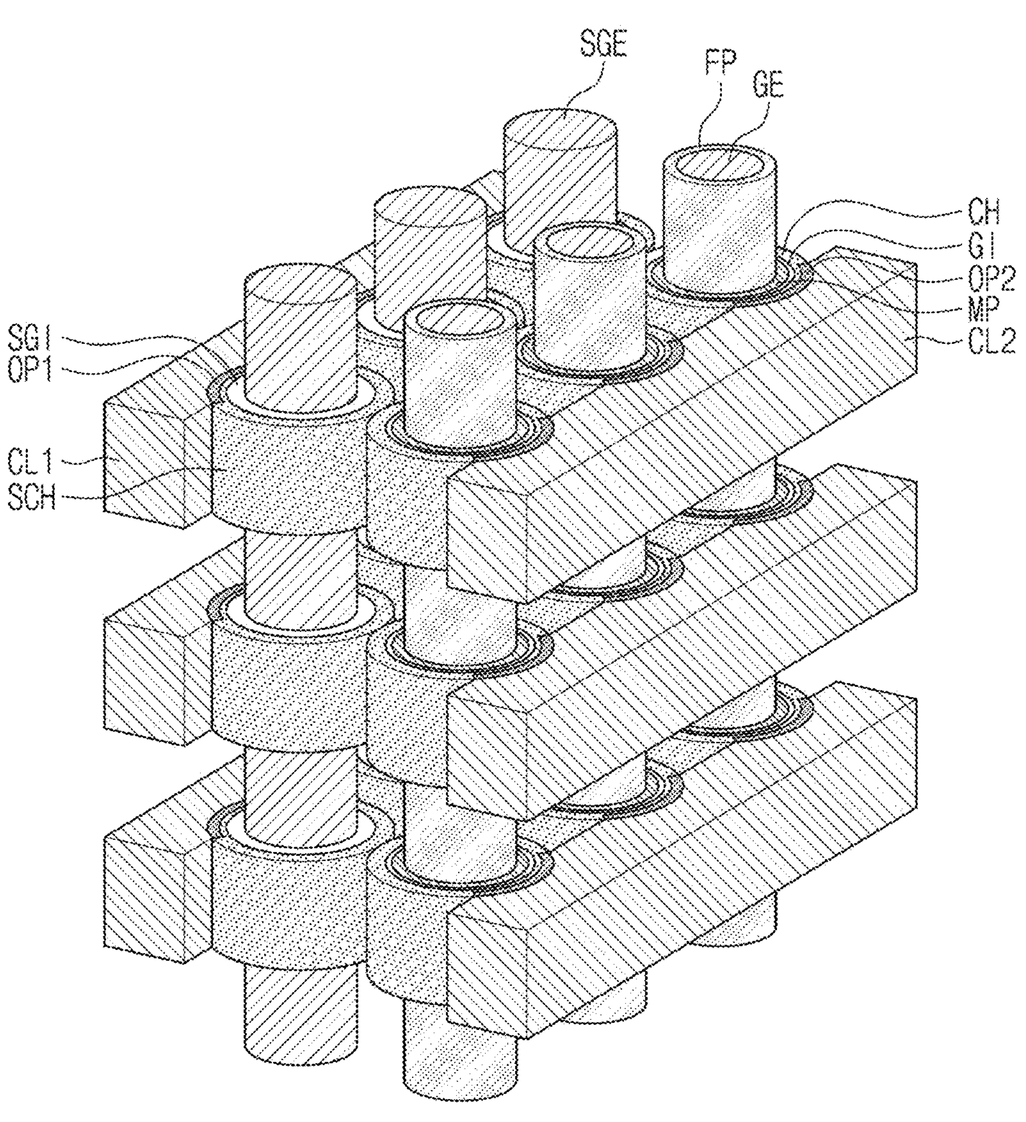
FIG. 17 is a schematic perspective view of a semiconductor device according to some embodiments of the present disclosure.
Figure 17:
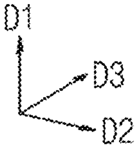
Figure 18A:
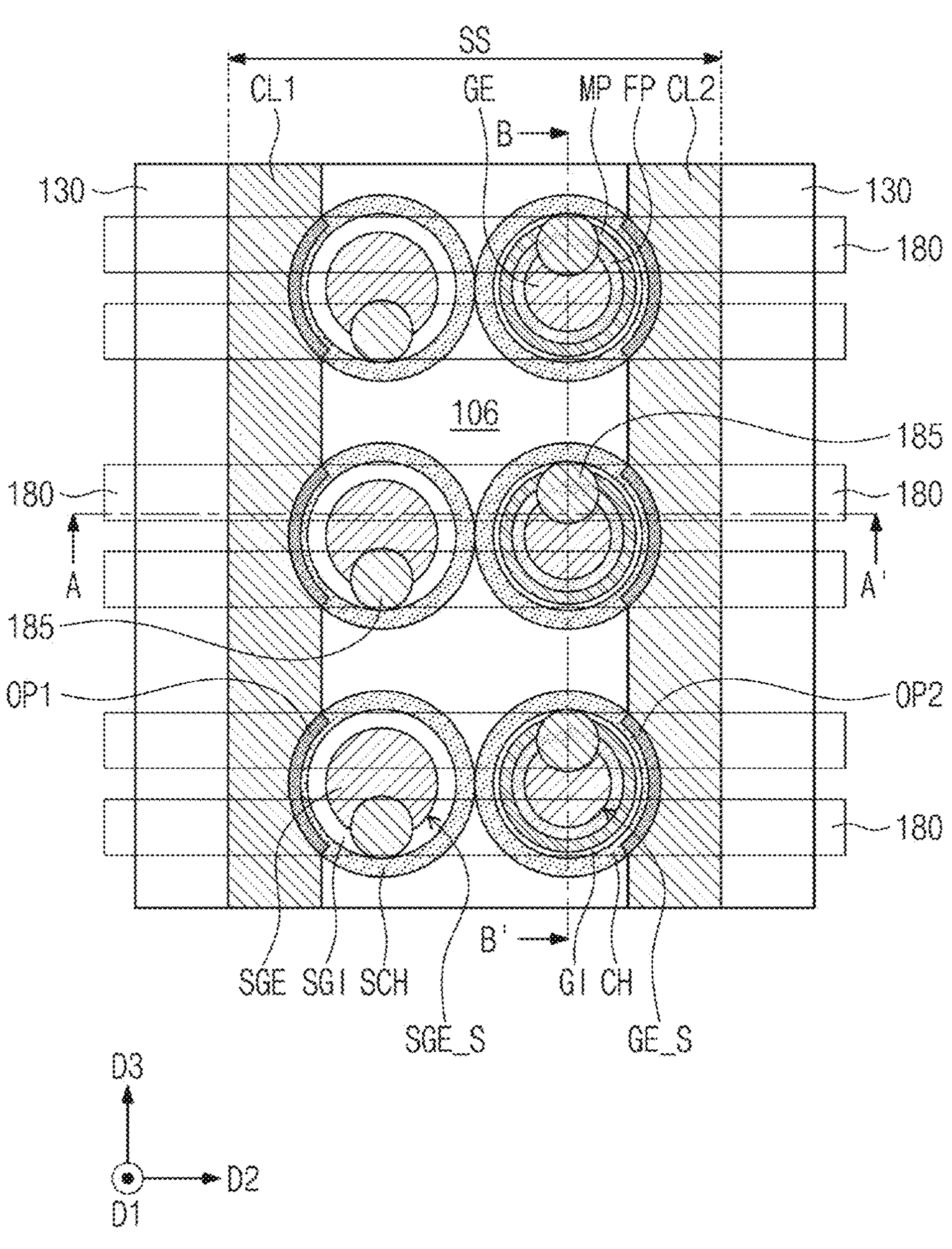
FIG. 18A is a plan view of a semiconductor device according to some embodiments of the present disclosure.
Figure 18B:
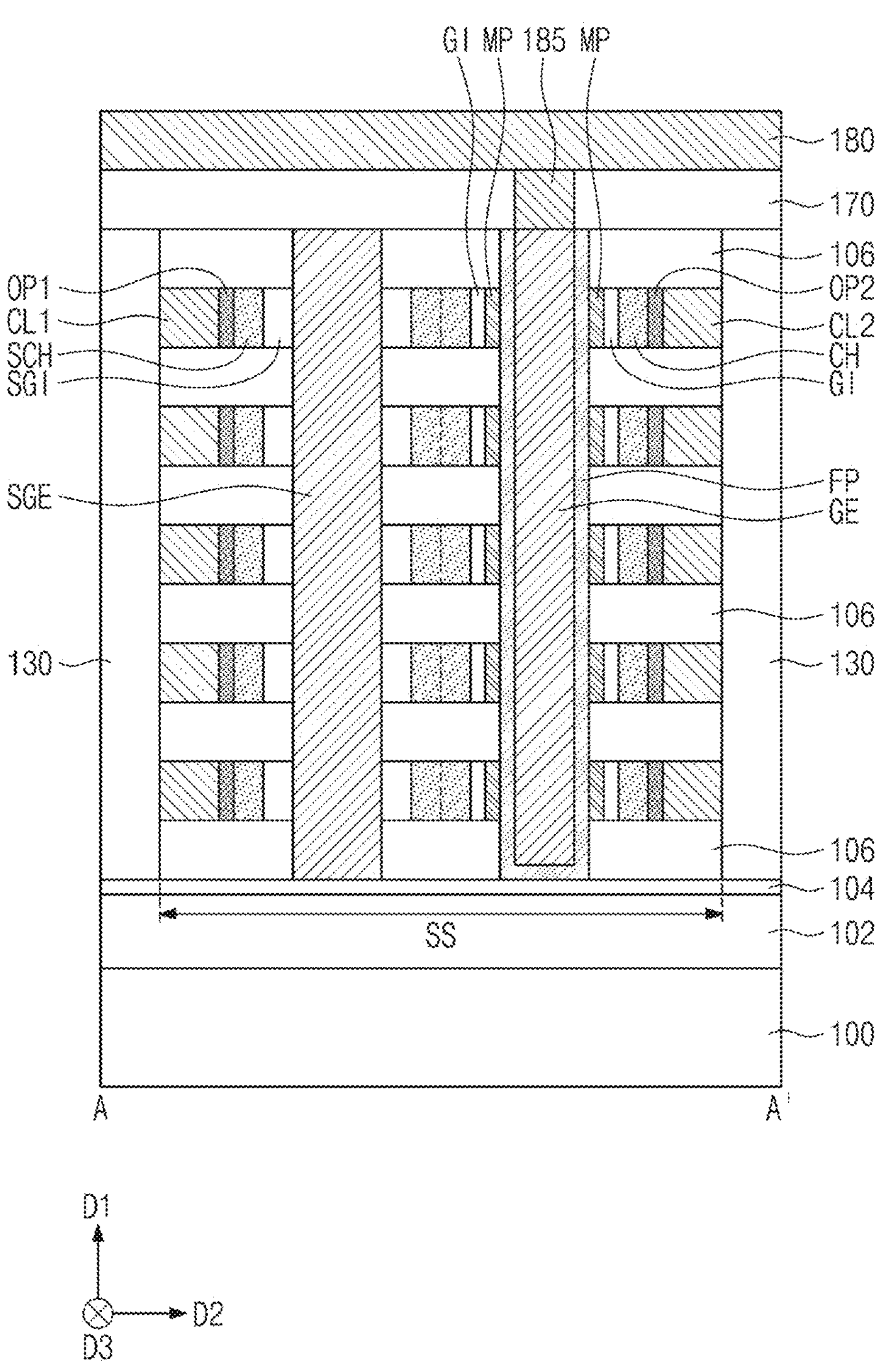
FIG. 18B is a cross-sectional view taken along line A-A' of FIG. 18A.

FIG. 17 is a schematic perspective view of a semiconductor device according to some embodiments of the present disclosure. FIG. 18A is a plan view of a semiconductor device according to some embodiments of the present disclosure, and FIG. 18B is a cross-sectional view taken along line A-A' of FIG. 18A. For simplicity of description, differences from the semiconductor device described with reference to FIGS. 1, 2A, and 2B will be mainly described.

Referring to FIGS. 17, 18A and 18B, the stacked structure SS may include first conductive lines CL1, second conductive lines CL2, gate electrodes GE between the first conductive lines CL1 and the second conductive lines CL2, and selection gate electrodes SGE between the first conductive lines CL1 and the gate electrodes GE. The first conductive lines CL1, the second conductive lines CL2, the gate electrodes GE, and the selection gate electrodes SGE are substantially the same as the first conductive lines CL1, the second conductive lines CL2, the gate electrodes GE, and the first selection gate electrodes SGE1 described with reference to FIGS. 1, 2A and 2B, respectively.

The stacked structure SS may further include a plurality of channel patterns CH surrounding a side surface GE_S of each of the gate electrodes GE and a plurality of selection channel patterns SCH surrounding a side surface SGE_S of each of the selection gate electrodes SGE. The plurality of channel patterns CH and the plurality of selection channel patterns SCH are substantially the same as the plurality of channel patterns CH and the plurality of first selection channel patterns SCH1 described with reference to FIGS. 1, 2A and 2B, respectively.

The stacked structure SS may further include a ferroelectric pattern FP between each of the plurality of channel patterns (CH) and a corresponding gate electrode GE, a metal pattern MP between each of the plurality of channel patterns CH and the ferroelectric pattern FP, and a gate insulating pattern GI between each of the plurality of channel patterns CH and the metal pattern MP. The ferroelectric pattern FP, the metal pattern MP, and the gate insulating pattern GI are substantially the same as the ferroelectric pattern FP, the metal pattern MP, and the gate insulating pattern GI described with reference to FIGS. 1, 2A and 2B, respectively. The stacked structure SS may further include a selection gate insulating pattern SGI between each of the plurality of selection channel patterns SCH and a corresponding selection gate electrode SGE. The selection gate insulating pattern SGI is substantially the same as the first selection gate insulating pattern SGI1 described with reference to FIGS. 1, 2A, and 2B.

According to the present embodiments, the second selection gate electrodes SGE2, the plurality of second selection channel patterns SCH2, and the second selection gate insulating pattern SGI2 described with reference to FIGS. 1, 2A, and 2B may be omitted.

The stacked structure SS may further include first impurity patterns OP1 between the first conductive lines CL1 and the plurality of selection channel patterns SCH and second impurity patterns OP2 between the second conductive lines CL2 and the plurality of channel patterns CH. The first impurity patterns OP1 may be spaced apart from each other in the first direction D1, and may be interposed between the first conductive lines CL1 and the plurality of selection channel patterns SCH, respectively. The second impurity patterns OP2 may be spaced apart from each other in the first direction D1, and may be interposed between the second conductive lines CL2 and the plurality of channel patterns CH, respectively. The first conductive lines CL1 may be electrically connected to the plurality of selection channel patterns SCH through the first impurity patterns OP1, respectively, and the second conductive lines CL2 may be electrically connected to the plurality of channel patterns CH through the second impurity patterns OP2, respectively.

According to the present embodiments, the corresponding gate electrode GE, each of the plurality of channel patterns CH, the ferroelectric pattern FP interposed between each of the plurality of channel patterns CH and the corresponding gate electrode GE, the metal pattern MP, and the gate insulating pattern GI may constitute a ferroelectric field effect transistor. The corresponding selection gate electrode SGE, each of the plurality of selection channel patterns SCH, each of the plurality of selection channel patterns SCH, the selection gate insulating pattern SGI interposed between the corresponding selection gate electrodes SGE may constitute a selection transistor. The selection transistor may control a flow of current between a corresponding first conductive line CL1 among the first conductive lines CL1 and the ferroelectric field effect transistor.

Except for the above-described difference, the semiconductor device according to the present embodiments is substantially the same as the semiconductor device described with reference to FIGS. 1, 2A, and 2B. A cross section taken along line B-B' of FIG. 18A may have substantially the same configuration as that of FIG. 14A or 14B.

Figure 19:
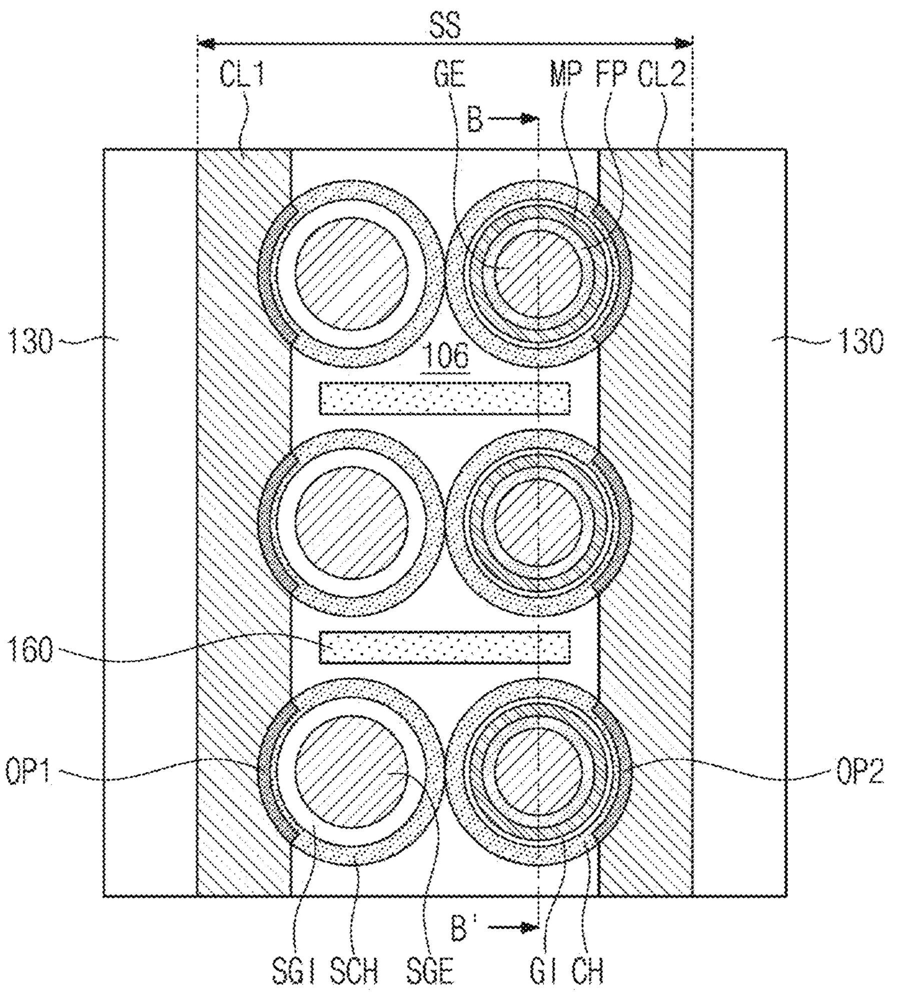
FIG. 19 is a plan view of a semiconductor device according to some embodiments of the present disclosure.
Figure 19:
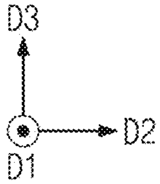

FIG. 19 is a plan view of a semiconductor device according to some embodiments of the present disclosure. A cross section along B-B' in FIG. 19 is substantially the same as that in FIG. 16. For simplicity of description, differences from the semiconductor device described with reference to FIGS. 17, 18A, and 18B will be mainly described.

Referring to FIGS. 19 and 16, according to some embodiments, the stacked structure SS may further include shielding lines 160 disposed between the first conductive lines CL1 and the second conductive lines CL2. The shielding lines 160 may be interposed between the gate electrodes GE, and the shielding lines 160 and the gate electrodes GE may be alternately disposed in the third direction D3. The shielding lines 160 may extend parallel to the gate electrodes GE in the first direction D1. The shielding lines 160 may extend between the selection gate electrodes SGE in the second direction D2. The shielding lines 160 may be interposed between channel patterns CH neighboring in the third direction D3, and may extend between selection channel patterns SCH neighboring in the third direction D3 in the second direction D2.

The stacked structure SS may further include second insulating patterns 108 interposed between adjacent channel patterns CH in the third direction D3, and between selection channel patterns SCH neighboring in the third direction D3. The second insulating patterns 108 are substantially the same as the second insulating patterns 108 described with reference to FIGS. 13 and 14A. According to some embodiments, each of the shielding lines 160 may extend in the first direction D1 and pass through the first insulating patterns 106 and the second insulating patterns 108. The shielding lines 160 are substantially the same as the shielding lines 160 described with reference to FIGS. 15 and 16.

Figure 20:
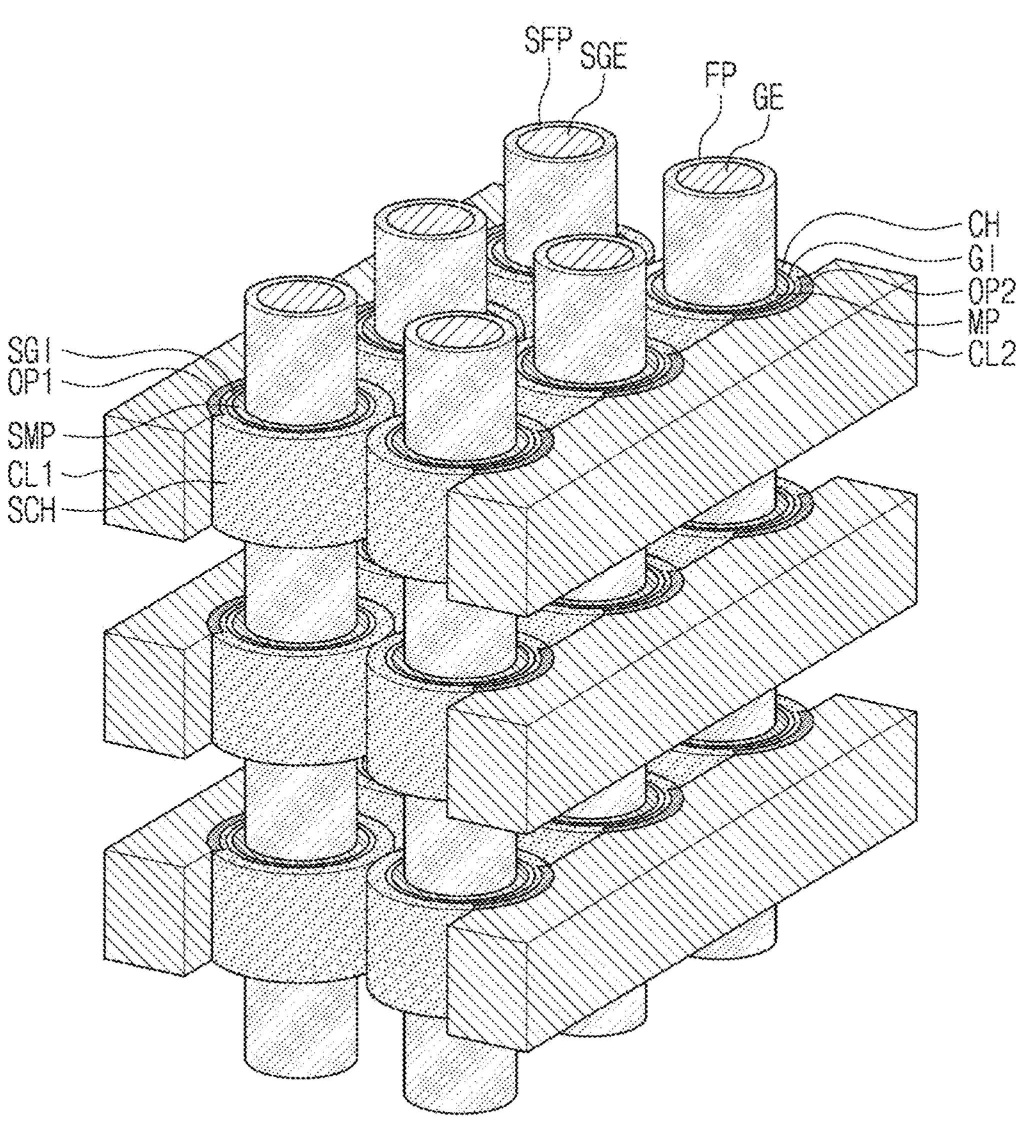
FIG. 20 is a schematic perspective view of a semiconductor device according to some embodiments of the present disclosure.
Figure 20:
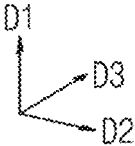
Figure 21A:
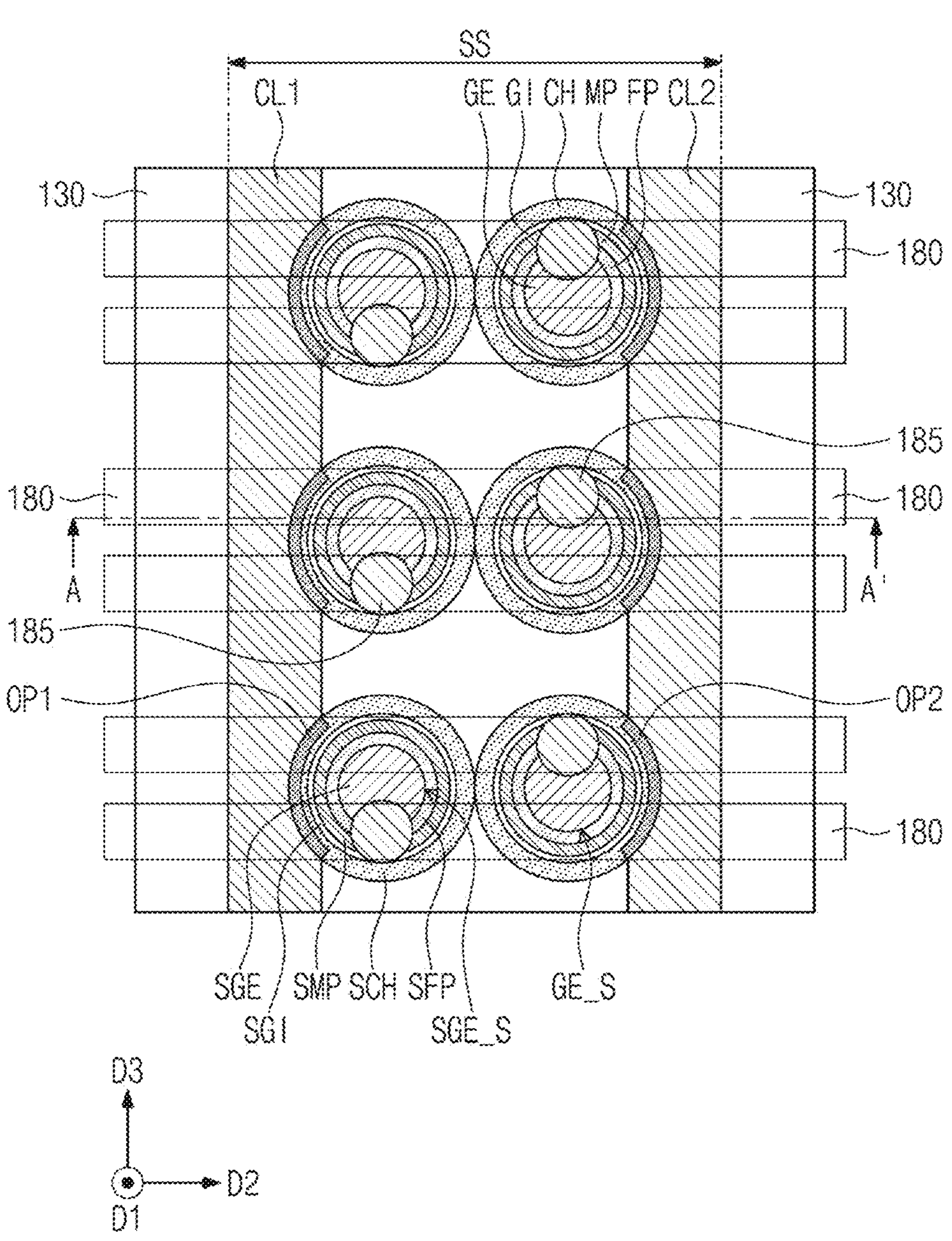
FIG. 21A is a plan view of a semiconductor device according to some embodiments of the present disclosure.
Figure 21B:
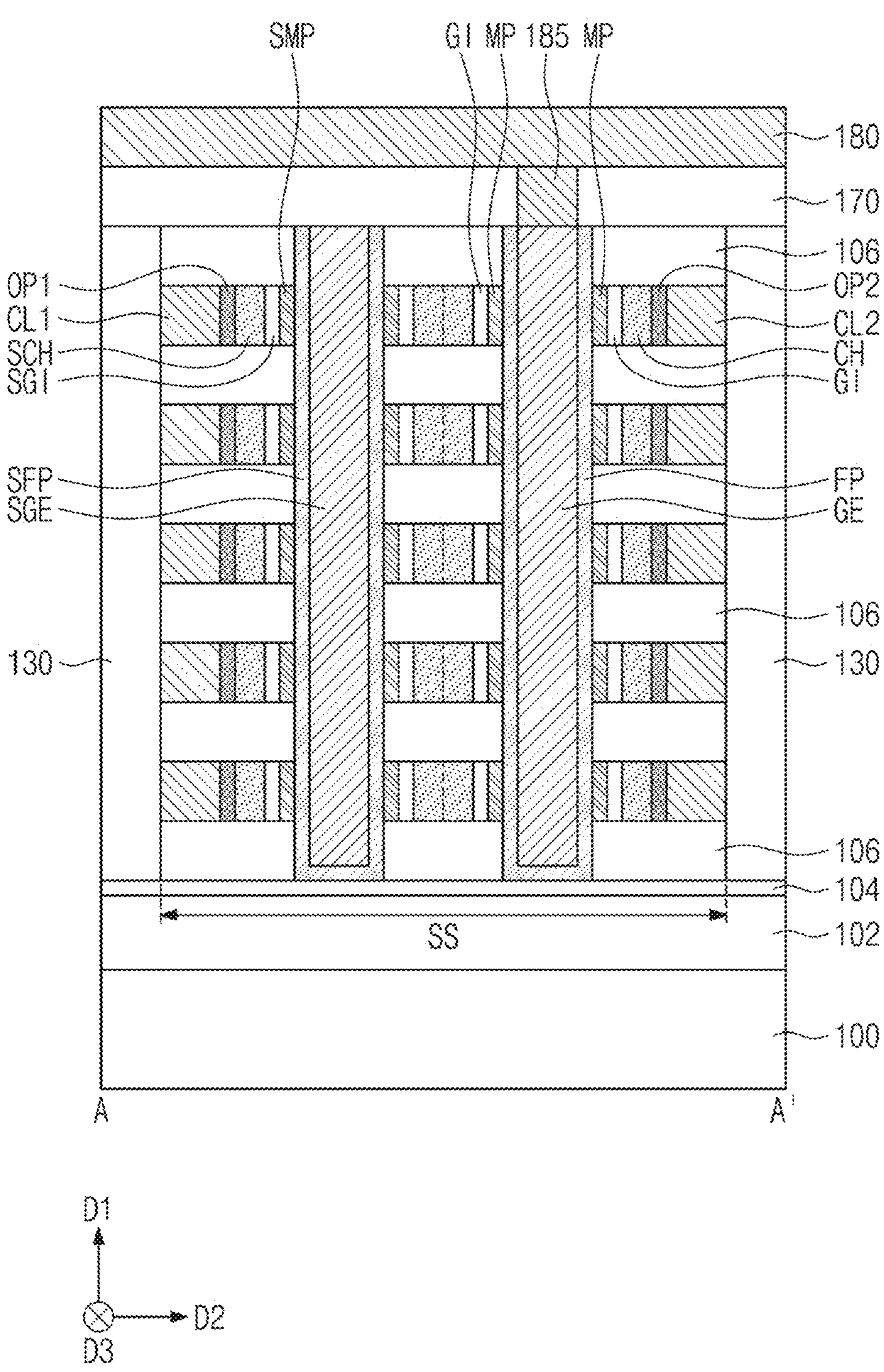
FIG. 21B is a cross-sectional view taken along line A-A' of FIG. 21A.

FIG. 20 is a schematic perspective view of a semiconductor device according to some embodiments of the present disclosure. FIG. 21A is a plan view of a semiconductor device according to some embodiments of the present disclosure, and FIG. 21B is a cross-sectional view taken along line A-A' of FIG. 21A. For simplicity of description, differences from the semiconductor device described with reference to FIGS. 17, 18A, and 18B will be mainly described.

Referring to FIGS. 20, 21A, and 21B, the stacked structure SS may further include a selection ferroelectric pattern SFP between each of the plurality of selection channel patterns SCH and the corresponding selection gate electrode SGE, and a selection metal pattern SMP between each of the plurality of selection channel patterns SCH and the selection ferroelectric pattern SFP1. The selection gate insulating pattern SGI may be interposed between each of the plurality of selection channel patterns SCH and the selection metal pattern SMP. The selection ferroelectric pattern SFP may surround a side surface SGE_S of the corresponding selection gate electrode SGE, and may extend between each of the first insulating patterns 106 and the corresponding selection gate electrode SGE. The selection metal pattern SMP may be spaced apart from the side surface SGE_S of the corresponding selection gate electrode SGE with the selection ferroelectric pattern SFP interposed therebetween. The selection gate insulating pattern SGI may be spaced apart from the side surface SGE_S of the corresponding selection gate electrode SGE with the selection ferroelectric pattern SFP and the selection metal pattern SMP interposed therebetween.

The selection ferroelectric pattern SFP, the selection metal pattern SMP, and the selection gate insulating pattern SGI are substantially the same as the first selection ferroelectric pattern SFP1, the first selection metal pattern SMP1, and the first selection gate insulating pattern SGI1 described with reference to FIGS. 10, 11A, and 11B.

According to some embodiments, the corresponding selection gate electrode SGE, each of the plurality of selection channel patterns SCH, the selection ferroelectric pattern SFP interposed between each of the plurality of selection channel patterns SCH and the corresponding selection gate electrode SGE, the selection metal pattern SMP, and the selection gate insulating pattern SGI may constitute a selection transistor.

Except for the above-mentioned difference, the semiconductor device according to the present embodiments is substantially the same as the semiconductor device described with reference to FIGS. 17, 18A, and 18B.

Figure 22:
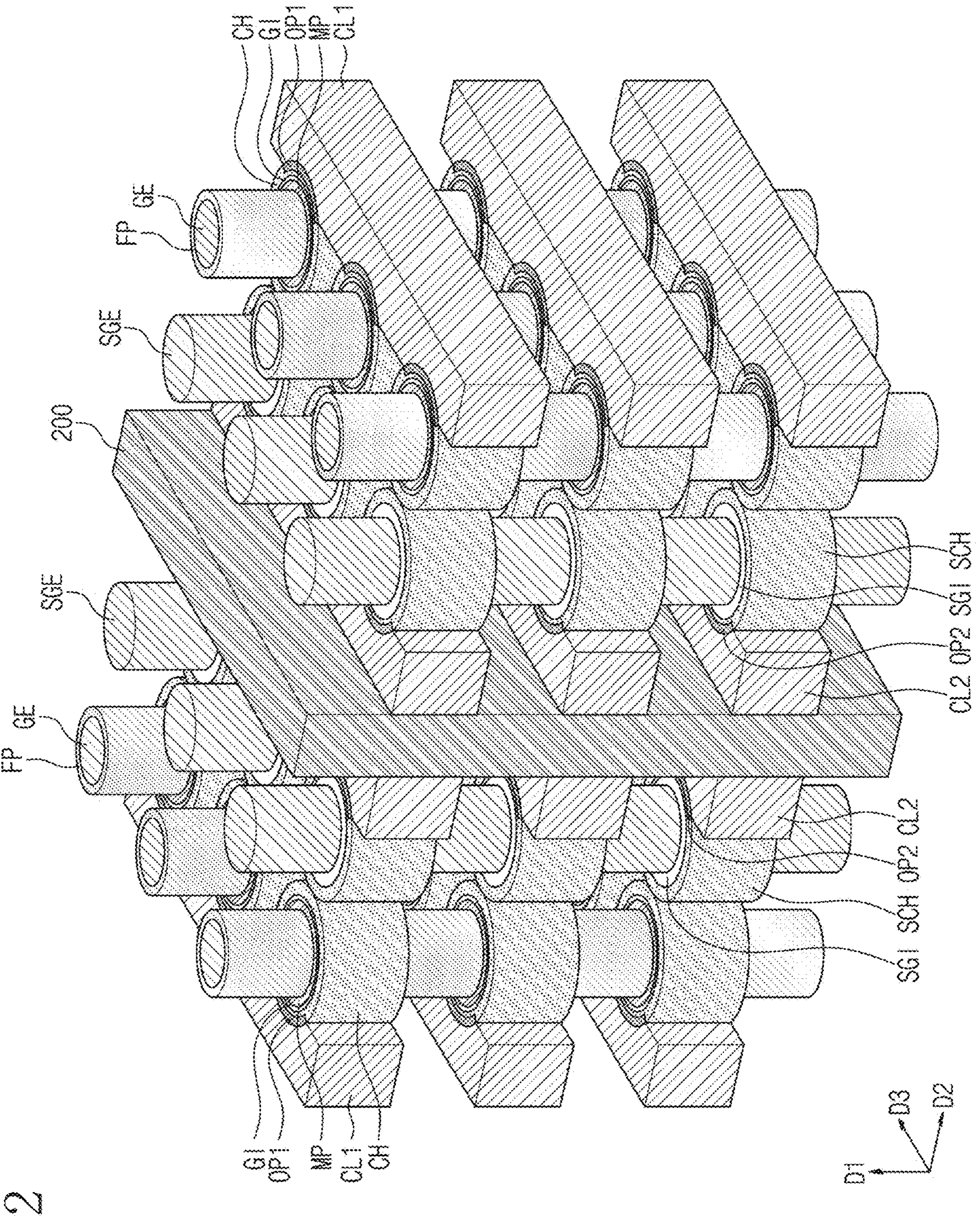
FIG. 22 is a schematic perspective view of a semiconductor device according to some embodiments of the present disclosure.
Figure 23A:
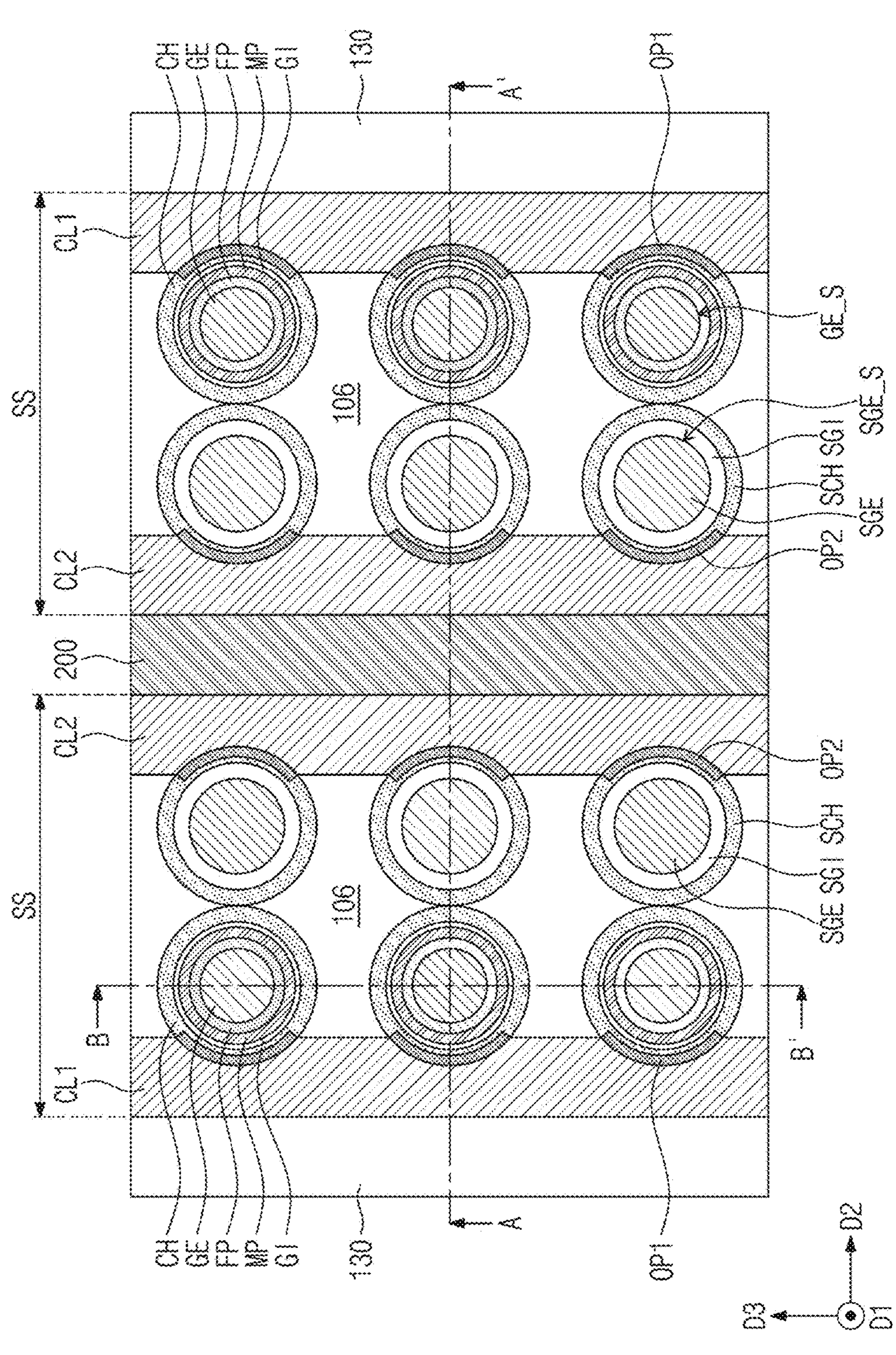
FIG. 23A is a plan view of a semiconductor device according to some embodiments of the present disclosure.
Figure 23B:
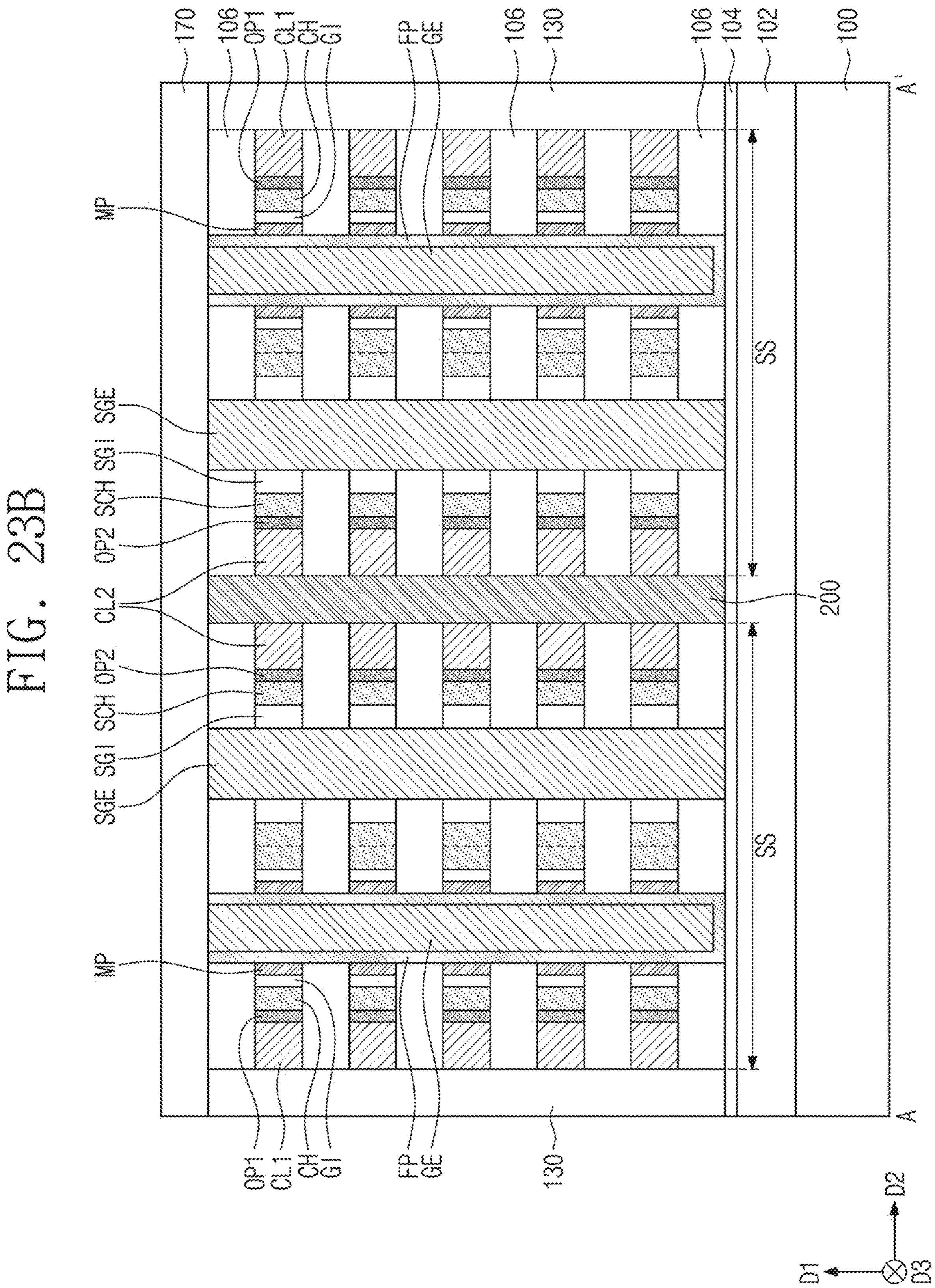
FIG. 23B is a cross-sectional view taken along line A-A' of FIG. 23A.

FIG. 22 is a schematic perspective view of a semiconductor device according to some embodiments of the present disclosure. FIG. 23A is a plan view of a semiconductor device according to some embodiments of the present disclosure, and FIG. 23B is a cross-sectional view taken along line A-A' of FIG. 23A. For simplicity of description, differences from the semiconductor device described with reference to FIGS. 1, 2A, and 2B will be mainly described.

Referring to FIGS. 22, 23A and 23B, a pair of stacked structures SS may be disposed on the etch stop layer 104. Each of the pair of stacked structures SS may include first conductive lines CL1, second conductive lines CL2, gate electrodes GE disposed between the first conductive lines CL1 and the second conductive lines CL2, and selection gate electrodes SGE between the second conductive lines CL2 and the gate electrodes GE. The selection gate electrodes SGE may extend in the first direction D1 between the second conductive lines CL2 and the gate electrodes GE, and may be spaced apart from each other in the third direction D3. The selection gate electrodes SGE may be electrically connected to each of the gate electrodes GE. The first conductive lines CL1, the second conductive lines CL2, the gate electrodes GE, and the selection gate electrodes SGE are substantially the same as the first conductive lines CL1, the second conductive lines CL2, the gate electrodes GE, and the second selection gate electrodes SGE2 described with reference to FIGS. 1, 2A, and 2B.

The second conductive lines CL2 of one of the pair of stacked structures SS may face the second conductive lines CL2 of the other of the pair of stacked structures SS. According to some embodiments, the second conductive lines CL2 may function as source lines, and a common source pattern 200 may be disposed between the pair of stacked structures SS. The second conductive lines CL2 of one of the pair of stacked structures SS may be disposed on one side of the common source pattern 200 and may be electrically connected to the one side of the common source pattern 200. The second conductive lines CL2 of the other of the pair of stacked structures SS are disposed on the other side of the common source pattern 200 and may be electrically connected to the other side of the common source pattern 200. The common source pattern 200 may include a conductive material, for example, doped polysilicon, metal, conductive metal nitride, conductive metal silicide, conductive metal oxide, or a combination thereof. The common source pattern 200 may include a two-dimensional semiconductor material.

Each of the pair of stacked structures SS may further include a plurality of channel patterns CH surrounding a side surface GE_S of each of the gate electrodes GE and a plurality of selection channel patterns SCH surrounding a side surface SGE_S of each of the selection gate electrodes SGE. The plurality of selection channel patterns SCH may surround a side surface SGE_S of a corresponding one of the selection gate electrodes SGE, and may be spaced apart from each other in the first direction D1. The plurality of channel patterns CH and the plurality of selection channel patterns SCH are substantially the same as the plurality of channel patterns CH and the plurality of second selection channel patterns SCH2 described with reference to FIGS. 1, 2A, and 2B, respectively.

The stacked structure SS may further include a ferroelectric pattern FP between each of the plurality of channel patterns CH and the corresponding gate electrode GE, a metal pattern MP between each of the plurality of channel patterns CH and the ferroelectric pattern FP, and a gate insulating pattern GI between each of the plurality of channel patterns CH and the metal pattern MP. The ferroelectric pattern FP, the metal pattern MP, and the gate insulating pattern GI are substantially the same as the ferroelectric pattern FP, the metal pattern MP, and the gate insulating pattern GI described with reference to FIGS. 1, 2A, and 2B, respectively. The stacked structure SS may further include a selection gate insulating pattern SGI between each of the plurality of selection channel patterns SCH and the corresponding selection gate electrode SGE. The selection gate insulating pattern SGI is substantially the same as the second selection gate insulating pattern SGI2 described with reference to FIGS. 1, 2A, and 2B.

The stacked structure SS may further include first impurity patterns OP1 between the first conductive lines CL1 and the plurality of channel patterns CH, and second impurity patterns OP2 between the second conductive lines CL2 and the plurality of selection channel patterns CH. The first impurity patterns OP1 may be spaced apart from each other in the first direction D1, and may be interposed between the first conductive lines CL1 and the plurality of channel patterns CH, respectively. The second impurity patterns OP2 may be spaced apart from each other in the first direction D1, and may be interposed between the second conductive lines CL2 and the plurality of selection channel patterns SCH, respectively. The first conductive lines CL1 may be electrically connected to the plurality of channel patterns CH through the first impurity patterns OP1, respectively, and the second conductive lines CL2 may be electrically connected to the plurality of selection channel patterns SCH through the second impurity patterns OP2, respectively.

The corresponding gate electrode GE, each of the plurality of channel patterns CH, the ferroelectric pattern FP interposed between each of the plurality of channel patterns CH and the corresponding gate electrode GE, the metal pattern MP, and the gate insulating pattern GI may constitute a ferroelectric field effect transistor. The corresponding selection gate electrode SGE, each of the plurality of selection channel patterns SCH, the selection gate insulating pattern SGI interposed between each of the plurality of selection channel patterns SCH and the corresponding selection gate electrode SGE may constitute a selection transistor. The selection transistor may control a flow of current between a corresponding second conductive line CL2 among the second conductive lines CL2 and the ferroelectric field effect transistor.

Except for the above-described difference, the semiconductor device according to the present embodiments is substantially the same as the semiconductor device described with reference to FIGS. 1, 2A, and 2B. A cross section taken along line B-B' of FIG. 23A may have substantially the same configuration as that of FIG. 14A or 14B.

FIGS. 24A to 26A are plan views illustrating a method of manufacturing a semiconductor device according to some embodiments of the present disclosure, and FIGS. 24B to 26B are cross-sectional views taken along line A-A' of FIGS. 24A to 26A, respectively. For simplicity of explanation, differences from the manufacturing method of the semiconductor device described with reference to FIGS. 3A to 9A and 3B to 9B will be mainly described.

Figure 24A:
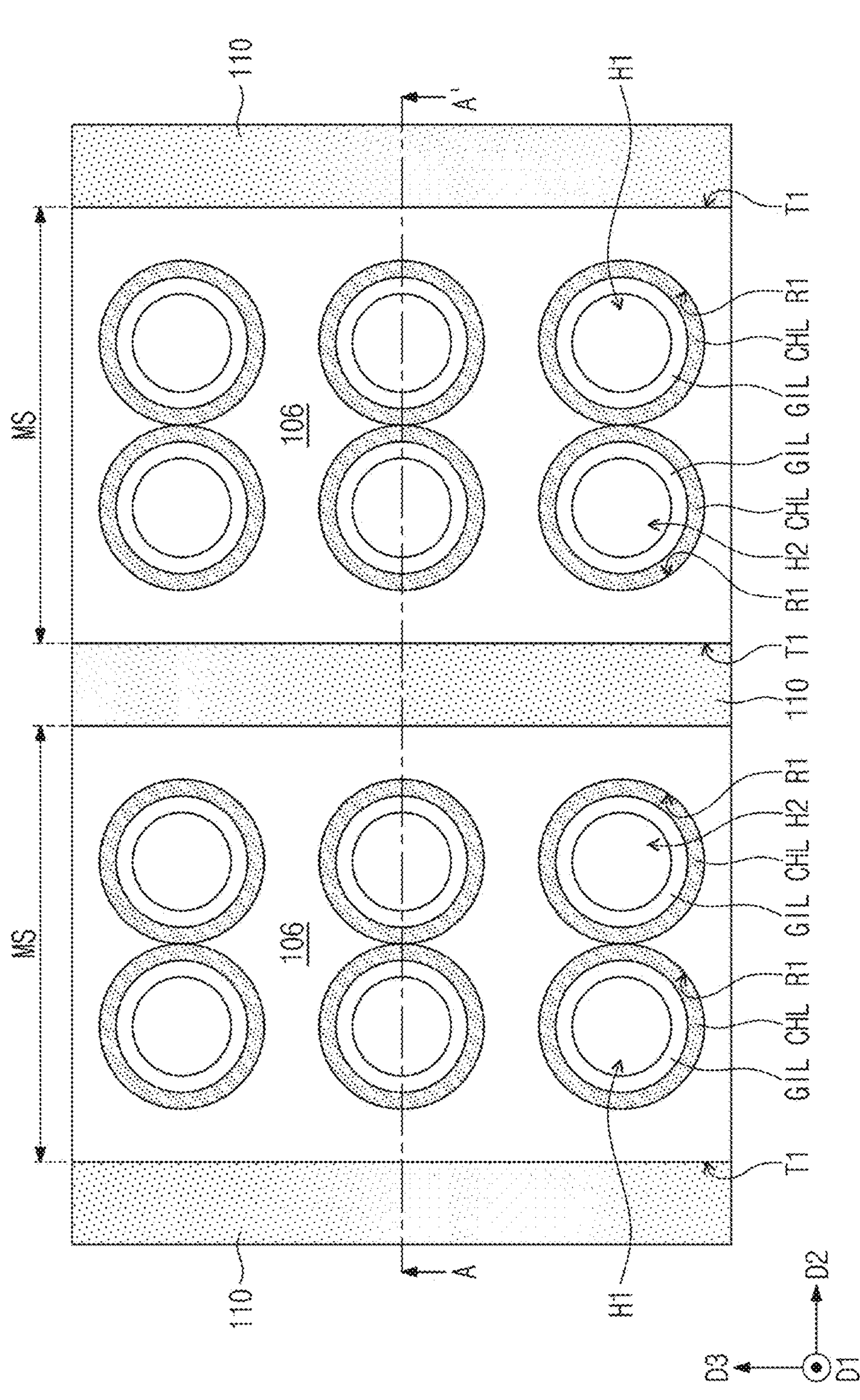
Figure 24B:
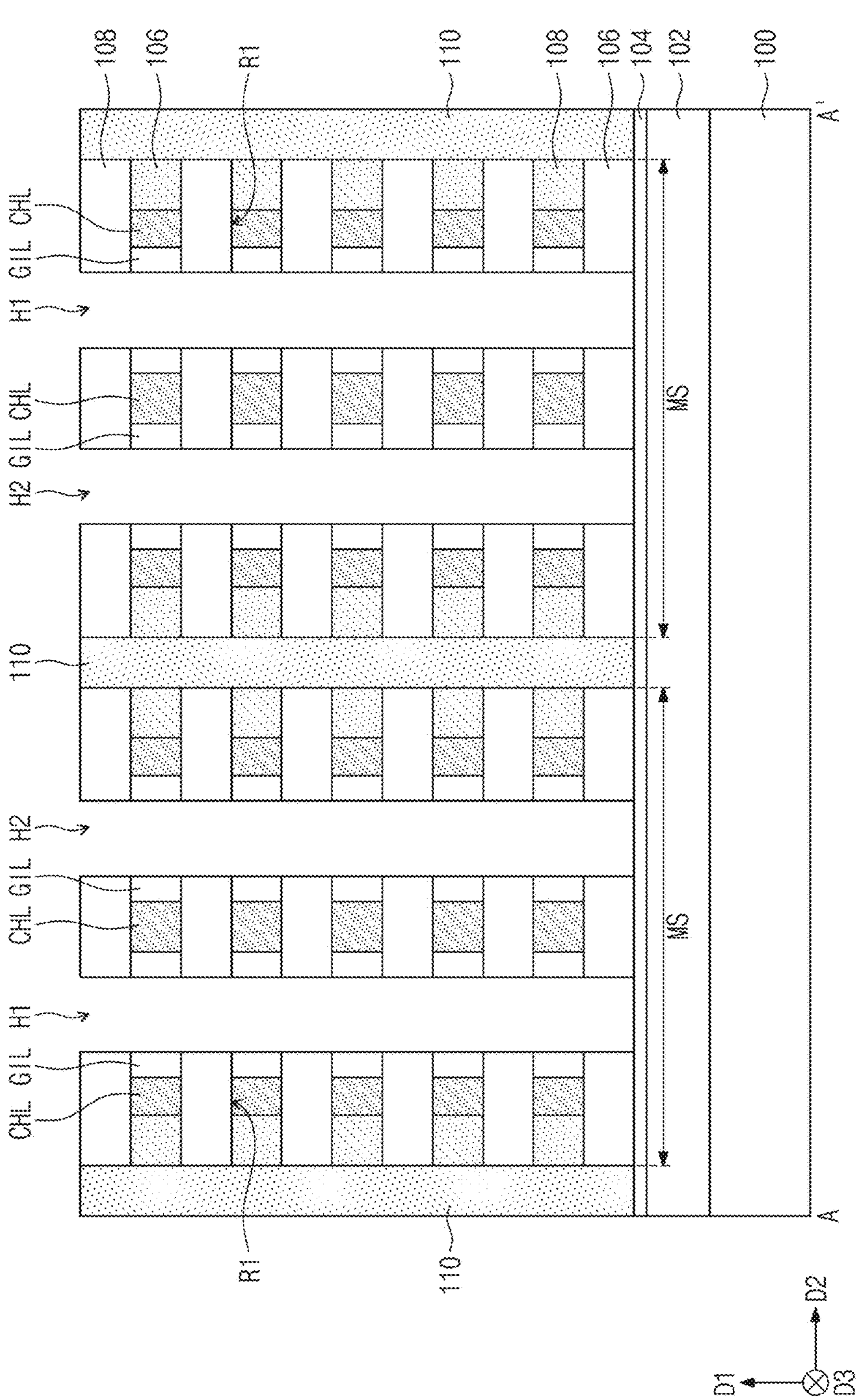

Referring to FIGS. 24A and 24B, an interlayer insulating layer 102 and an etch stop layer 104 may be sequentially formed on the substrate 100. First insulating layers 106 and second insulating layers 108 may be stacked on the etch stop layer 104. The first insulating layers 106 and the second insulating layers 108 may be alternately stacked in the first direction D1.

First trenches T1 may be formed in the first insulating layers 106 and the second insulating layers 108. Each of the first trenches T1 may pass through the first insulating layers 106 and the second insulating layers 108 in the first direction D1, and may expose an upper surface of the etch stop layer 104. The first trenches T1 may be spaced apart from each other in the second direction D2 and may extend in the third direction D3.

A pair of mold structures MS may be defined by the first trenches T1. The pair of mold structures MS may be spaced apart from each other in the second direction D2 with one of the first trenches T1 interposed therebetween. Each of the pair of mold structures MS may include the first insulating layers 106 and the second insulating layers 108 interposed between a pair of first trenches T1 among the first trenches T1. The pair of mold structures MS may extend in the third direction D3 between the first trenches T1.

First holes H1 and second holes H2 may be formed in each mold structure MS. Each of the first and second holes H1 and H2 may extend in the first direction D1 to pass through each mold structure MS and expose an upper surface of the etch stop layer 104. The first holes H1 may be spaced apart from each other in the third direction D3. The second holes H2 may be spaced apart from the first holes H1 in the second direction D2 and may be spaced apart from each other in the third direction D3. First sacrificial patterns 110 may be formed in each of the first trenches T1. The first sacrificial patterns 110 may cover both side surfaces of each mold structure MS.

Each of the first and second holes H1 and H2 may expose side surfaces of the first insulating layers 106 and the second insulating layers 108 of each mold structure MS. The exposed side surfaces of the second insulating layers 108 may be selectively recessed, and thus, first recessed regions R1 may be formed in each mold structure MS. Each of the first recess regions R1 may be formed to surround each of the first and second holes H1 and H2 when viewed in a plan view.

A channel layer CHL and a gate insulating layer GIL may be formed in the first recess regions R1. The channel layer CHL may fill a portion of each of the first recess regions R1, and the gate insulating layer GIL may fill a remainder of each of the first recess regions R1.

Figure 25A:
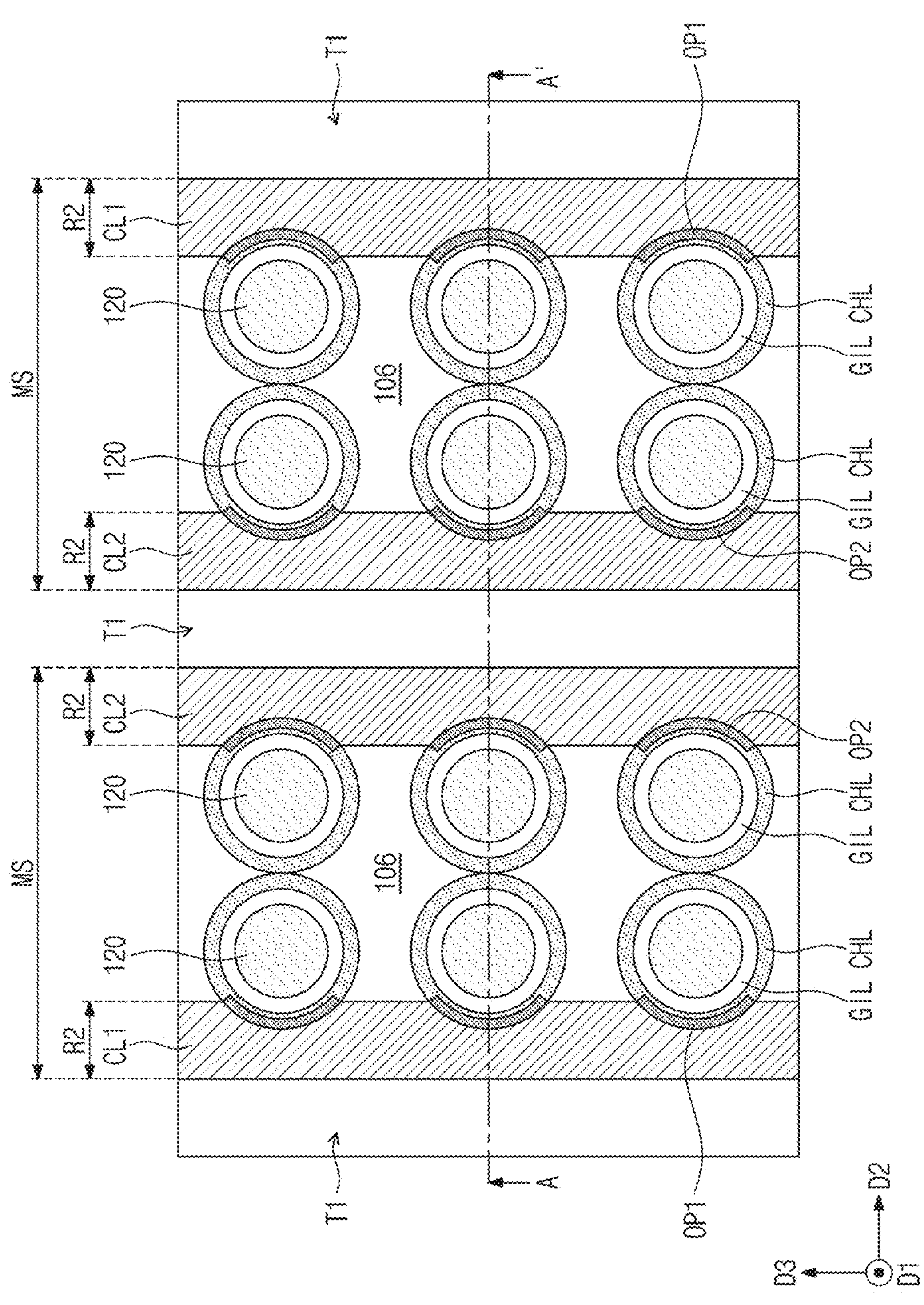
Figure 25B:
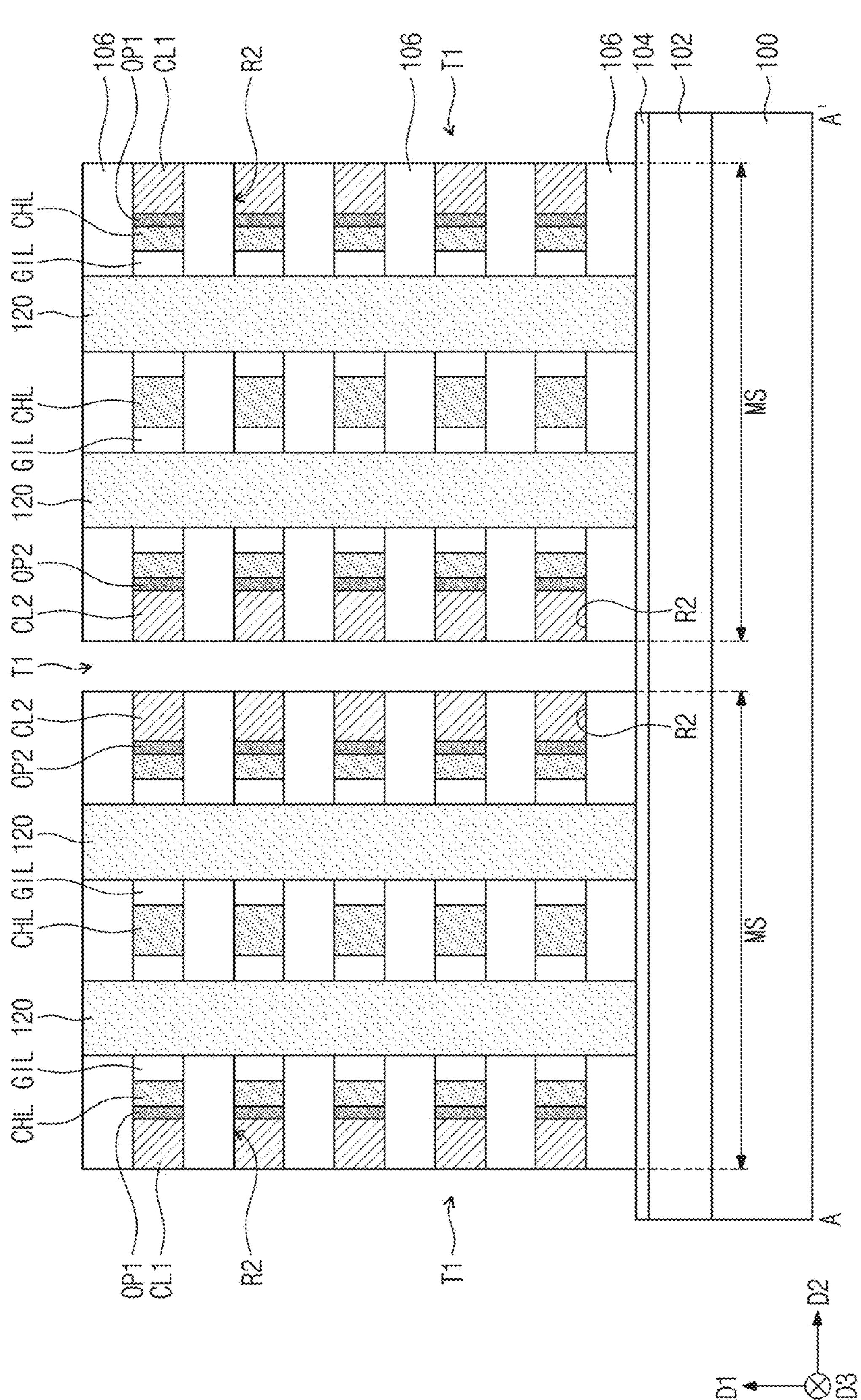

Referring to FIGS. 25A and 25B, second sacrificial patterns 120 may be formed in the first and second holes H1 and H2, respectively. The second sacrificial patterns 120 may be formed to fill the first and second holes H1 and H2, respectively.

The first sacrificial patterns 110 may be removed from the first trenches T1. Each of the first trenches T1 may expose side surfaces of the first insulating layers 106 and the second insulating layers 108 of each mold structure MS. The exposed side surfaces of the second insulating layers 108 may be selectively recessed, and thus, second recessed regions R2 may be formed in each mold structure MS. The second recess regions R2 may expose side surfaces of the channel layer CHL. The second recess regions R2 may be spaced apart from each other in the first direction D1 and may be respectively interposed between the first insulating layers 106. Each of the second recess regions R2 may have a line shape extending in the third direction D3.

First conductive lines CL1 and first impurity patterns OP1 may be formed in corresponding second recess regions R2 among the second recess regions R2. Each of the first impurity patterns OP1 may fill a portion of each of the corresponding second recess regions R2 and may be in contact with the channel layer CHL. Each of the first conductive lines CL1 may fill the remainder of each of the corresponding second recess regions R2.

Second conductive lines CL2 and second impurity patterns OP2 may be formed in corresponding second recess regions R2 among the second recess regions R2. Each of the second impurity patterns OP2 may fill a portion of each of the corresponding second recess regions R2 and may be in contact with the channel layer CHL. Each of the second conductive lines CL2 may fill the remainder of each of the corresponding second recess regions R2.

Figure 26A:
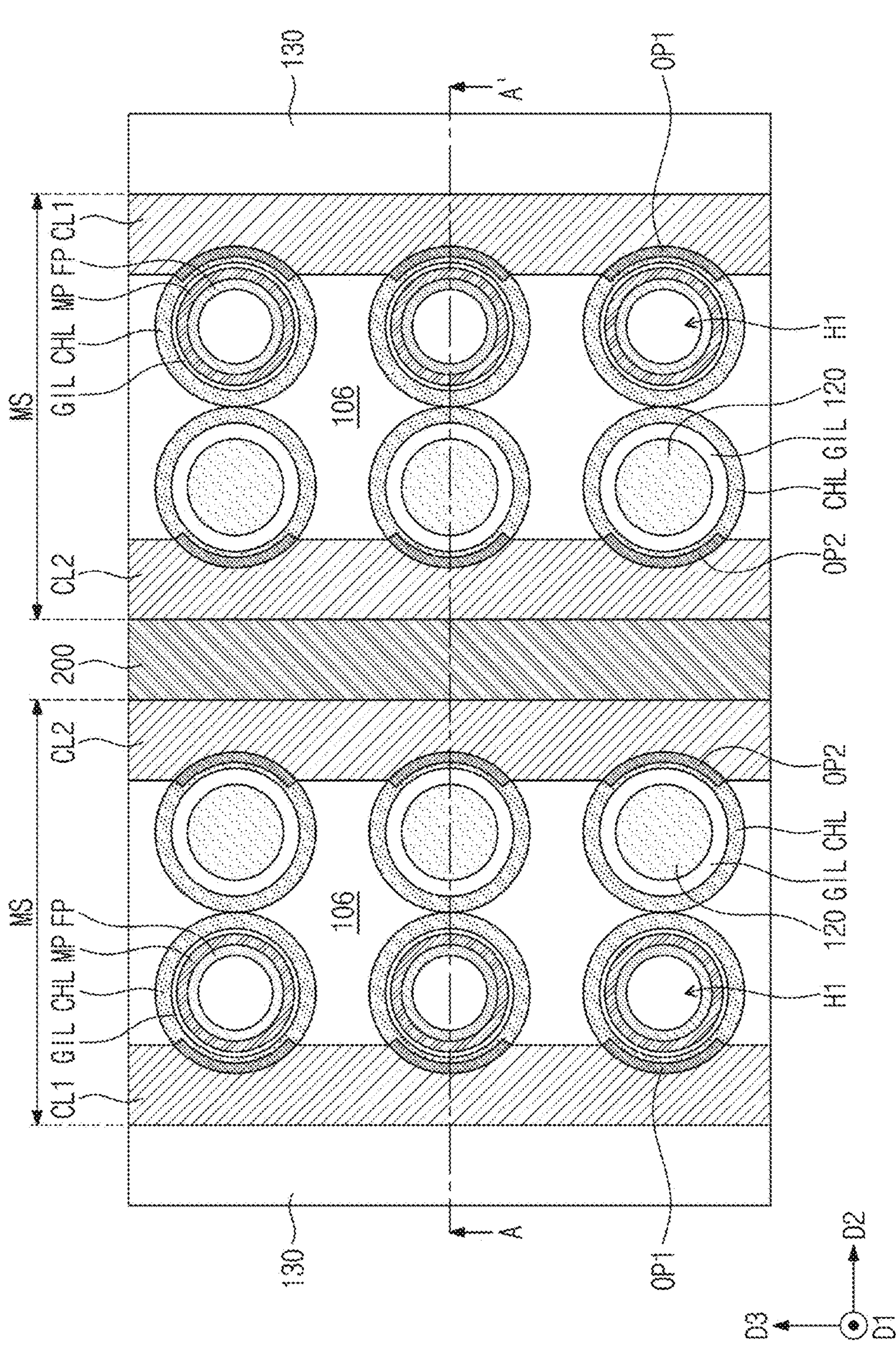
Figure 26B:
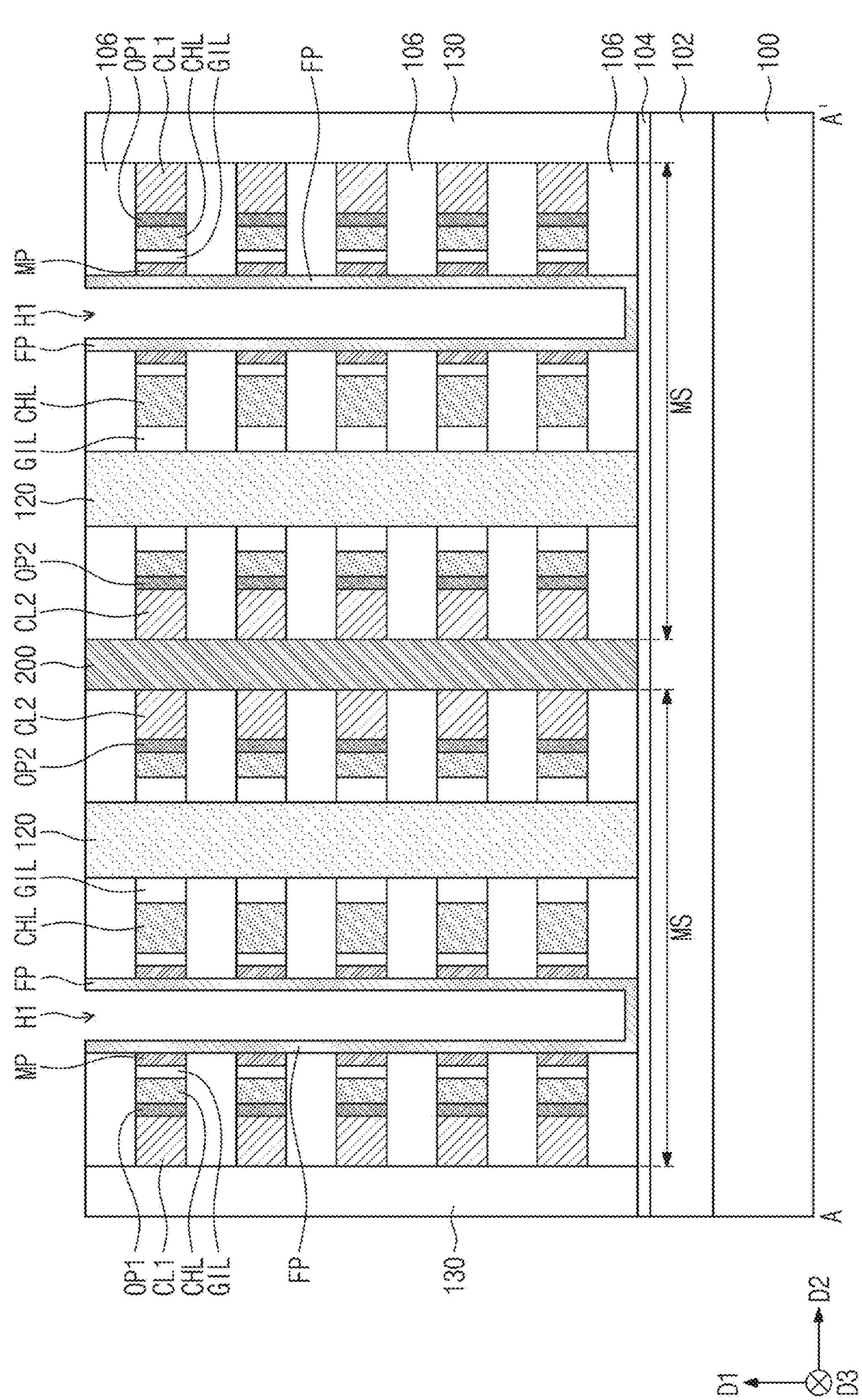

Referring to FIGS. 26A and 26B, a common source pattern 200 may be formed in the first trench T1 between the pair of mold structures MS. The common source pattern 200 may be formed to fill the first trench T1 between the pair of mold structures MS. Forming the common source pattern 200 may include, for example, forming preliminary sacrificial patterns in the first trenches T1 spaced apart from each other with the pair of mold structures MS interposed therebetween, forming a common source layer on the pair of mold structures MS to fill the first trench T1 between the pair of mold structures MS, and planarizing the common source layer to expose upper surfaces of the pair of mold structures MS. As the common source layer is planarized, the common source pattern 200 may be locally formed in the first trench T1 between the pair of mold structures MS.

Sidewall insulating patterns 130 may be respectively formed in the first trenches T1 spaced apart from each other with the pair of mold structures MS interposed therebetween. Forming the sidewall insulating patterns 130 may include, for example, removing the preliminary sacrificial patterns, forming sidewall insulating layers on the pair of mold structures MS to fill the first trenches T1 spaced apart from each other with the pair of mold structures MS interposed therebetween, and planarizing the sidewall insulating layer to expose upper surfaces of the pair of mold structures MS. As the sidewall insulating layer is planarized, the sidewall insulating patterns 130 may be locally formed in the first trenches T1 spaced apart from each other with the pair of mold structures MS interposed therebetween.

The second sacrificial patterns 120 may be removed from the first holes H1. The first holes H1 may expose side surfaces of the gate insulating layer GIL. The exposed side surfaces of the gate insulating layer GIL may be laterally recessed, and thus, an empty region may be formed in each of the first recess regions R1 surrounding each of the first holes H1. A metal pattern MP may be formed to fill the empty region in each of the first recess regions R1.

A ferroelectric pattern FP may be formed in each of the first holes H1. The ferroelectric pattern FP may partially fill each of the first holes H1 and conformally cover inner surfaces of each of the first holes H1. The ferroelectric pattern FP may cover side surfaces of the metal pattern MP and side surfaces of the first insulating layers 106, and may cover an upper surface of the etch stop layer 104.

Referring back to FIGS. 23A and 23B, the remainder of the second sacrificial patterns 120 may be removed from the second holes H2. Gate electrodes GE may be formed in the first holes H1, respectively. Each of the gate electrodes GE may be formed to fill the remainder of each of the first holes H1. Selection gate electrodes SGE may be formed in the second holes H2, respectively. Forming the gate electrodes GE and the selection gate electrodes SGE may include, for example, forming a gate electrode layer on the mold structures MS to fill the remainder of each of the first holes H1 and to fill the second holes H2, and removing the gate electrode layer from upper surfaces of the mold structures MS.

Portions of the channel layer CHL surrounding each of the gate electrodes GE may be referred to as channel patterns CH, and portions of the gate insulating layer GIL surrounding each of the gate electrodes GE may be referred to as gate insulating patterns GI. Portions of the channel layer CHL surrounding each of the selection gate electrodes SGE may be referred to as selection channel patterns SCH, and portions of the gate insulating layer GIL surrounding each of the selection gate electrodes SGE may be referred to as selection gate insulating patterns SGI1. The first insulating layers 106 may be referred to as first insulating patterns 106.

Except for the above-mentioned differences, the method of manufacturing a semiconductor device according to the present embodiments is substantially the same as the method of manufacturing a semiconductor device described with reference to FIGS. 3A to 9A and 3B to 9B.

Figure 27:
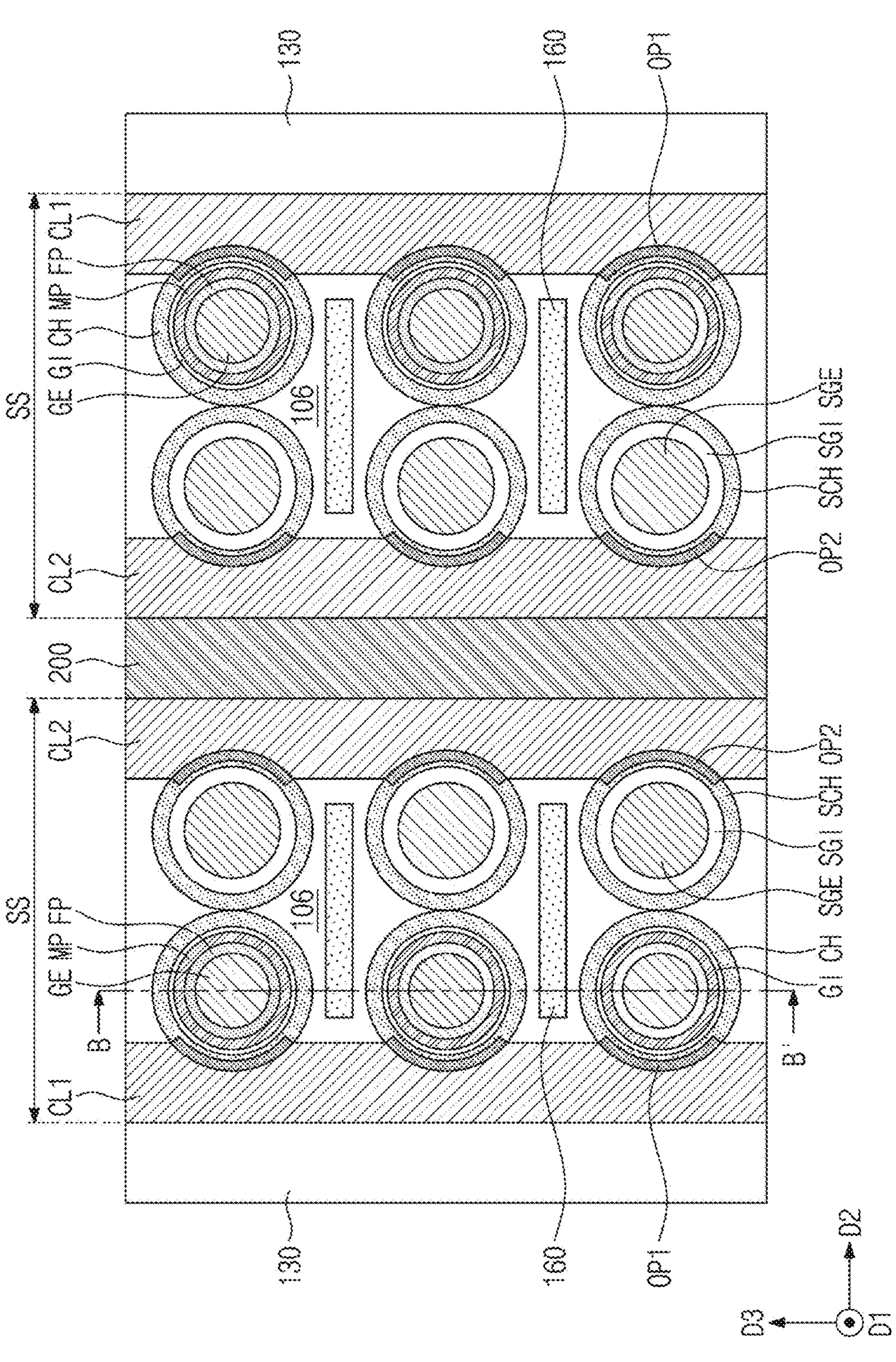
FIG. 27 is a plan view of a semiconductor device according to some embodiments of the present disclosure.

FIG. 27 is a plan view of a semiconductor device according to some embodiments of the present disclosure. A plan view along B-B' in FIG. 27 is substantially the same as that in FIG. 16. For simplicity of description, differences from the semiconductor device described with reference to FIGS. 22, 23A, and 23B will be mainly described.

Referring to FIGS. 27 and 16, according to some embodiments, each stacked structure SS may further include shielding lines 160 disposed between the first conductive lines CL1 and the second conductive lines CL2. The shielding lines 160 may be interposed between the gate electrodes GE, and the shielding lines 160 and the gate electrodes GE may be alternately disposed in the third direction D3. The shielding lines 160 may extend parallel to the gate electrodes GE in the first direction D1. The shielding lines 160 may extend between the selection gate electrodes SGE in the second direction D2. The shielding lines 160 may be interposed between channel patterns CH neighboring in the third direction D3, and may extend in the second direction D2, between selection channel patterns SCH neighboring in the third direction D3.

Each stacked structure SS may further include second insulating patterns 108 interposed between adjacent channel patterns CH in the third direction D3, and between selection channel patterns SCH neighboring in the third direction D3. The second insulating patterns 108 are substantially the same as the second insulating patterns 108 described with reference to FIGS. 13 and 14A. According to some embodiments, each of the shielding lines 160 may extend in the first direction D1 and pass through the first insulating patterns 106 and the second insulating patterns 108. The shielding lines 160 are substantially the same as the shielding lines 160 described with reference to FIGS. 15 and 16.

Figure 28:
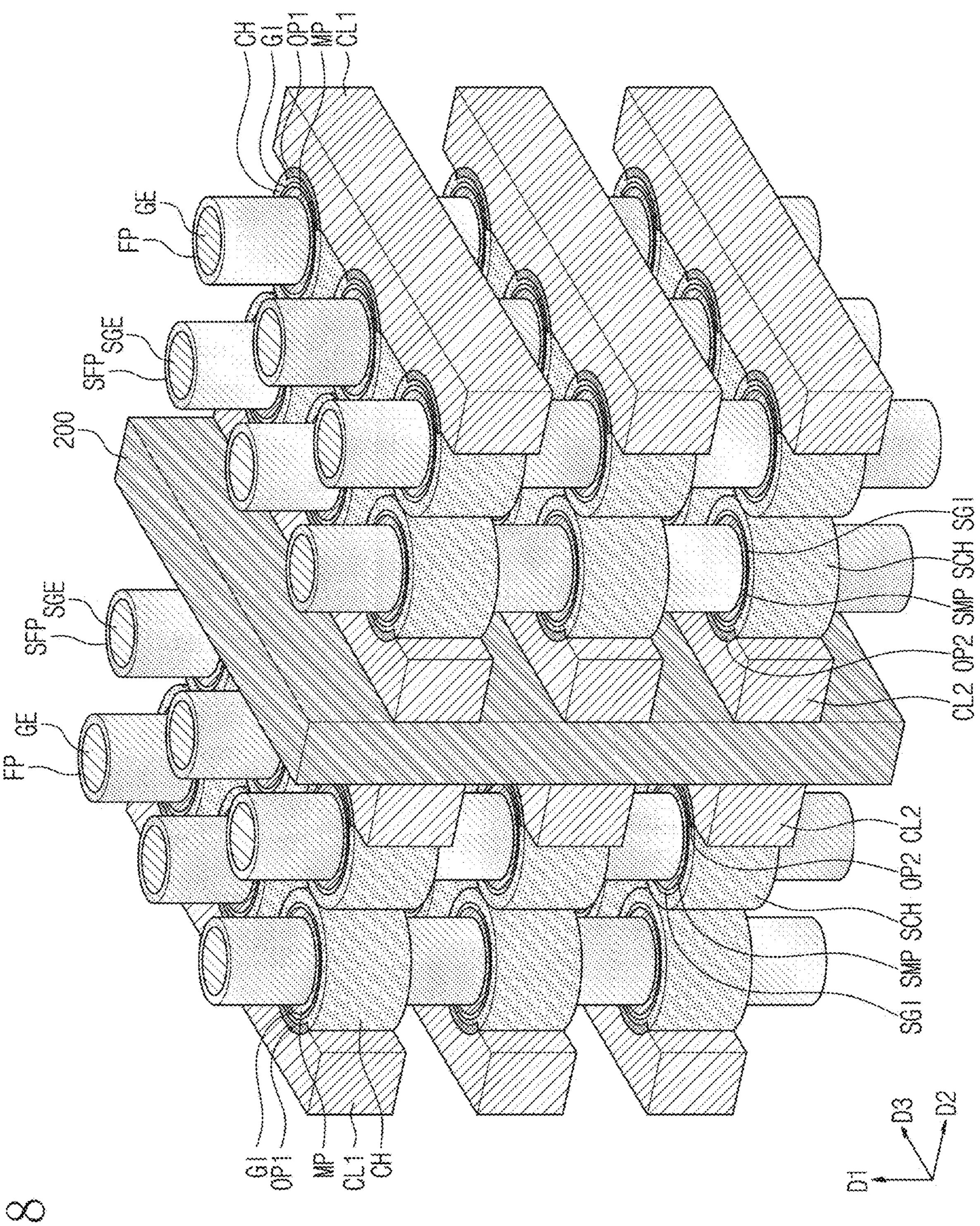
FIG. 28 is a schematic perspective view of a semiconductor device according to some embodiments of the present disclosure.
Figure 29A:
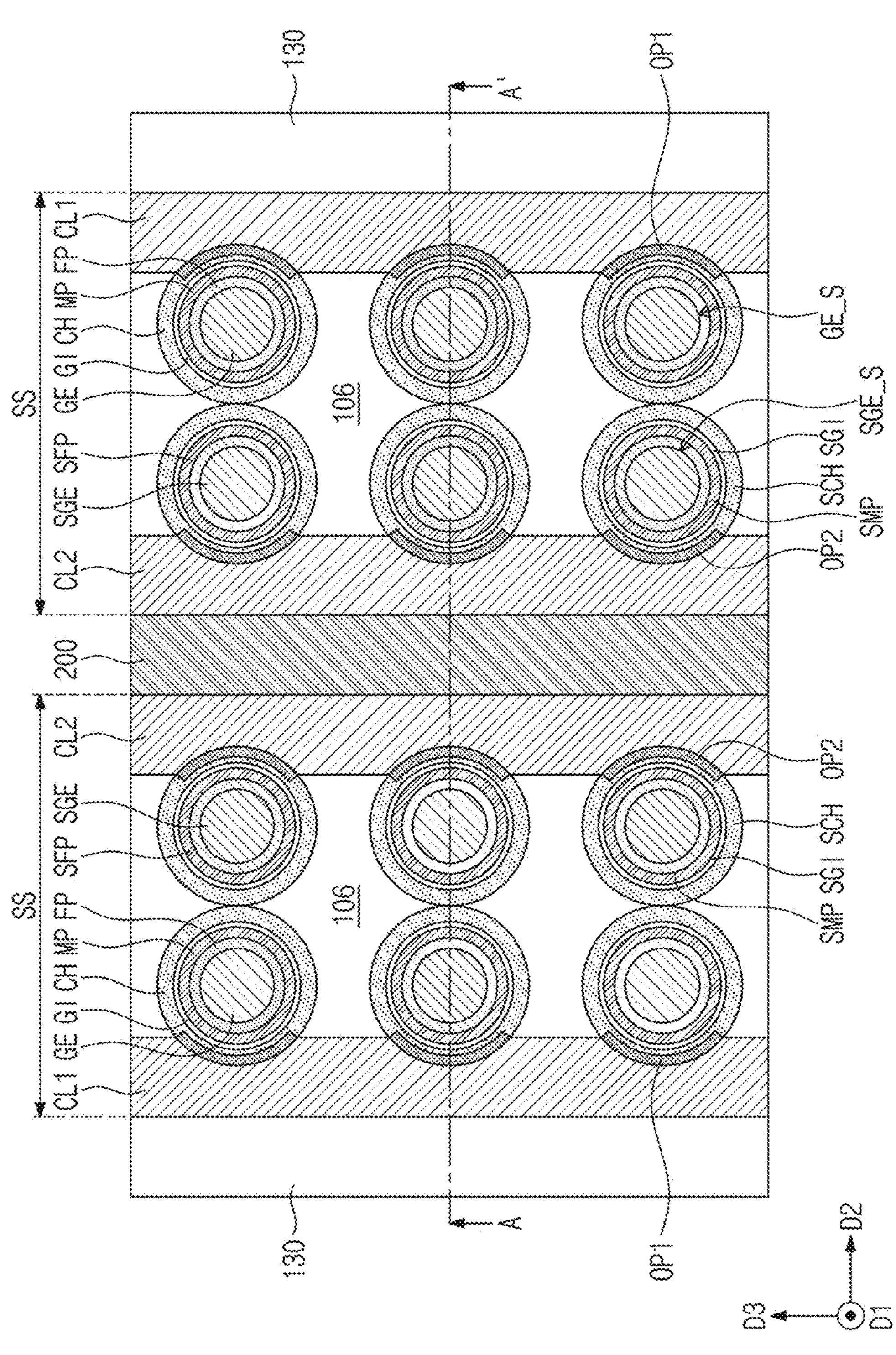
FIG. 29A is a plan view of a semiconductor device according to some embodiments of the present disclosure.
Figure 29B:
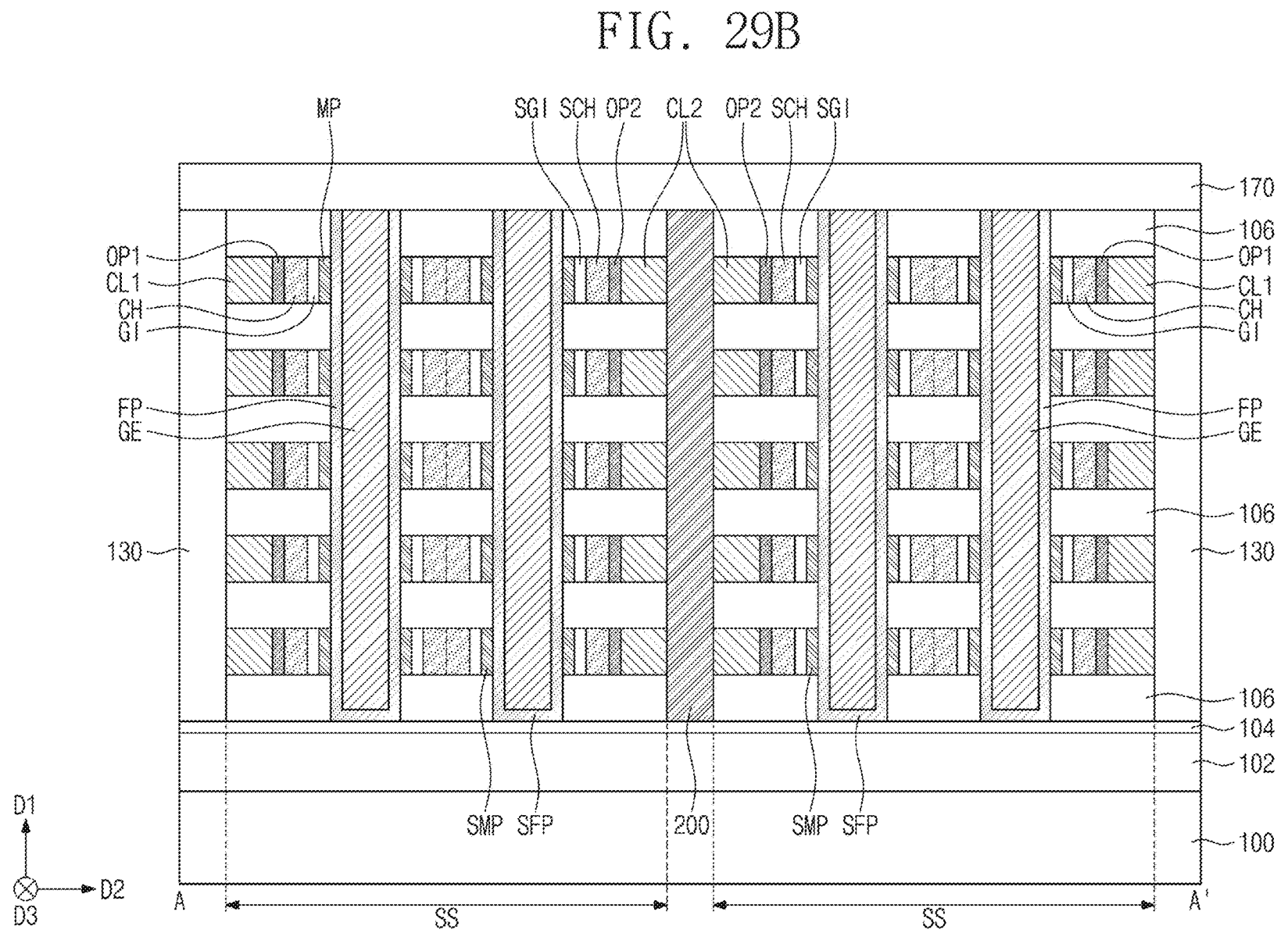

FIG. 28 is a schematic perspective view of a semiconductor device according to some embodiments of the present disclosure. FIG. 29A is a plan view of a semiconductor device according to some embodiments of the present disclosure, and FIG. 29B is a cross-sectional view taken along line A-A' of FIG. 29A. For simplicity of description, differences from the semiconductor device described with reference to FIGS. 22, 23A, and 23B will be mainly described.

Referring to FIGS. 28, 29A, and 29B, each of the pair of stacked structures SS may further include a selection ferroelectric pattern SFP between each of the plurality of selection channel patterns SCH and the corresponding selection gate electrode SGE, and a selection metal pattern SMP between each of the plurality of selection channel patterns SCH and the selection ferroelectric pattern SFP1. The selection gate insulating pattern SGI may be interposed between each of the plurality of selection channel patterns SCH and the selection metal pattern SMP. The selection ferroelectric pattern SFP may surround a side surface SGE_S of the corresponding selection gate electrode SGE, and may extend between each of the first insulating patterns 106 and the corresponding selection gate electrode SGE. The selection metal pattern SMP may be spaced apart from the side surface SGE_S of the corresponding selection gate electrode SGE with the selection ferroelectric pattern SFP interposed therebetween. The selection gate insulating pattern SGI may be spaced apart from the side surface SGE_S of the corresponding selection gate electrode SGE with the selection ferroelectric pattern SFP and the selection metal pattern SMP interposed therebetween.

The selection ferroelectric pattern SFP, the selection metal pattern SMP, and the selection gate insulating pattern SGI are substantially the same as the second selection ferroelectric pattern SFP2, the second selection metal pattern SMP2, and the second selection gate insulating pattern SGI2 described with reference to FIGS. 10, 11A and 11B, respectively.

According to some embodiments, the corresponding selection gate electrode SGE, each of the plurality of selection channel patterns SCH, the selection ferroelectric pattern SFP interposed between each of the plurality of selection channel patterns SCH and the corresponding selection gate electrode SGE, the selection metal pattern SMP, and the selection gate insulating pattern SGI may constitute a selection transistor.

Except for the above-mentioned difference, the semiconductor device according to the present embodiments is substantially the same as the semiconductor device described with reference to FIGS. 22, 23A, and 23B.

Figure 30A:
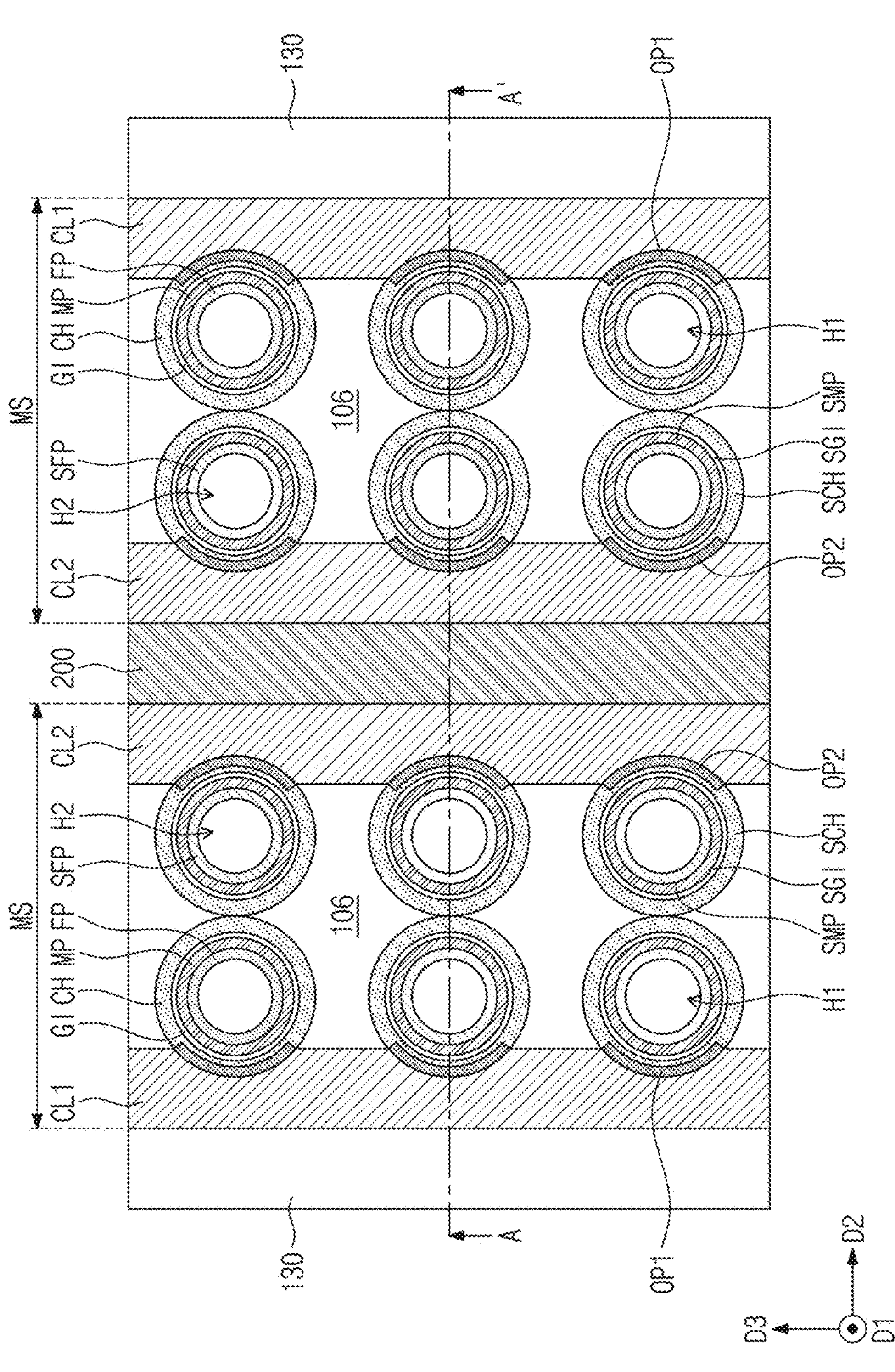
FIG. 30A is a plan view illustrating a method of manufacturing a semiconductor device according to some embodiments of the present disclosure.
Figure 30B:
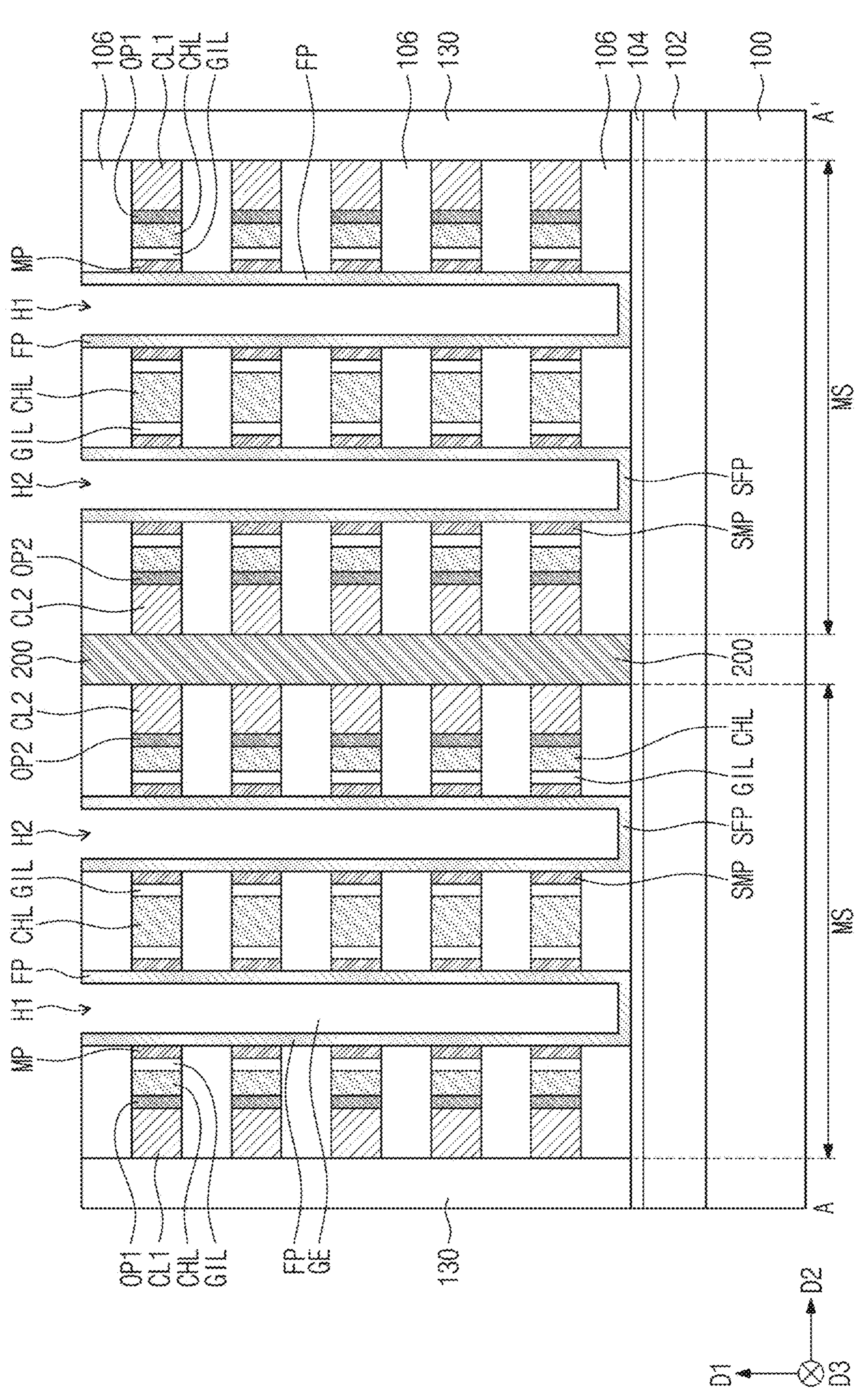
FIG. 30B is a cross-sectional view taken along line A-A' of FIG. 30A.

FIG. 30A is a plan view illustrating a method of manufacturing a semiconductor device according to some embodiments of the present disclosure, and FIG. 30B is a cross-sectional view taken along line A-A' of FIG. 30A. For simplicity of explanation, differences from the manufacturing method of the semiconductor device described with reference to FIGS. 24A to 26A and 24B to 26B will be mainly described.

First, as described with reference to FIGS. 24A, 24B, 25A, and 25B, the first conductive lines CL1, the first impurity patterns OP1, the second conductive lines CL2 and the second impurity patterns OP2 may be formed in the second recess regions R2.

Referring to FIGS. 30A and 30B, A common source pattern 200 may be formed in the first trench T1 between the pair of mold structures MS, and sidewall insulating patterns 130 may be respectively formed in the first trenches T1 spaced apart from each other with the pair of mold structures MS interposed therebetween.

The second sacrificial patterns 120 may be removed from the first and second holes H1 and H2. The first and second holes H1 and H2 may expose side surfaces of the gate insulating layer GIL. The exposed side surfaces of the gate insulating layer GIL may be laterally recessed. Accordingly, a first empty region may be formed in each of the first recess regions R1 surrounding the first holes H1, and a second empty region may be formed in each of the first recess region R1 surrounding the second holes H2. A metal pattern MP and a selection metal pattern SMP may be formed to fill the first empty region and the second empty region, respectively.

A ferroelectric pattern FP may be formed in each of the first holes H1. The ferroelectric pattern FP may partially fill each first hole H1 and conformally cover an inner surface of each first hole H1. The ferroelectric pattern FP may cover side surfaces of the metal pattern MP and side surfaces of the first insulating layers 106, and may cover an upper surface of the etch stop layer 104. A selection ferroelectric pattern SFP may be formed in each of the second holes H2. The selection ferroelectric pattern SFP may partially fill each second hole H2 and conformally cover an inner surface of each second hole H2. The selection ferroelectric pattern SFP may cover side surfaces of the selection metal pattern SMP, side surfaces of the first insulating layers 106, and an upper surface of the etch stop layer 104.

Subsequently, as described with reference to FIGS. 23A and 23B, a gate electrode GE and a selection gate electrode SGE may be formed in the first and second holes H1 and H2, respectively. Except for the above-mentioned difference, the method of manufacturing the semiconductor device according to the present embodiments is substantially the same as the method of manufacturing the semiconductor device described with reference to FIGS. 24A to 26A and 24B to 26B.

Figure 31:
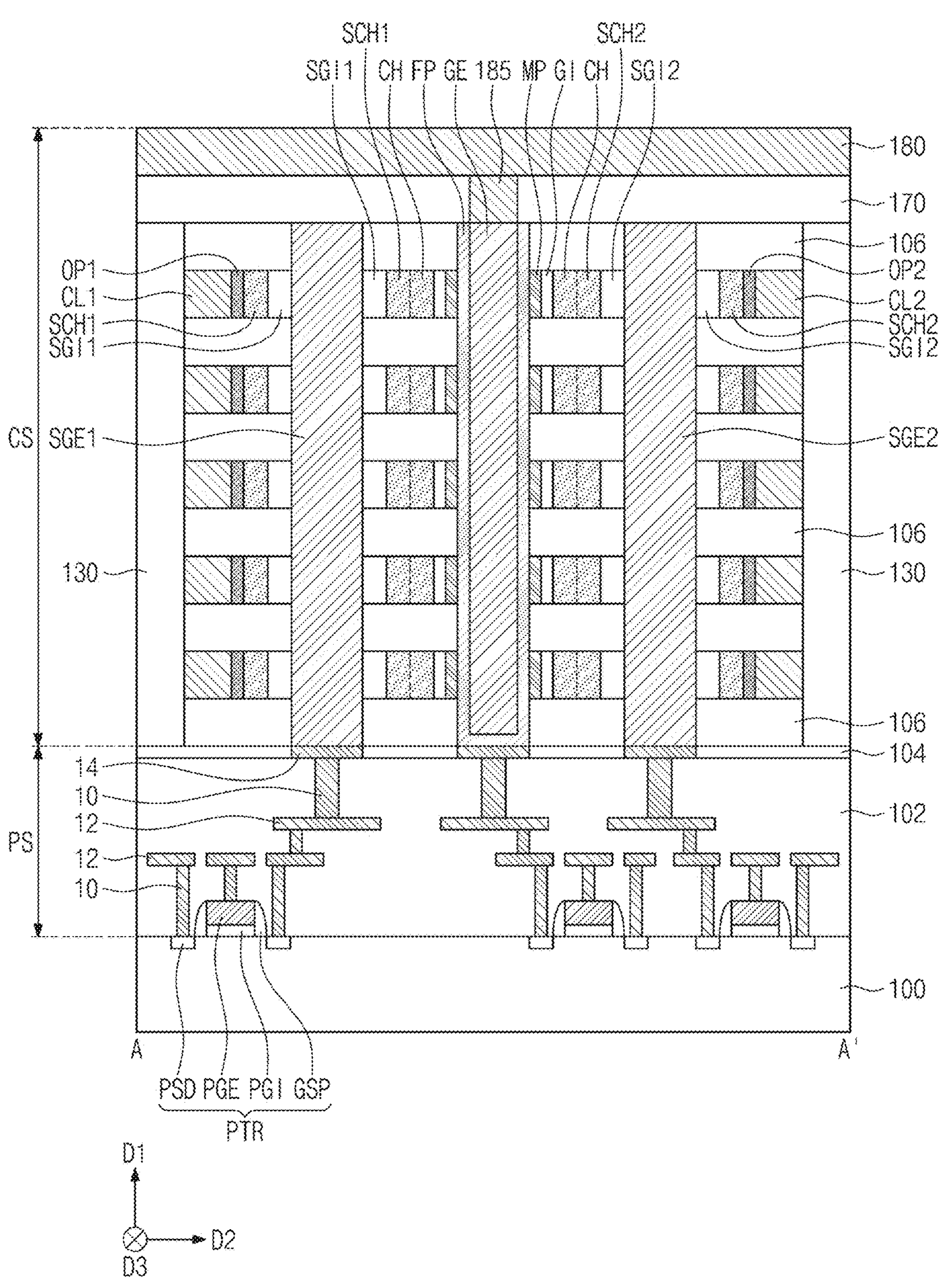
FIGS. 31 and 32 are cross-sectional views of semiconductor devices according to some embodiments of the present disclosure.

FIG. 31 is a cross-sectional view of a semiconductor device according to some embodiments of the present disclosure. For simplicity of description, differences from the semiconductor device described with reference to FIGS. 1, 2A, and 2B will be mainly described.

Referring to FIG. 31, a peripheral circuit structure PS and a cell structure CS may be provided on a substrate 100. The cell structure CS may include the stacked structure SS, the sidewall insulating patterns 130, the upper interlayer insulating layer 170, and the upper conductive lines 180, and the upper conductive contacts 185 described with reference to FIGS. 1, 2A, and 2B.

The peripheral circuit structure PS may include peripheral transistors PTR on the substrate 100, an interlayer insulating layer 102 covering the peripheral transistors PTR, and an etch stop layer 104 on the interlayer insulating layer 102. Each of the peripheral transistors PTR may include a peripheral gate electrode PGE on the substrate 100, a peripheral gate insulating pattern PGI between the substrate 100 and the peripheral gate electrode PGE, gate spacers GSP on both side surfaces of the peripheral gate electrode PGE, and peripheral source/drain regions PSD disposed on both sides of the peripheral gate electrode PGE. The peripheral circuit structure PS may further include peripheral contacts 10 and peripheral wires 12 disposed in the interlayer insulating layer 102 and connected to the peripheral source/drain regions PSD and the peripheral gate electrode PGE.

According to some embodiments, the peripheral circuit structure PS may be disposed between the substrate 100 and the cell structure CS. In this case, the peripheral transistors PTR may be disposed below the stacked structure SS of the cell structure CS and may overlap the stacked structure SS vertically (e.g., in the first direction D1). The peripheral circuit structure PS may further include the gate electrodes GE of the stacked structure SS and peripheral pads 14 respectively connected to the first and second selection gate electrodes SGE1 and SGE2. Each of the peripheral pads 14 may pass through the etch stop layer 104 and be connected to a corresponding one of the gate electrodes GE and the first and second selection gate electrodes SGE1 and SGE2. The peripheral pads 14 may be electrically connected to the peripheral transistors PTR through the peripheral contacts 10 and the peripheral wires 12. The peripheral pads 14 may include a conductive material.

Figure 32:
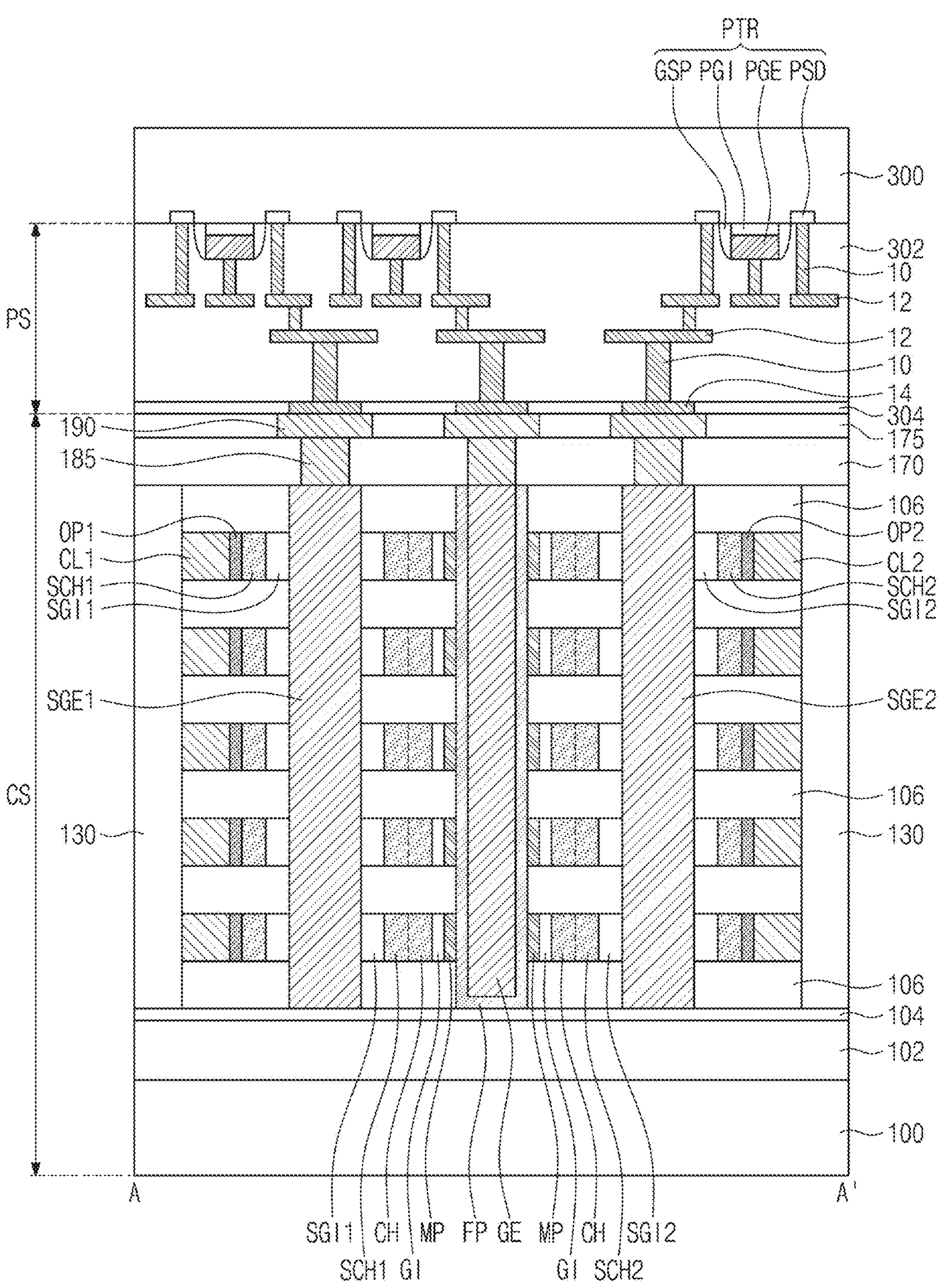

FIG. 32 is a cross-sectional view of a semiconductor device according to some embodiments of the present disclosure. For simplicity of description, differences from the semiconductor device described with reference to FIGS. 1, 2A, and 2B will be mainly described.

Referring to FIG. 32, a peripheral circuit structure PS may be disposed on the cell structure CS. The cell structure CS may include the substrate 100, the interlayer insulating layer 102, the etch stop layer 104, the stacked structure SS, the sidewall insulating patterns 130, the upper interlayer insulating layer 170, and the upper conductive contacts 185 described with reference to FIGS. 1, 2A, and 2B. The substrate 100 of the cell structure CS may be referred to as a first substrate. The cell structure CS may further include a cell junction layer 175 on the upper interlayer insulating layer 170 and cell pads 190 penetrating the cell junction layer 175. The cell junction layer 175 may include an insulating material, and the cell pads 190 may include a conductive material. The cell pads 190 may be electrically connected to the upper conductive contacts 185 through the upper conductive lines 180 described with reference to FIGS. 1, 2A and 2B.

The peripheral circuit structure PS may include a second substrate 300, peripheral transistors PTR on the second substrate 300, a peripheral insulating layer 302 covering the peripheral transistors PTR, and a peripheral bonding layer 304 on the peripheral insulating layer 302. The second substrate 300 may include a semiconductor substrate (e.g., a silicon (Si) substrate, a germanium (Ge) substrate, or a silicon-germanium (Si—Ge) substrate). Each of the peripheral transistors PTR may include a peripheral gate electrode PGE on the second substrate 300, a peripheral gate insulating pattern PGI between the second substrate 300 and the peripheral gate electrode PGE, gate spacers GSP on both sides of the peripheral gate electrode PGE and peripheral source/drain regions PSD disposed on both sides of the peripheral gate electrode PGE. The peripheral circuit structure PS may further include peripheral contacts 10 and peripheral wirings 12 disposed in the peripheral insulating layer 302. The peripheral contacts 10 and the peripheral wires 12 may be connected to the peripheral source/drain regions PSD and the peripheral gate electrode PGE. The peripheral circuit structure PS may further include peripheral pads 14 passing through the peripheral bonding layer 304. The peripheral insulating layer 302 and the peripheral bonding layer 304 may include an insulating material, and the peripheral contacts 10, the peripheral wires 12, and the peripheral pads 14 may include a conductive material. The peripheral pads 14 may be electrically connected to the peripheral transistors PTR through the peripheral contacts 10 and the peripheral wirings 12.

The peripheral pads 14 may be directly bonded to the cell pads 190. For example, the peripheral pads 14 and the cell pads 190 may include copper and may be bonded by a direct bonding manner. The peripheral bonding layer 304 may be directly bonded to the cell bonding layer 175. The gate electrodes GE and the first and second selection gate electrodes SGE1 and SGE2 of the stack structure SS may be electrically connected to the peripheral transistors PTR through the upper conductive contacts 185, the cell pads 190, the peripheral pads 14, the peripheral contacts 10, and the peripheral wires 12.

According to inventive concepts of the present disclosure, the gate electrodes and the plurality of channel patterns may constitute the ferroelectric field effect transistors, and the ferroelectric field effect transistors may function as the memory cells of the semiconductor device, respectively. The ferroelectric field effect transistors may be stacked in the first direction perpendicular to the upper surface of the substrate and in the third direction parallel to the upper surface of the substrate, and thus, the semiconductor device may be easily integrated.

In addition, the selection gate electrodes and the plurality of selection channel patterns may constitute the selection transistors, and may control the flow of current between the conductive lines and the ferroelectric field effect transistors. Accordingly, during the operation of the semiconductor device using the ferroelectric field effect transistors as the memory cells, the interference between neighboring ferroelectric field effect transistors may be reduced. Thus, the operating characteristics and reliability of the semiconductor device may be improved.

While embodiments are described above, a person skilled in the art may understand that many modifications and variations are made without departing from the spirit and scope of the present disclosure defined in the following claims. Accordingly, example embodiments of the present disclosure should be considered in all respects as illustrative and not restrictive, with the spirit and scope of inventive concepts being indicated by the appended claims.

What is claimed is:

1. A semiconductor device comprising:

first conductive lines on a substrate and spaced apart from each other in a first direction, the first direction being perpendicular to an upper surface of the substrate;

second conductive lines spaced apart from the first conductive lines in a second direction, the second direction being parallel to the upper surface of the substrate;

a gate electrode between the first conductive lines and the second conductive lines, the gate electrode extending in the first direction;

a first selection gate electrode between the first conductive lines and the gate electrode, the first selection gate electrode extending in the first direction;

a plurality of channel patterns surrounding a side surface of the gate electrode, the plurality of channel patterns being spaced apart from each other in the first direction;

a plurality of first selection channel patterns surrounding a side surface of the first selection gate electrode, and spaced apart from each other in the first direction, the plurality of first selection channel patterns connected to the plurality of channel patterns, respectively; and a ferroelectric pattern between the gate electrode and each of the plurality of channel patterns, wherein the first conductive lines are electrically connected to the plurality of first selection channel patterns, respectively, and each of the plurality of channel patterns is electrically connected to a corresponding second conductive line among the second conductive lines.

2. The semiconductor device of claim 1, wherein the second conductive lines are spaced apart from each other in the first direction, and the plurality of channel patterns are electrically connected to the second conductive lines, respectively.

3. The semiconductor device of claim 1, further comprising:

a gate insulating pattern between each of the plurality of channel patterns and the ferroelectric pattern; and a first selection gate insulating pattern between each of the plurality of first selection channel patterns and the first selection gate electrode.

4. The semiconductor device of claim 3, further comprising:

first impurity patterns between the first conductive lines and the plurality of first selection channel patterns, respectively, wherein the first conductive lines are electrically connected to the plurality of first selection channel patterns through the first impurity patterns, respectively.

5. The semiconductor device of claim 4, further comprising:

second impurity patterns between the plurality of channel patterns and the second conductive lines, respectively, each of the plurality of channel patterns is electrically connected to the corresponding second conductive line through a corresponding one of the second impurity patterns, and wherein the first impurity patterns and the second impurity patterns have a same conductivity type as each other.

6. The semiconductor device of claim 3, further comprising:

a metal pattern between the gate insulating pattern and the ferroelectric pattern.

7. The semiconductor device of claim 3, further comprising:

a first selection ferroelectric pattern between each of the plurality of first selection channel patterns and the first selection gate electrode, wherein the first selection gate insulating pattern is between each of the plurality of first selection channel patterns and the first selection ferroelectric pattern.

8. The semiconductor device of claim 1, further comprising:

first insulating patterns between the first conductive lines, wherein the first insulating patterns are spaced apart from each other in the first direction, the first insulating patterns extend in the second direction between the plurality of first selection channel patterns, and the first insulating patterns extend in the second direction between the plurality of channel patterns.

9. The semiconductor device of claim 8, wherein the ferroelectric pattern extends between the gate electrode and each of the first insulating patterns.

10. The semiconductor device of claim 1, further comprising:

a second selection gate electrode between gate electrode and the second conductive lines, the second selection gate electrode extending in the first direction; and a plurality of second selection channel patterns surrounding a side surface of the second selection gate electrode, wherein the plurality of second selection channel patterns are spaced apart from each other in the first direction, and the plurality of second selection channel patterns are respectively connected to the plurality of channel patterns.

11. The semiconductor device of claim 10, wherein the second conductive lines are spaced apart from each other in the first direction, and the second conductive lines are electrically connected to the plurality of second selection channel patterns, respectively.

12. The semiconductor device of claim 11, further comprising:

a gate insulating pattern between each of the plurality of channel patterns and the ferroelectric pattern;

a first selection gate insulating pattern between the first selection gate electrode and each of the plurality of first selection channel patterns; and a second selection gate insulating pattern between the second selection gate electrode and each of the plurality of second selection channel patterns.

13. The semiconductor device of claim 12, further comprising:

a first selection ferroelectric pattern between the first selection gate insulating pattern and the first selection gate electrode; and a second selection ferroelectric pattern between the second selection gate insulating pattern and the second selection gate electrode.

14. The semiconductor device of claim 11, further comprising:

first insulating patterns between the first conductive lines, wherein the first insulating patterns are spaced apart from each other in the first direction, the first insulating patterns extend in the second direction between the plurality of first selection channel patterns, the first insulating patterns extend in the second direction between the plurality of channel patterns, the first insulating patterns extend in the second direction between the plurality of second selection channel patterns, and the first insulating patterns extend in the second direction between the second conductive lines.

15. The semiconductor device of claim 14, wherein the ferroelectric pattern extends between the gate electrode and each of the first insulating patterns.

16. A semiconductor device comprising:

first conductive lines on a substrate and spaced apart from each other in a first direction, the first direction being perpendicular to an upper surface of the substrate;

a gate electrode spaced apart from the first conductive lines in a second direction, the second direction being parallel to the upper surface of the substrate, and the gate electrode extending in the first direction;

a first selection gate electrode between the first conductive lines and the gate electrode, the first selection gate electrode extending in the first direction;

a plurality of channel patterns surrounding a side surface of the gate electrode, the plurality of channel patterns being spaced apart from each other in the first direction;

a plurality of first selection channel patterns surrounding a side surface of the first selection gate electrode, the plurality of first selection channel patterns being spaced apart from each other in the first direction, and the plurality of first selection channel patterns respectively connected to the plurality of channel patterns; and a ferroelectric pattern between the gate electrode and each of the plurality of channel patterns, wherein the first conductive lines are electrically connected to the plurality of first selection channel patterns, respectively.

17. The semiconductor device of claim 16, further comprising:

a gate insulating pattern between the ferroelectric pattern and each of the plurality of channel patterns; and a first selection gate insulating pattern between the first selection gate electrode and each of the plurality of first selection channel patterns.

18. The semiconductor device of claim 17, further comprising:

a first selection ferroelectric pattern between the first selection gate electrode and each of the plurality of first selection channel patterns, wherein the first selection gate insulating pattern is between the first selection ferroelectric pattern and each of the plurality of first selection channel patterns.

19. The semiconductor device of claim 16, further comprising:

a second selection gate electrode extending in the first direction on the substrate; and a plurality of second selection channel patterns surrounding a side surface of the second selection gate electrode, the plurality of second selection channel patterns being spaced apart from each other in the first direction, wherein the gate electrode is between the first selection gate electrode and the second selection gate electrode, and the plurality of second selection channel patterns are respectively connected to the plurality of channel patterns.

20. The semiconductor device of claim 19, further comprising:

second conductive lines spaced apart from the first conductive lines in the second direction with the first selection gate electrode, the gate electrode, and the second selection gate electrode therebetween, wherein the second conductive lines are spaced apart from each other in the first direction and electrically connected to the plurality of second selection channel patterns, respectively.

* * * * *